(12) United States Patent
Yamada et al.

(10) Patent No.: US 7,309,244 B2
(45) Date of Patent: Dec. 18, 2007

(54) ANISOTROPIC CONDUCTIVE CONNECTOR DEVICE AND PRODUCTION METHOD THEREFOR AND CIRCUIT DEVICE INSPECTION DEVICE

(75) Inventors: Daisuke Yamada, Hidaka (JP); Kiyoshi Kimura, Hidaka (JP); Naoki Arasaki, Hidaka (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/560,347

(22) PCT Filed: Jun. 1, 2004

(86) PCT No.: PCT/JP2004/007523

§ 371 (c)(1),
(2), (4) Date: Dec. 12, 2005

(87) PCT Pub. No.: WO2004/112195

PCT Pub. Date: Dec. 23, 2004

(65) Prior Publication Data

US 2006/0160383 A1 Jul. 20, 2006

(30) Foreign Application Priority Data

Jun. 12, 2003 (JP) ............................. 2003-167818
Jul. 16, 2003 (JP) ............................. 2003-275407

(51) Int. Cl.
*H01R 4/58* (2006.01)
(52) U.S. Cl. ........................................ 439/91; 439/591
(58) Field of Classification Search ................ 439/91, 439/591
See application file for complete search history.

(56) References Cited

U.S. PATENT DOCUMENTS

| | | | |
|---|---|---|---|
| 6,168,442 B1 * | 1/2001 | Naoi | 439/91 |
| 6,663,799 B2 | 12/2003 | Kokubo et al. | |
| 6,690,564 B1 | 2/2004 | Haruta et al. | |
| 6,870,385 B2 | 3/2005 | Inoue et al. | |
| 6,969,622 B1 | 11/2005 | Kokubo et al. | |
| 7,059,874 B2 * | 6/2006 | Weiss | 439/91 |
| 2005/0009386 A1 * | 1/2005 | Weiss et al. | 439/91 |

(Continued)

FOREIGN PATENT DOCUMENTS

JP  2001-050983  2/2001

(Continued)

OTHER PUBLICATIONS

U.S. Appl. No. 10/523,195, filed Jan. 27, 2005, Setaka.

(Continued)

*Primary Examiner*—Hae Moon Hyeon
(74) *Attorney, Agent, or Firm*—Oblon, Spivak, McClelland, Maier & Neustadt, P.C.

(57) ABSTRACT

An anisotropic conductive connector device including an anisotropic conductive film provided with a plurality of conducting path forming portions extended in a direction of a thickness in a state in which they are insulated from each other through an insulating portion, and a sheet-like connector in which an insulating sheet is provided with a plurality of electrode structures extended in a direction of a thickness thereof. The sheet-like connector is provided integrally on or is integrated with the anisotropic conductive film in a state in which each of the electrode structures is positioned on each of the conducting path forming portions of the anisotropic conductive film.

9 Claims, 47 Drawing Sheets

U.S. PATENT DOCUMENTS

| | | |
|---|---|---|
| 2005/0106907 A1 | 5/2005 | Yamada et al. |
| 2005/0258850 A1 | 11/2005 | Yamada et al. |
| 2005/0272282 A1 | 12/2005 | Setaka et al. |

FOREIGN PATENT DOCUMENTS

| | | |
|---|---|---|
| JP | 2001-093945 | 4/2001 |
| JP | 2001-351702 | 12/2001 |
| JP | 2003-077559 | 3/2003 |
| JP | 2003-092317 | 3/2003 |
| JP | 2003-124272 | 4/2003 |

OTHER PUBLICATIONS

U.S. Appl. No. 10/522,537, filed Jan. 27, 2005, Setaka et al.
U.S. Appl. No. 10/525,089, filed Feb. 23, 2005, Inoue et al.
U.S. Appl. No. 10/548,832, filed Sep. 13, 2005, Igarashi et al.
U.S. Appl. No. 10/552,995, filed Oct. 13, 2005, Sato et al.
U.S. Appl. No. 10/560,347, filed Dec. 12, 2005, Yamada et al.
U.S. Appl. No. 10/559,846, filed Dec. 7, 2005, Igarashi et al.

* cited by examiner

ANISOTROPIC CONDUCTIVE CONNECTOR DEVICE AND PRODUCTION METHOD THEREFOR AND CIRCUIT DEVICE INSPECTION DEVICE

CROSS REFERENCE

This application is a national stage of PCT/JP04/17534, filed on Jun. 1, 2004, and claims benefit under 35 U.S.C. § 119 from Japanese Patent Application No. 2003-167818, filed on Jun. 12, 2003, and Japanese Patent Application No. 2003-275407, filed on Jul. 16, 2003.

1. Technical Field

The present invention relates to an anisotropic conductive connector device which can be suitably used for inspecting a circuit device such as a semiconductor integrated circuit and a method of manufacturing the same, and an apparatus for inspecting a circuit device comprising the anisotropic conductive connector device.

2. Background Art

An anisotropic conductive sheet exhibit the conductivity in only the direction of the thickness or has a pressurizing conducting portion exhibiting a conductivity in only a direction of a thickness when it is pressed in the direction of the thickness, and has a feature that a compact electrical connection can be achieved without using means such as soldering or mechanical fitting and a mechanical shock or strain can be absorbed to carry out a soft connection.

Therefore, by utilizing such a feature, for example, in the field of an electronic computer, an electronic digital clock, an electronic camera, a computer keyboard or the like, the anisotropic conductive sheet has been used widely as an anisotropic conductive connector for achieving an electrical connection between circuit devices, for example, an electrical connection of a printed circuit board to a leadless chip carrier, a liquid crystal panel or the like.

Moreover, in an electrical inspection for a circuit device such as a printed circuit board or a semiconductor integrated circuit, for example, in order to achieve an electrical connection between an electrode to be inspected, which is formed over one surface of the circuit device, and an electrode for an inspection which is formed on the surface of the circuit board for an inspection, the anisotropic conductive sheet is provided as a connector between an electrode region of the circuit device to be an inspecting object and an electrode region for an inspection of a circuit board for an inspection.

Conventionally, there have been known anisotropic conductive sheets having various structures in which:

a metallic particle is dispersed uniformly in an elastomer (for example, Patent Document 1 (see Japanese Laid-Open Patent Publication No.1976-93393)), a conductive magnetic metal is dispersed nonuniformly in the elastomer so that a large number of conducting path forming portions extended in a direction of a thickness and an insulating portion for mutually insulating them are formed (for example, Patent Document 2 (see Japanese Laid-Open Patent Publication No.1978-147772)), and a step is formed between the surface of the conducting path forming portion and the insulating portion (for example, Patent Document 3 (see Japanese Laid-Open Patent Publication No.1986-250906)).

In these anisotropic conductive sheets, conductive particles are contained in an insulating elastically polymeric substance in an arranging and orienting state in a direction of a thickness, and a conducting path is formed by a chain of a large number of conductive particles.

Such an anisotropic conductive sheet can be manufactured by injecting, into a molding space of a metal mold, a molding material obtained by containing a conductive particle having a magnetism in a polymeric substance forming material to be an elastically polymeric substance by curing, thereby forming a molding material layer and applying a magnetic field thereto to carry out a curing treatment, for example.

However, for example, in an electrical inspection for a circuit device having a protruded electrode formed of a soldering alloy, in the case in which an anisotropic conductive sheet according to the conventional art is to be used as a connector, there is the following problem.

More specifically, by the repetition of an operation for causing the protruded electrode which is an electrode to be inspected in a circuit device to be an inspecting object to come in pressure contact with the surface of the anisotropic conductive sheet, a permanent deformation is caused by the pressure contact of the protruded electrode or a deformation is caused by an abrasion over the surface of the anisotropic conductive sheet. Therefore, the electric resistance value of the conducting path forming portion in the anisotropic conductive sheet is increased and the electric resistance value of each conducting path forming portion is varied. For this reason, there is a problem in that it is hard to inspect succeeding circuit devices.

Moreover, as for a conductive particle for constituting the conducting path forming portion, in order to obtain a high conductivity, the a conductive particle which is formed by a coating layer made of gold is usually used. By continuously carrying out the electrical inspection of a large number of circuit devices, however, an electrode substance (a soldering alloy) constituting the electrode to be inspected in the circuit device is moved to the coating layer of the conductive particle in the anisotropic conductive sheet. For this reason, the coating layer is altered. As a result, there is a problem in that the conductivity of the conducting path forming portion is reduced.

Moreover, for example, in the electrical inspection for a circuit device having a pad electrode formed of aluminum, in the case in which the anisotropic conductive sheet according to the conventional art is used as a connector, there is the following problem.

More specifically, in the circuit device having the pad electrode, a resist film having a greater thickness than that of the pad electrode is usually formed on the surface of the circuit device. In order to reliably carry out an electrical connection to the pad electrode of the circuit device having the resist film formed thereon, there is used an anisotropic conductive sheet in which a conducting path forming portion protruded from the surface of an insulating portion is provided.

By repetitively using such an anisotropic conductive sheet, however, a permanent compressive deformation is generated over the conducting path forming portion. Therefore, the electric resistance value of the conducting path forming portion in the anisotropic conductive sheet is increased or the stable electrical connection of the conducting path forming portion for the pad electrode is not achieved. As a result, the electric resistance value between the pad electrode which is the electrode to be inspected and the electrode for an inspection in the circuit board for an inspection is varied. Consequently, there is a problem in that it is hard to inspect succeeding circuit devices.

In order to solve these problems, in the inspection of the circuit device, the connector device is constituted by the anisotropic conductive sheet and a sheet-like connector in which a plurality of electrode structures penetrating and extended in a direction of a thickness is arranged in a soft insulating sheet formed of a resin material. In addition, the electrode to be inspected is pressed in contact with the electrode structure of the sheet-like connector in the connector device, so that an electrical connection with the circuit device to be the inspecting object can be achieved (for example, see Patent Document 4 (Japanese Laid-Open Patent Publication No. 1995-231019), Patent Document 5 (Japanese Laid-Open Patent Publication No. 2000-324601), Patent Document 6 (Korean Laid-Open Patent Publication No. 2002-24419), and Patent Document 7 (Korean Registered Utility Model Publication No. 20-278989)).

However, in the connector devices described in the Patent Document 4 (Japanese Laid-Open Patent Publication No. 1995-231019), the Patent Document 5 (Japanese Laid-Open Patent Publication No. 2000-324601), the Patent Document 6 (Korean Laid-Open Patent Publication No. 2002-24419), and the Patent Document 7 (Korean Registered Utility Model Publication No. 20-278989), in the case in which the pitch of the electrode to be inspected in the circuit device to be the inspecting object is small, that is, the pitches of the electrode structure of the sheet-like connector and the conducting path forming portion of the anisotropic conductive sheet are small, there is the following problem.

More specifically, the alignment of the anisotropic conductive sheet with the sheet-like connector is carried out by forming a positioning hole in respective peripheral edge portions or fixing the respective peripheral edge portions to frame-shaped supporting bodies having the positioning holes and inserting a common guide pin through the respective positioning holes.

However, in such means, when the pitches of the electrode structure of the sheet-like connector and the conducting path forming portion of the anisotropic conductive sheet are reduced, it is harder to reliably align both of them.

Moreover, also in the case in which a desirable alignment is once implemented, the positional shift of the conducting path forming portion and the electrode structure is generated when the connector device is used. In the case in which the connector device is used in a test in a high temperature environment, for example, a burn-in test, the positional shift is generated between the electrode structure of the sheet-like connector and the conducting path forming portion of the anisotropic conductive sheet due to a difference in a thermal expansion between a material for forming the anisotropic conductive sheet and a material for forming an insulating sheet of the sheet-like connector. As a result, there is a problem in that an excellent electrical connection state cannot be maintained stably.

For this reason, there has been proposed a connector device in which a sheet-like connector is provided integrally on an anisotropic conductive sheet (see Patent Document 8 (Japanese Laid-Open Patent Publication No. 1999-258268) and Patent Document 9 (Korean Patent Publication No. 2002-79350(International Laid-Open Patent Publication WO02/084730))).

However, in the connector device described in the Patent Document 8 (Japanese Laid-Open Patent Publication No. 1999-258268), the Patent Document 9 (Korean Laid-Open Patent Publication No. 2002-79350) (International Laid-Open Patent Publication WO02/084730)), the sheet-like connector and the anisotropic conductive sheet are simply provided integrally. Therefore, a bonding power between the sheet-like connector and the anisotropic conductive sheet is comparatively small. For this reason, in the case in which the inspection is carried out repetitively, peeling is easily caused on an interface between the sheet-like connector and the anisotropic conductive sheet and there is caused a conducting failure between the electrode structure of the sheet-like connector and the conducting path forming portion of the anisotropic conductive sheet, and use cannot be carried out and there is a problem in respect of a durability.

Patent Document 1: Japanese Laid-Open Patent Publication No. 1976-93393

Patent Document 2: Japanese Laid-Open Patent Publication No. 1978-147772

Patent Document 3: Japanese Laid-Open Patent Publication No. 1986-250906

Patent Document 4: Japanese Laid-Open Patent Publication No. 1995-231019

Patent Document 5: Japanese Laid-Open Patent Publication No. 2000-324601

Patent Document 6: Korean Laid-Open Patent Publication No. 2002-24419

Patent Document 7: Korean Registered Utility Model Publication No. 20-278989

Patent Document 8: Japanese Laid -Open Patent Publication No. 1999-258268

Patent Document 9: Korean Laid-Open Patent Publication No. 2002-79350

DISCLOSURE OF THE INVENTION

Problems to be Solved

The present invention has been made based on the above actual circumstances and has an object to provide an anisotropic conductive connector device in which a work for aligning a sheet-like connector is not required and an excellent electrical connection state can be obtained even if the pitch of an electrode to be a connecting object is small, and furthermore, the excellent electrical connection state can be maintained stably also in the case of repetitive use for a long period of time or the case of use in a high temperature environment.

Moreover, it is an object of the present invention to provide a method capable of advantageously manufacturing the anisotropic conductive connector device.

Furthermore, it is an object of the present invention to provide an apparatus for inspecting a circuit device in which an excellent electrical connection state can be obtained even if the pitch of an electrode to be inspected in a circuit device to be an inspecting object is small, and furthermore, the excellent electrical connection state can be maintained stably also in the case of repetitive use for a long period of time or the case of use in a high temperature environment.

In addition, it is an object of the present invention to provide a method of producing an anisotropic conductive connector having these features efficiently and inexpensively.

Means for Solving the Problems

The present invention has been made in order to achieve the problems and objects in the prior art described above and provides an anisotropic conductive connector device comprising:

an anisotropic conductive film provided with a plurality of conducting path forming portions extended in a direction of a thickness in a state in which they are insulated from each other through an insulating portion; and a sheet-like connector in which an insulating sheet is provided with a plurality of electrode structures extended in a direction of a thickness thereof, wherein the sheet-like connector is provided integrally on the anisotropic conductive film in a state in which each of the electrode structures is positioned on each of the conducting path forming portions of the anisotropic conductive film.

In this case, in this specification, "provided integrally" implies that the sheet-like connector is provided on the anisotropic conductive film so as not to be mutually movable to positions in an integral bonding state.

Thus, the sheet-like connector is provided integrally on the anisotropic conductive film in a state in which each of the electrode structures is positioned on each of the conducting path forming portions of the anisotropic conductive film. Therefore, a work for aligning the sheet-like connector is not required, and an excellent electrical connection state can be obtained even if the pitch of the electrode to be a connecting object is small.

In addition, the sheet-like connector is provided integrally on the anisotropic conductive film. Also in the case of repetitive use for a long period of time or the case of use in a high temperature environment, therefore, it is possible to stably maintain an excellent electrical connection state without generating a positional shift between the conducting path forming portion of the anisotropic conductive film and the electrode structure of the sheet-like connector.

Moreover, the anisotropic conductive connector device according to the present invention is characterized in that the sheet-like connector is provided with a through hole penetrating through both sides of the insulating sheet and the electrode structure is provided in the through hole.

Thus, the electrode structure is provided in the through hole penetrating through both sides of the insulating sheet. Therefore, it is possible to stably maintain an excellent electrical connection state without shifting the position of the electrode structure of the sheet-like connector.

Furthermore, the anisotropic conductive connector device according to the present invention is characterized in that the electrode structure of the sheet-like connector includes:

a surface electrode portion exposed from a surface of the insulating sheet;

a back electrode portion exposed from a back face of the insulating sheet; and a short circuit portion extended in a direction of a thickness of the insulating sheet, wherein the surface electrode portion and the back electrode portion are coupled integrally through the coupling portion.

By such a structure, it is possible to reliably form a conducting path from the surface electrode portion exposed from the surface of the insulating sheet to the back electrode portion exposed from the back face of the insulating sheet through the short circuit portion. Consequently, it is possible to stably maintain an excellent electrical connection state.

Moreover, the anisotropic conductive connector device according to the present invention is characterized in that a through hole for coupling is formed on the insulating sheet of the sheet-like connector, the insulating portion of the anisotropic conductive film is provided with a protruded portion for coupling which is protruded from a surface thereof, and the protruded portion for coupling in the anisotropic conductive film is inserted in the through hole for coupling in the sheet-like connector.

By such a structure, the protruded portion for coupling which is formed on the anisotropic conductive film is inserted in the through hole for coupling which is formed on the insulating sheet of the sheet-like connector. Consequently, the sheet-like connector is brought into a state in which it cannot be mutually moved to positions over the anisotropic conductive film.

As a result, the generation of the positional shift between the conducting path forming portion of the anisotropic conductive film and the electrode structure of the sheet-like connector can be prevented more reliably.

Furthermore, the present invention provides an anisotropic conductive connector device comprising:

an anisotropic conductive film provided with a plurality of conducting path forming portions extended in a direction of a thickness in a state in which they are insulated from each other through an insulating portion; and a sheet-like connector in which an insulating sheet is provided with a plurality of electrode structures extended in a direction of a thickness thereof, wherein the sheet-like connector is integrated on the anisotropic conductive film in a state in which each of the electrode structures is positioned on each of the conducting path forming portions of the anisotropic conductive film.

In this case, in this specification, "integrated" implies that the sheet-like connector is integrated with the anisotropic conductive film over the anisotropic conductive film so as not to be mutually movable to positions.

Thus, the sheet-like connector is integrated with the anisotropic conductive film over the anisotropic conductive sheet in a state in which each of the electrode structures is positioned on each of the conducting path forming portions of the anisotropic conductive film. Therefore, a work for aligning the sheet-like connector is not required and an excellent electrical connection state can be obtained even if the pitch of the electrode to be the connecting object is small.

In addition, the sheet-like connector is integrated with the anisotropic conductive film over the anisotropic conductive film. Also in the case of repetitive use for a long period of time or the case of use in a high temperature environment, therefore, it is possible to stably maintain an excellent electrical connection state without generating a positional shift between the conducting path forming portion of the anisotropic conductive film and the electrode structure of the sheet-like connector.

Moreover, the anisotropic conductive connector device according to the present invention is characterized in that the sheet-like connector is provided with a void communicating with both sides of the insulating sheet and the electrode structure is provided in the void.

Thus, the electrode structure is provided in the void communicating with both sides of the insulating sheet. Therefore, it is possible to stably maintain an excellent electrical connection state without shifting the position of the electrode structure of the sheet-like connector.

Moreover, the anisotropic conductive connector device according to the present invention is characterized in that the insulating sheet of the sheet-like connector is formed by a mesh, a nonwoven fabric or a porous sheet.

If the insulating sheet of the sheet-like connector is formed by the mesh, the nonwoven fabric or the porous sheet, thus, the electrode structure can be provided in the void communicating with both sides. Furthermore, the material constituting the anisotropic conductive film or an adhesive for causing the anisotropic conductive film and the sheet-like connector to adhere to each other is cured in the other voids in a permeation state between the voids. Consequently, the sheet-like connector can be integrated with the anisotropic conductive connector reliably and firmly.

Accordingly, it is possible to stably maintain a more excellent electrical connection state without shifting the position of the electrode structure of the sheet-like connector.

In addition, according to the anisotropic conductive connector device, the insulating sheet of the sheet-like connector is formed by the mesh, the non-woven fabric or the porous sheet. Therefore, a work for forming a through hole is not required in the manufacture of the sheet-like connector, and the sheet-like connector can be manufactured efficiently and inexpensively and the anisotropic conductive connector device can also be manufactured efficiently and inexpensively.

Furthermore, according to the anisotropic conductive connector device, the insulating sheet of the sheet-like connector is formed by the mesh, the nonwoven fabric or the porous sheet. Therefore, when the sheet-like connector is to be integrated with the anisotropic conductive film of the anisotropic conductive connector, the sheet-like connector is provided on a molding material layer in a metal mold and the molding material layer is subjected to a curing treatment. Consequently, the elastically polymeric substance constituting the molding material layer is cured in a permeation state into the mesh, the nonwoven fabric or the porous sheet. Therefore, it is possible to integrate the sheet-like connector with the anisotropic conductive film reliably and firmly.

Moreover, the anisotropic conductive connector device according to the present invention is characterized in that the anisotropic conductive film is formed by an insulating elastically polymeric substance, and the conducting path forming portion contains a conductive particle exhibiting a magnetism.

By such a structure, a pressurization and a deformation can easily be carried out. In addition, in the conducting path forming portion, the conductive particle exhibiting the magnetism is easily brought into an orientation state by the application of a magnetic field. As a result, a sufficient electrical contact can be obtained between the conductive particles in the conducting path forming portion.

Moreover, the anisotropic conductive connector device according to the present invention is characterized in that a supporting body for supporting a peripheral edge portion of the anisotropic conductive film is provided.

By such a structure, the anisotropic conductive connector device can accurately be fixed onto the surface of the circuit board for an inspection in a state in which a guide pin is inserted in a positioning hole formed on the supporting body and the conducting path forming portion of the anisotropic conductive film is thus positioned to be placed on the electrode for an inspection in the circuit board for an inspection.

Furthermore, the anisotropic conductive connector device according to the present invention is characterized in that the anisotropic conductive connector device is provided between a circuit device to be an inspecting object and a circuit board for an inspection and serves to carry out an electrical connection of an electrode to be inspected in the circuit device and an inspecting electrode of the circuit board, and the sheet-like connector is disposed on one surface side placed in contact with the circuit device to be the inspecting object.

By such a structure, the anisotropic conductive connector device is fixed onto the surface of the circuit board for an inspection in a state in which the conducting path forming portion of the anisotropic conductive film is positioned to be placed on the electrode for an inspection in the circuit board for an inspection. The electrode to be inspected in the circuit board to be the inspecting object can be thus pressed in abutment on the electrode structure of the sheet-like connector.

Consequently, each of the effective conducting path forming portions of the anisotropic conductive connector device is brought into a pressure interposing state by the electrode structure of the sheet-like connector and the electrode for an inspection in the circuit board for an inspection.

As a result, an electrical connection can be achieved between each electrode to be inspected in the circuit device to be the inspecting object and each electrode for an inspection in the circuit board for an inspection. Consequently, the inspection for the circuit device can be executed rapidly and accurately.

In addition, the anisotropic conductive connector device according to the present invention is characterized in that, the anisotropic conductive film is provided with the conducting path forming portions which are not electrically connected to the electrode to be inspected, in addition to the conducting path forming portions which is electrically connected to the electrode to be inspected in the circuit device to be the inspecting object.

By such a structure, it is possible to dispose the conducting path forming portion in accordance with a pattern corresponding to the pattern of the electrode to be the connecting object, for example, the electrode to be inspected in the circuit device to be the inspecting object, thereby maintaining an electrical connection reliably.

Moreover, the anisotropic conductive connector device according to the present invention is characterized in that the conducting path forming portions are disposed at a constant pitch.

By such a structure, even if the pitch of the electrode to be the connecting object, for example, the electrode to be inspected in the circuit device to be the inspecting object is small, it is possible to obtain an excellent electrical connection state.

Furthermore, the present invention provides a method of manufacturing the anisotropic conductive connector device described above, comprising the steps of:

preparing a metal mold for molding an anisotropic conductive film in which a molding space is formed by a pair of molds;

forming a molding material layer constituted by a molding material for an anisotropic conductive film, in which a conductive particle exhibiting a magnetism is contained in a liquid polymeric substance forming material to be an elastically polymeric substance by curing, in the metal mold, and disposing the sheet-like connector on the molding material layer; and then applying a magnetic field having an intensity distribution in a direction of a thickness of the molding material layer and carrying out a curing treatment over the molding material layer, the anisotropic conductive connector device having the sheet-like connector provided integrally on the anisotropic conductive film being thus obtained.

By such a structure, the anisotropic conductive connector device having the sheet-like connector provided integrally on the anisotropic conductive film can be manufactured advantageously and reliably.

In addition, the method of manufacturing an anisotropic conductive connector device according to the present invention is characterized by use, as the insulating sheet, of a sheet-like connector provided with a through hole penetrating through both sides of the insulating sheet, a molding material layer is formed in order to fill the through hole of the insulating sheet with a molding material for an anisotropic conductive film.

By such a structure, the molding material for the anisotropic conductive film is filled in the through hole of the insulating sheet and is thus cured. Consequently, the sheet-like connector is provided on the anisotropic conductive film so as not to be mutually movable to positions and the anisotropic conductive connector device provided integrally on the anisotropic conductive film can be obtained easily, readily and reliably.

Accordingly, in the anisotropic conductive connector device thus obtained, the sheet-like connector is provided integrally on the anisotropic conductive film in a state in which each of the electrode structures is positioned on each of the conducting path forming portions of the anisotropic conductive film. Therefore, a work for aligning the sheet-like connector is not required, and an excellent electrical connection state can be obtained even if the pitch of the electrode to be the connecting object is small.

In addition, the sheet-like connector is provided integrally on the anisotropic conductive film. Therefore, also in the case of repetitive use for a long period of time or the case of use in a high temperature environment, a positional shift is not generated between the conducting path forming portion of the anisotropic conductive film and the electrode structure of the sheet-like connector. Thus, it is possible to stably maintain an excellent electrical connection state.

Moreover, the method of manufacturing an anisotropic conductive connector device according to the present invention is characterized by use, as the insulating sheet, of the sheet-like connector having a through hole for coupling formed on the insulating sheet, a molding material layer is formed in order to fill the through hole for coupling in the sheet-like connector with a molding material for an anisotropic conductive film.

By such a structure, the molding material for an anisotropic conductive film which is filled in the through hole for coupling is cured and becomes a protruded portion for coupling which is formed on the anisotropic conductive film to bring an insertion state in the through hole for coupling which is formed on the insulating sheet of the sheet-like connector. Consequently, the sheet-like connector is set to be mutually non-movable to positions over the anisotropic conductive film.

Consequently, the generation of the positional shift between the conducting path forming portion of the anisotropic conductive film and the electrode structure of the sheet-like connector can be prevented still more reliably.

Furthermore, the method of manufacturing an anisotropic conductive connector device according to the present invention is characterized by the sheet-like connector forming steps of:

forming a through hole penetrating through both sides of the insulating sheet on the insulating sheet in accordance with a pattern corresponding to a pattern of an electrode structure to be formed by a laser processing method or a dry etching method, and filling the pattern hole with an electrode structure material by a plating method, thereby forming the sheet-like connector in which the insulating sheet is provided with a plurality of electrode structures extended in a direction of a thickness thereof.

By such a structure, the through hole penetrating through both sides of the insulating sheet can be formed easily and accurately in accordance with the pattern corresponding to the pattern of the electrode structure to be formed by the laser processing method or the dry etching method.

In addition, the through hole is filled with the electrode structure material by a plating method. Consequently, it is possible to easily and accurately form, on the insulating sheet, the sheet-like connector provided with a plurality of electrode structures extended in a direction of a thickness thereof.

Consequently, the anisotropic conductive connector device having the sheet-like connector provided integrally on the anisotropic conductive film can be manufactured advantageously and reliably.

Moreover, the present invention provides a method of manufacturing the anisotropic conductive connector device described above, comprising the steps of:

preparing a metal mold for molding an anisotropic conductive film in which a molding space is formed by a pair of molds;

forming a molding material layer constituted by a molding material for an anisotropic conductive film, in which a conductive particle exhibiting a magnetism in a liquid polymeric substance forming material to be an elastically polymeric substance by curing, in the metal mold, and disposing the sheet-like connector on the molding material layer; and then applying a magnetic field having an intensity distribution in a direction of a thickness of the molding material layer and carrying out a curing treatment over the molding material layer, the anisotropic conductive connector device having the sheet-like connector integrated on the anisotropic conductive film being thus obtained.

By such a structure, the anisotropic conductive connector device having the sheet-like connector provided integrally on the anisotropic conductive film can be manufactured advantageously and reliably.

Furthermore, the method of manufacturing an anisotropic conductive connector device according to the present invention is characterized by use, as the insulating sheet, of a sheet provided with a void communicating with both sides of the insulating sheet, a molding material layer is formed in order to fill the void of the insulating sheet with a molding material for an anisotropic conductive film.

By such a structure, the molding material for an anisotropic conductive film is filled in the void communicating with both sides of the insulating sheet and is thus cured. Consequently, it is possible to easily and reliably obtain the anisotropic conductive connector device in which the sheet-like connector is integrated with the anisotropic conductive film over the anisotropic conductive film so as not to be mutually movable to positions.

Accordingly, in the anisotropic conductive connector device thus obtained, the sheet-like connector is integrated with the anisotropic conductive film over the anisotropic conductive film in a state in which each of the electrode structures is positioned on each of the conducting path forming portions of the anisotropic conductive film. Therefore, a work for aligning the sheet-like connector is not required, and an excellent electrical connection state can be obtained even if the pitch of the electrode to be the connecting object is small.

In addition, the sheet-like connector is integrated with the anisotropic conductive film over the anisotropic conductive film. Therefore, also in the case of repetitive use for a long period of time or the case of use in a high temperature environment, a positional shift is not generated between the conducting path forming portion of the anisotropic conductive film and the electrode structure of the sheet-like connector. Thus, it is possible to stably maintain an excellent electrical connection state.

In addition, the method of manufacturing an anisotropic conductive connector device according to the present invention is characterized in that the insulating sheet of the sheet-like connector is formed by a mesh, a nonwoven fabric or a porous sheet.

If the insulating sheet of the sheet-like connector is formed by the mesh, the nonwoven fabric or the porous sheet, thus, the electrode structure can be provided in the void communicating with both sides. Furthermore, the material constituting the anisotropic conductive film or an adhesive for causing the anisotropic conductive film and the sheet-like connector to adhere to each other is cured in the other voids in a permeation state between the voids. As a result, the sheet-like connector can be integrated with the anisotropic conductive connector reliably and firmly.

Accordingly, it is possible to stably maintain a more excellent electrical connection state without shifting the position of the electrode structure of the sheet-like connector.

Moreover, according to the anisotropic conductive connector device, the insulating sheet of the sheet-like connector is formed by the mesh, the non-woven fabric or the porous sheet. Therefore, a work for forming a through hole is not required in the manufacture of the sheet-like connector, and the sheet-like connector can be manufactured efficiently and inexpensively and the anisotropic conductive connector device can also be manufactured efficiently and inexpensively.

Furthermore, according to the anisotropic conductive connector device, the insulating sheet of the sheet-like connector is formed by the mesh, the nonwoven fabric or the porous sheet. Therefore, when the sheet-like connector is to be integrated with the anisotropic conductive film of the anisotropic conductive connector, the sheet-like connector is provided on the molding material layer in the metal mold and the molding material layer is subjected to a curing treatment. Consequently, the elastically polymeric substance constituting the molding material layer is cured in a permeation state into the mesh, the nonwoven fabric or the porous sheet. Therefore, it is possible to integrate the sheet-like connector with the anisotropic conductive film reliably and firmly.

Moreover, the method of manufacturing an anisotropic conductive connector device according to the present invention is characterized by the sheet-like connector forming steps of:

applying a resist to both sides of the insulating sheet to form a resist layer;

peeling the resist layer in accordance with a pattern corresponding to a pattern of an electrode structure to be formed, thereby forming a plurality of pattern holes on the resist layer; and filling the pattern hole with an electrode structure material and then peeling the resist layer, thereby forming the sheet-like connector in which the insulating sheet is provided with a plurality of electrode structures extended in a direction of a thickness thereof.

By such a structure, it is possible to easily and reliably manufacture a sheet-like connector in which the insulating sheet is provided with a plurality of electrode structures extended in a direction of a thickness thereof in accordance with the pattern corresponding to the pattern of the electrode structure to be formed. As a result, it is possible to advantageously and reliably obtain the anisotropic conductive connector device in which the sheet-like connector is integrated on the anisotropic conductive film.

Furthermore, the method of manufacturing an anisotropic conductive connector device according to the present invention is characterized in that a protective film is disposed between a molding surface of one of molds in the metal mold and the sheet-like connector.

The protective film is disposed between the molding surface of one of the molds in the metal mold and the sheet-like connector. Consequently, it is possible to prevent the molding surface of the metal mold and the electrode structure of the sheet-like connector from being damaged and to hinder the molding material from entering the surface of the sheet-like connector, that is, the surface on the metal mold side.

Consequently, the molding material to be the insulating substance can not be stuck to the surface of the electrode structure of the sheet-like connector, thereby preventing an electrical connecting failure and an electrical connection can be maintained reliably. Thus, it is possible to provide an anisotropic conductive connector device capable of executing an accurate inspection.

In addition, the method of manufacturing an anisotropic conductive connector device according to the present invention is characterized in that a supporting body protruded from a molding space is disposed between the pair of metal molds and the molding material layer is subjected to a curing treatment so that an anisotropic conductive connector device provided with a supporting body for supporting a peripheral edge portion of the anisotropic conductive film is obtained.

Thus, the supporting body protruded from the molding space is disposed between the metal molds to carry out a curing treatment over the molding material layer. Consequently, it is possible to obtain the anisotropic conductive connector device in which the supporting body for supporting the peripheral edge portion of the anisotropic conductive film is fixed by the molding material layer.

According to the anisotropic conductive connector device thus manufactured, a guide pin is inserted in a positioning hole formed on the supporting body. Consequently, it is possible to accurately fix the anisotropic conductive connector device onto the surface of the circuit board for an inspection in a state in which the conducting path forming portion of the anisotropic conductive film is positioned to be placed on the electrode for an inspection in the circuit board for an inspection.

Moreover, the method of manufacturing an anisotropic conductive connector device according to the present invention is characterized in that;

a spacer is provided between the pair of metal molds and the supporting body to form the molding space and the molding material layer is subjected to curing treatment so that an anisotropic conductive connector device, which is provided with the supporting body for supporting a peripheral edge portion of the anisotropic conductive film, is obtained.

Thus, the spacer is provided between the pair of metal molds and the supporting body to form the molding space, and the molding material layer is subjected to the curing treatment. Consequently, it is possible to obtain an anisotropic conductive connector device in which the supporting body for supporting the peripheral edge portion of the anisotropic conductive film is fixed by the molding material layer more firmly.

Furthermore, the present invention provides an apparatus for inspecting a circuit device comprising:

a circuit board for an inspection which has an electrode for an inspection disposed corresponding to an electrode to be inspected in a circuit device to be an inspecting object; and the anisotropic conductive connector device described above which is disposed on the circuit board for an inspection.

Consequently, even if the electrode to be inspected in the circuit device to be the inspecting object has a small pitch, it is possible to provide the apparatus for inspecting a circuit device in which an excellent electrical connection state can be obtained. Furthermore, also in the case of repetitive use for a long period of time or the case of use in a high temperature environment, the excellent electrical connection state can be maintained stably.

Effect of the Invention

According to the anisotropic conductive connector device in accordance with the present invention, the sheet-like connector is provided integrally on the anisotropic conductive film or is integrated therewith. Therefore, a work for aligning the sheet-like connector is not required, and even if the pitch of the electrodes to be the connecting object is small, an excellent electrical connection state can be obtained.

In addition, also in the case of repetitive use for a long period of time or the case of use in a high temperature environment, a positional shift between the conducting path forming portion and the electrode structure is not generated. Accordingly, it is possible to stably maintain the excellent electrical connection state.

Moreover, according to the anisotropic conductive connector device in accordance with the present invention, the sheet-like connector is obtained by an insulating sheet formed by the mesh, the nonwoven fabric or the porous sheet on which a void communicating with both sides of the insulating sheet is provided. Therefore, a work for forming a through hole is not required in the manufacture of the sheet-like connector. Consequently, the sheet-like connector can be manufactured efficiently and inexpensively. Thus, the anisotropic conductive connector device can also be manufactured efficiently and inexpensively.

Furthermore, according to the anisotropic conductive connector device in accordance with the present invention, the sheet-like connector is obtained by the insulating sheet formed by the mesh, the nonwoven fabric or the porous sheet. Therefore, When the sheet-like connector is to be integrated with the anisotropic conductive film of the anisotropic conductive connector, the sheet-like connector is disposed on the molding material layer in the metal mold to carry out the curing treatment over the molding material layer. Consequently, an elastically polymeric substance constituting the molding material layer is cured in a permeation state into the mesh or the nonwoven fabric. Thus, it is possible to integrate the sheet-like connector with the anisotropic conductive connector reliably and firmly.

In the anisotropic conductive connector device in which the sheet-like connector is integrated, thus, also in the case of repetitive use for a long period of time or the case of use in a high temperature environment, a positional shift between the conducting path forming portion and the electrode structure is not generated. Accordingly, it is possible to stably maintain an excellent electrical connection state.

Furthermore, according to the method of manufacturing an anisotropic conductive connector device in accordance with the present invention, the sheet-like connector is disposed on the molding material layer for obtaining the anisotropic conductive film and the molding material layer is subjected to a curing treatment in this state. Therefore, it is possible to advantageously and reliably manufacture the anisotropic conductive connector device in which the sheet-like connector is provided integrally on the anisotropic conductive film.

Moreover, according to the apparatus for inspecting the circuit device in accordance with the present invention, the anisotropic conductive connector is provided. Therefore, also in the case of repetitive use for a long period of time or the case of use in a high temperature environment, the positional shift between the conducting path forming portion and the electrode structure is not generated. Accordingly, it is possible to stably maintain an excellent electrical connection state.

Furthermore, according to the apparatus for inspecting the circuit device in accordance with the present invention, the sheet-like connector formed by the insulating sheet constituted by the mesh, the nonwoven fabric or the porous sheet is present between the anisotropic conductive film of the anisotropic conductive connector and the electrode to be inspected in the substance to be inspected. Therefore, it is possible to reliably suppress a damage in the inspection for the substance to be inspected due to the removal of a conductive particle from the anisotropic conductive film.

In addition, the sheet-like connector is manufactured by using the insulating sheet formed by the mesh, the nonwoven fabric or the porous sheet. Therefore, the through hole of the insulating sheet is not utilized. Consequently, it is possible to easily obtain the electrode structure of the sheet-like connector thus obtained in which the surface of an electrode is flat and the through hole is not present.

Therefore, according to the apparatus for inspecting a circuit device having the structure described above which comprises the sheet-like connector having the electrode structure in which the surface of the electrode is flat and the through hole is not present, also in the case in which the electrode to be inspected in the substance to be inspected is a soldering protruded electrode having a small hardness, the soldering protruded electrode of the substance to be inspected can be prevented from being damaged due to the pressure contact of the electrode structure of the sheet-like connector with the through hole portion in the inspection.

BEST MODE FOR CARRYING OUT THE INVENTION

Embodiments (examples) according to the present invention will be described below in more detail based on the drawings.

Figure 1:
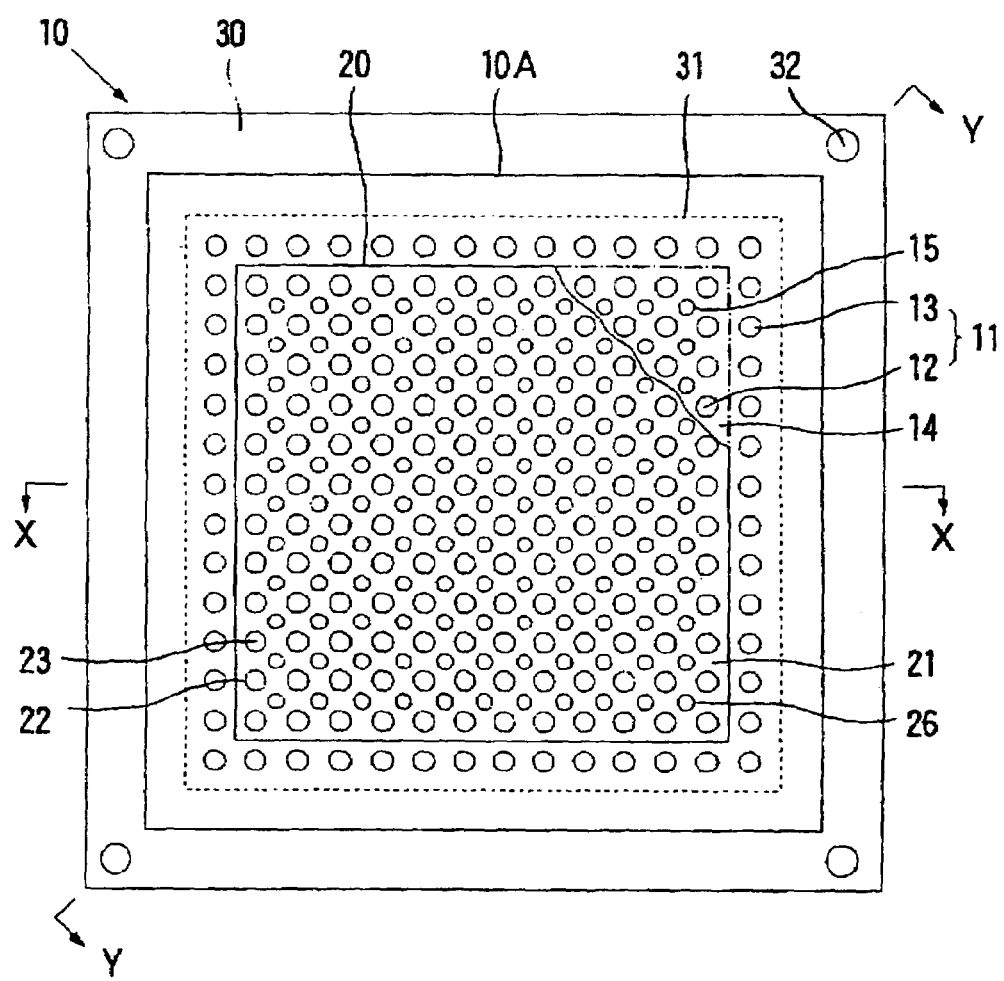
FIG. 1 is a plan view showing an anisotropic conductive connector device.
Figure 2:
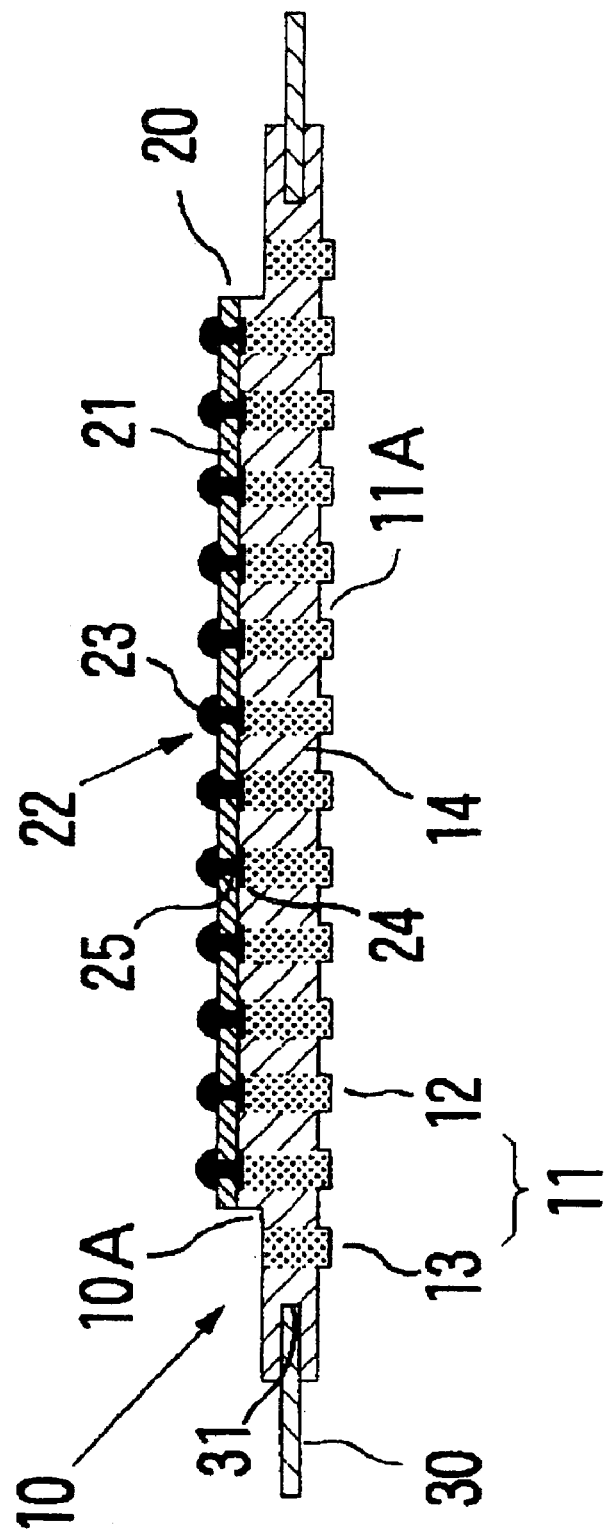
FIG. 2 is an explanatory view showing an X-X section in the anisotropic conductive connector device illustrated in FIG. 1.
Figure 3:
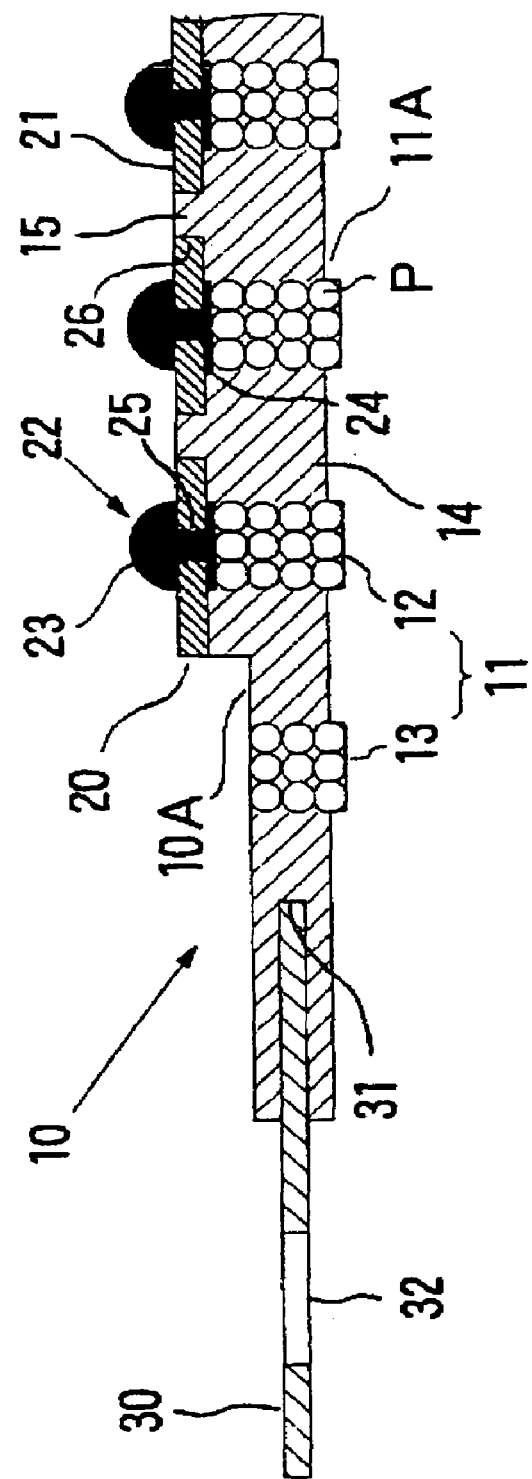
FIG. 3 is an enlarged explanatory view showing a part of a Y-Y section in the anisotropic conductive connector device illustrated in FIG. 1.

FIGS. 1 to 3 are explanatory views showing an anisotropically conducive connector device according to a first example of the present invention, and FIG. 1 is a plan view showing the anisotropically conducive connector device, FIG. 2 is an explanatory view showing an X-X section of the anisotropically conducive connector device illustrated in FIG. 1, and FIG. 3 is an explanatory view partially showing an enlarged Y-Y section of the anisotropically conducive connector device illustrated in FIG. 1.

An anisotropic conductive connector device 10 is constituted by a rectangular anisotropic conductive film 10A, a sheet-like connector 20 provided integrally on one surface of the anisotropic conductive film 10A and a rectangular plate-shaped supporting body 30 which supports the anisotropic conductive film 10A.

The anisotropic conductive film 10A in the anisotropic conductive connector device 10 is constituted by a plurality of cylindrical conducting path forming portions 11 extended in a direction of a thickness respectively, and an insulating portion 14 for mutually insulating these conducting path forming portions 11. In this example, the conducting path forming portions 11 are disposed at a constant pitch in accordance with the position of a grid point.

Moreover, the anisotropic conductive film 10A is wholly formed by an insulating elastically polymeric substance and a conductive particle P exhibiting a magnetism is contained in the conducting path forming portion 11 in an arranging and orienting state in a direction of a thickness. On the other hand, the insulating portion 14 does not contain or rarely contains the conductive particle.

In the example shown in the drawing, a whole surface in the central part of the anisotropic conductive film 10A is formed in a protruding state from a peripheral edge portion. Any of the conducting path forming portions 11, which is formed in the central part of the anisotropic conductive film 10A, is set to be an effective conducting path forming portion 12 which is electrically connected to an electrode to be a connecting object, for example, an electrode to be inspected in a circuit device to be an inspecting object.

Moreover, any of the conducting path forming portions 11, which is formed on a peripheral edge portion in the anisotropic conductive film 10A, is set to be an ineffective conducting path forming portion 13 which is not electrically connected to the electrode to be the connecting object. The effective conducting path forming portion 12 is disposed in accordance with a pattern corresponding to the pattern of the electrode to be the connecting object.

On the other hand, the insulating portion 14 is formed integrally to surround the individual conducting path forming portions 11. Consequently, all of the conducting path forming portions 11 are insulated mutually by the insulating portion 14.

Moreover, in the anisotropic conductive connector device 10 according to this example, a protruded portion 15 for coupling which is protruded from one surface is formed on the insulating portion 14 in the central part of the anisotropic conductive film 10A. On the other hand, the other surface of the anisotropic conductive film 10A is provided with a protruded portion 11A, which is obtained by protruding the surface of the conducting path forming portion 11 from the surface of the insulating portion 14.

A thickness of the effective conducting path forming portion 12 is 0.1 to 2 mm, for example, and is preferably 0.2 to 1 mm.

Moreover, a diameter of the effective conducting path forming portion 12 is properly set corresponding to the pitch of the electrode to be the connecting object, and is 50 to 1000 µm, for example, and is preferably 200 to 800 µm.

A protrusion height of the protruded portion 11A is 10 to 100 µm, for example, and is preferably 20 to 60 µm.

The sheet-like connector 20 has a soft insulating sheet 21. In the insulating sheet 21, a plurality of electrode structures 22 formed of a metal which is extended in the direction of the thickness of the insulating sheet 21 is disposed apart from each other in the planar direction of the insulating sheet 21 in accordance with a pattern corresponding to the pattern of the electrode to be the connecting object. Moreover, the insulating sheet 21 is provided with a plurality of through holes 26 for coupling corresponding to the protruded portion 15 for coupling in the anisotropic conductive film 10A.

Each of the electrode structures 22 is constituted by integrally coupling a protruded surface electrode portion 23 exposed from a surface (an upper surface in the drawing) of the insulating sheet 21 and a disc-shaped back electrode portion 24 exposed from a back face of the insulating sheet 21 to each other through a short circuit portion 25 penetrating and extended in the direction of the thickness of the insulating sheet 21.

The sheet-like connector 20 is provided integrally on the anisotropic conductive film 10A in such a manner that each of the electrode structures 22 is positioned on the effective conducting path forming portion 12 of the anisotropic conductive film 10A and the protruded portion 15 for coupling in the anisotropic conductive film 10A is inserted in the through hole 26 for coupling in the insulating sheet 21.

A thickness of the insulating sheet 21 is 0.005 to 1 mm, for example, and is preferably 0.01 to 0.5 mm and is further preferably 0.015 to 0.3 mm.

Moreover, a diameter of the surface electrode portion 23 in the electrode structure 22 is properly set corresponding to the pitch of the electrode to be the connecting object, and is 50 to 100 µm, for example, and is preferably 200 to 800 µm.

Furthermore, a protrusion height of the surface electrode portion 23 is 10 to 300 µm, for example, and is preferably 50 to 200 µm.

Figure 4:
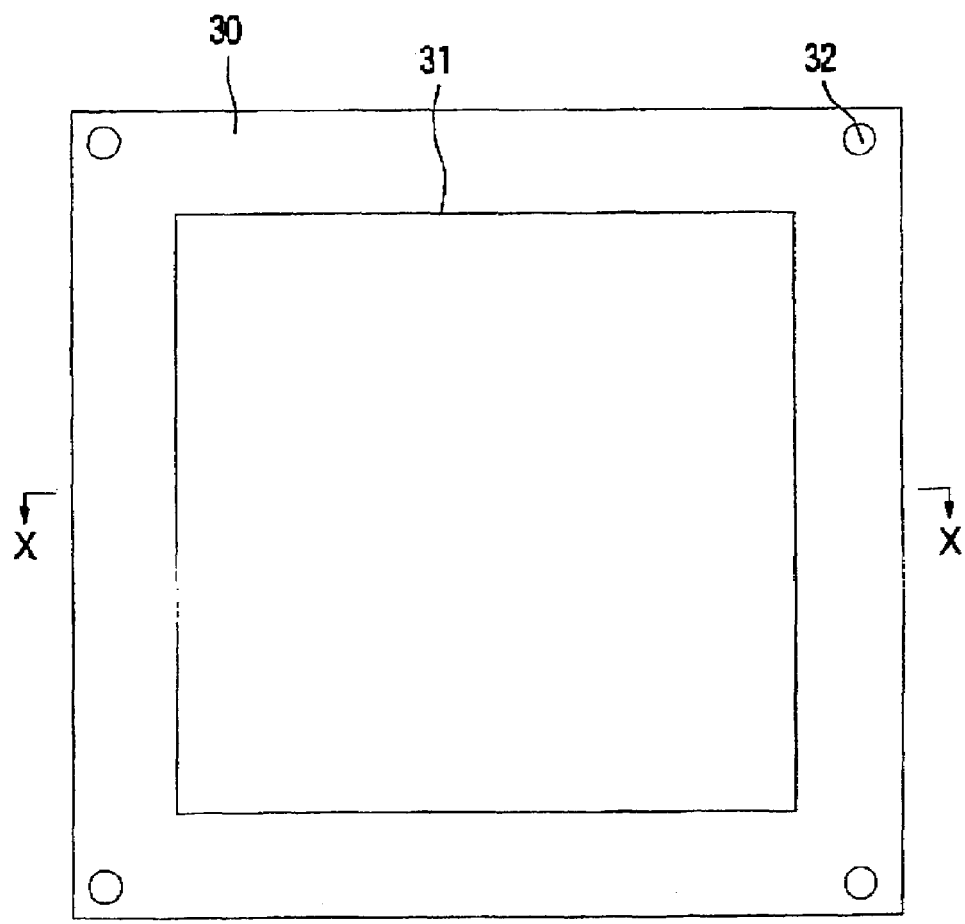
FIG. 4 is a plan view showing a supporting body in the anisotropic conductive connector device illustrated in FIG. 1.
Figure 5:
FIG. 5 is an X-X sectional view showing the supporting body illustrated in FIG. 4.

As shown in FIGS. 4 and 5, the supporting body 30 is provided with a rectangular opening portion 31 having a smaller dimension than the dimension of the anisotropic conductive film 10A in a central position thereof and a positioning hole 32 in the positions of four corners of the supporting body 30.

The anisotropic conductive film 10A is disposed on the opening portion 31 of the supporting body 30 and is supported on the supporting body 30 by fixing the peripheral edge portion of the anisotropic conductive film 10A to the supporting body 30.

A thickness of the supporting body 30 is 0.01 to 1 mm, for example, and is preferably 0.05 to 0.8 mm.

An elastically polymeric substance forming the anisotropic conductive film 10A preferably has a durometer hardness of 15 to 70 and more preferably 25 to 65. In some cases in which the durometer hardness is excessively small, a high repetitive durability cannot be obtained.

On the other hand, in some cases in which the durometer hardness is excessively great, the conducting path forming portion having a high conductivity cannot be obtained.

It is preferable that a polymeric substance having a crosslinking structure should be used for an elastically polymeric substance forming the anisotropic conductive film 10A. Various materials can be used for a curing polymeric substance forming material which can be used for obtaining such an elastically polymeric substance, and specific examples thereof include:

conjugated diene rubber such as polybutadiene rubber, natural rubber, polyisoprene rubber, styrene-butadiene copolymer rubber or acrylonitrile-butadiene copolymer rubber, and hydrogenated products thereof;

block copolymer rubber such as styrene-butadiene-diene block terpolymer rubber or styrene-isoprene block copolymer, and hydrogenated products thereof; and chloroprene rubber, urethane rubber, polyester rubber, epichlorohydrin rubber, silicone rubber, ethylene-propylene copolymer rubber and ethylene-propylene-diene terpolymer rubber, and the like.

As described above, in the case in which a weather resistance is required for the anisotropic conductive connector 10 which is obtained, it is preferable to use a material other than the conjugated diene rubber and it is particularly preferable to use the silicone rubber in respect of molding and processing properties and electrical characteristics.

For the silicone rubber, liquid silicone rubber is preferably crosslinked or condensed. The liquid silicone rubber having a viscosity of $10^5$ poises or less at a shear proportion of $10^{-1}$ sec is preferably used and may be any of a condensation type, an addition type and those containing a vinyl group or a hydroxyl group. Specific examples include dimethyl silicone raw rubber, methylvinyl silicone raw rubber, methylphenylvinyl silicone raw rubber and the like.

Moreover, it is preferable that the silicone rubber should have a molecular weight Mw (which indicates a weight-average molecular weight determined in terms of standard polystyrene and hereinafter it has same meaning) should be 10,000 to 40,000. Moreover, it is preferable that a molecular weight distribution index (which indicates a value of a ratio Mw/Mn of a weight-average molecular weight Mw determined in terms of standard polystyrene to a number-average molecular weight Mn determined in terms of standard polystyrene and hereinafter it has same meaning) should be equal to or smaller than 2 because an excellent heat resistance is obtained in the conducting path forming portion 11 which is acquired.

A conductive particle contained in the conducting path forming portion 11 in the anisotropic conductive film 10A can easily be oriented by a method which will be described below. Therefore, a conductive particle exhibiting a magnetism is used. Specific examples of such a conductive particle include:

a particle of a metal having a magnetism such as iron, cobalt or nickel, a particle of their alloy, or a particle containing these metals;

a particle using these particles as a core particle and having the surface of the core particle which is plated with a metal having a high conductivity, for example, gold, silver, palladium, rhodium or the like;

a particle using, as a core particle, a nonmagnetic metal particle, an inorganic substance particle such as a glass bead or a polymer particle and having the surface of the core particle plated with a conductive magnetic metal such as nickel or cobalt, and the like.

In particular, it is preferable to use a particle using a nickel particle as a core particle and having a surface thereof plated with gold having a high conductivity.

While means for coating the surface of the core particle with a conductive metal is not particularly restricted, a chemical plating or electrolytic plating method, a sputtering method, an evaporation method or the like is used, for example.

In the case in which there is used a conductive particle obtained by coating the surface of the core particle with a conductive metal, a coating rate of a conductive metal in the surface of a particle (a rate of a coating area of the conductive metal to a surface area of the core particle) is preferably equal to or higher than 40%, is further preferably equal to or higher than 45% and is particularly preferably 47 to 95% because a high conductivity can be obtained.

Moreover, a coating amount of the conductive metal is preferably 0.5 to 50% by mass of the core particle, is more preferably 2 to 30% by mass, is further preferably 3 to 25% by mass, and is particularly preferably 4 to 20% by mass. In the case in which the conductive metal to be coated is gold, the coating amount is preferably 0.5 to 30% by mass of the core particle, is more preferably 2 to 20% by mass and is further preferably 3 to 15% by mass.

Furthermore, a particle diameter of the conductive particle is preferably 1 to 100 μm, is more preferably 2 to 50 μm, is further preferably 3 to 30 μm, and is particularly preferably 4 to 20 μm.

In addition, a particle diameter distribution (Dw/Dn) of the conductive particle is preferably 1 to 10, is more preferably 1.01 to 7, is further preferably 1.05 to 5, and is particularly preferably 1.1 to 4.

By using a conductive particle to satisfy such conditions, the conducting path forming portion 11 which is obtained can easily be pressurized and deformed, and furthermore, a sufficient electrical contact can be obtained between the conductive particles in the conducting path forming portion 11.

Moreover, while the shape of the conductive particle is not particularly restricted, it is preferable that the conductive particle should take the shape of a sphere or a star or should be a secondary particle obtained by aggregating them in view of the point that the conductive particle can easily be dispersed in a polymeric substance forming material.

Moreover, it is possible to properly use the surface of the conductive particle which is treated with a coupling agent such as a silane coupling agent or a lubricant. By treating the surface of the particle with the coupling agent or the lubricant, it is possible to enhance the durability of the anisotropic conductive connector.

It is desirable that the conductive particle should be used at a rate of 5 to 60%, and preferably 7 to 50% in a volume fraction with respect to the polymeric substance forming material. In some cases in which the rate is lower than 5%, the conducting path forming portion 11 having a sufficiently small electric resistance value cannot be obtained. On the other hand, in some cases in which the rate is higher than 60%, the conducting path forming portion 11 which is obtained is apt to be fragile so that a necessary elasticity for the conducting path forming portion 11 cannot be obtained.

For a material constituting the insulating sheet 21 in the sheet-like connector 20, it is possible to use a thermosetting resin such as a polyimide resin or an epoxy resin, or a thermoplastic resin such as a polyester resin such as a polyethylene terephthalate resin or a polybutylene terephthalate resin, a polyvinyl chloride resin, a polystyrene resin, a polyacrylnitrile resin, a polyethylene resin, a polypropylene resin, an acrylic resin, a polybutadiene resin, polyphenylene ether, polyphenylene sulfide, polyamide or polyoxymethylene, and the thermosetting resin is preferable. In this case, particularly, the polyimide resin is preferable in respect of a heat resistance, a dimension stability and the like.

For a material constituting the supporting body 30 which is to be used, a coefficient of linear thermal expansion is preferably equal to or smaller than $3\times10^{-5}$/K, is more preferably $2\times10^{-5}$ to $1\times10^{-6}$/K and is particularly preferably $6\times10^{-6}$ to $1\times10^{-6}$/K.

For a specific material, a metal material or a nonmetal material is used.

For the metal material, it is possible to use gold, silver, copper, iron, nickel, cobalt or their alloy.

For the nonmetal material, it is possible to use:

a resin material having a high mechanical strength such as a polyimide resin, a polyester resin, a polyaramid resin or a polyamide resin;

a composite resin material such as a glass fiber reinforcing type epoxy resin, a glass fiber reinforcing type polyester resin or a glass fiber reinforcing type polyimide resin;

a composite resin material obtained by mixing an inorganic material such as silica, alumina or boron nitride as a filler into an epoxy resin or the like, and the like.

In this case, it is preferable to use the composite resin material such as the polyimide resin or the glass fiber reinforcing type epoxy resin and the composite resin such as the epoxy resin into which the boron nitride is mixed as the filler, in view of the point that a coefficient of linear thermal expansion is small.

According to the anisotropic conductive connector device 10 in accordance with the first example, the sheet-like connector 20 is provided integrally on the anisotropic conductive film 10A. Therefore, it is not necessary to align the sheet-like connector 20 with the anisotropic conductive film 10A. Even if the pitch of the electrode to be a connecting object is small, an excellent electrical connection state can be obtained. In addition, also in the case of repetitive use for a long period of time or the case of use in a high temperature environment, the positional shift of the conducting path forming portion 11 from the electrode structure 22 can be prevented from being generated. Accordingly, it is possible to stably maintain an excellent electrical connection state.

Moreover, the protruded portion 15 for coupling, which is formed on the anisotropic conductive film 10A, is inserted in the through hole 26 for coupling which is formed on the insulating film 21 in the sheet-like connector 20. Therefore, the positional shift of the conducting path forming portion 11 from the electrode structure 22 can be prevented still more reliably.

Furthermore, the surface electrode portion 23 of the electrode structure 22 in the sheet-like connector 20 is protruded. Therefore, it is also possible to achieve an electrical connection reliably for a circuit device in which a resist film having a greater thickness than the thickness of the electrode to be the connecting object is formed.

Such an anisotropic conductive connector device 10 can be manufactured in the following manner, for example.

Figure 6:
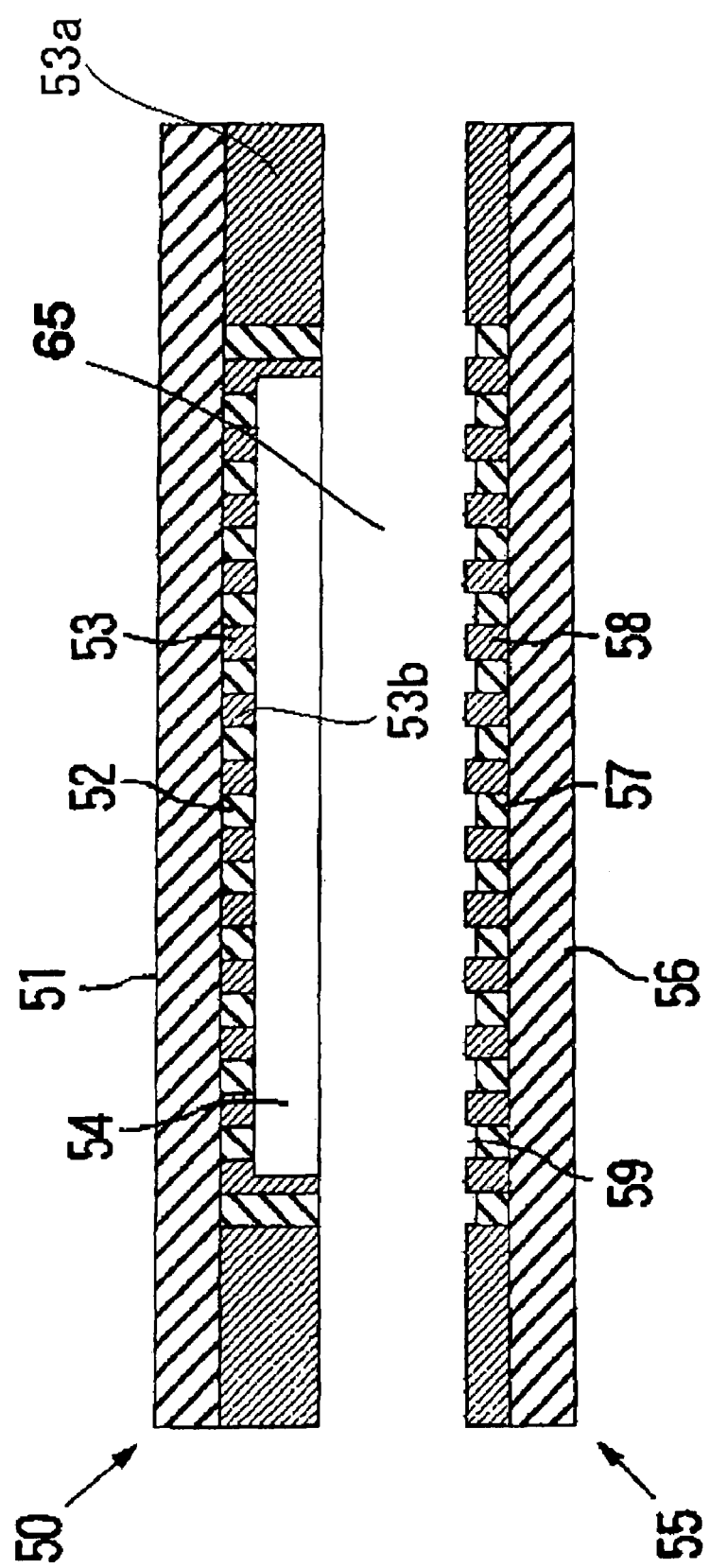
FIG. 6 is an explanatory sectional view showing a structure according to an example of a metal mold for molding an anisotropic conductive film.

FIG. 6 is an explanatory sectional view showing a structure according to an example of a metal mold to be used for manufacturing the anisotropic conductive connector device in accordance with the present invention. The metal mold has such a structure that an upper mold 50 and a lower mold 55 making a pair therewith are disposed opposite to each other, and a molding space 65 is formed between a molding surface of the upper mold 50 (i.e. a lower surface in FIG. 6) and a molding surface of the lower mold 55(i.e. an upper surface in FIG. 6).

In the upper mold 50, a surface of a ferromagnetic board 51 (i.e. a lower surface in FIG. 6) is provided with a ferromagnetic layer 52 in accordance with an arrangement pattern corresponding to the pattern of the conducting path forming portion 11 in the anisotropic conductive connector 10 to be intended and a nonmagnetic layer 53 is formed in portions other than the ferromagnetic layer 52, and a molding surface is formed by the ferromagnetic layer 52 and the nonmagnetic layer 53. Moreover, in the upper mold 50, a step is formed on the molding surface and a concave portion 54 is formed.

On the other hand, in the lower mold 55, a surface of a ferromagnetic board 56 (i.e. an upper surface in FIG. 6) is provided with a ferromagnetic layer 57 in accordance with a pattern corresponding to the pattern of the conducting path forming portion 11 in the anisotropic conductive connector 10 to be intended. In addition, a nonmagnetic layer 58 having a greater thickness than the thickness of the ferromagnetic layer 57 is formed in portions other than the ferromagnetic layer 57. Moreover, a step is formed between the nonmagnetic layer 58 and the ferromagnetic layer 57. Consequently, a concave portion 59 for forming the protruded portion 11A in the anisotropic conductive film 10A is formed on the molding surface of the lower mold 55.

As for a material constituting the ferromagnetic boards 51 and 56 in the upper mold 50 and the lower mold 55, it is possible to use a ferromagnetic metal such as iron, an iron-nickel alloy, an iron-cobalt alloy, nickel or cobalt. It is preferable that the ferromagnetic boards 51 and 56 should have thicknesses of 0.1 to 50 mm and surfaces should be smooth and be subjected to a chemical decreasing treatment or a mechanical polishing treatment.

Moreover, a material constituting the ferromagnetic layers 52 and 57 in the upper mold 50 and the lower mold 55, it is possible to use a ferromagnetic metal such as iron, an iron-nickel alloy, an iron-cobalt alloy, nickel or cobalt. It is preferable that the ferromagnetic layers 52 and 57 should have thicknesses of 10 μm or more. In the case in which the thicknesses are smaller than 10 μm, it is hard to cause a magnetic field having a sufficient intensity distribution to act on a molding material layer formed in the metal mold. As a result, it is difficult to collect a conductive particle at a high density in a portion to be the conducting path forming portion 11 in the molding material layer.

Furthermore, as for a material constituting the nonmagnetic layers 53 and 58 in the upper mold 50 and the lower mold 55, it is possible to use an on magnetic metal such as copper, a polymeric substance having a heat resistance and the like. It is preferable to use a polymeric substance cured by a radiation in view of the point that the nonmagnetic layers 53 and 58 can easily be formed by a photolithographic technique. As for such material, it is possible to use a photoresist such as an acryl type dry film resist, an epoxy type liquid resist or a polyimide type liquid resist, for example.

Moreover, the thickness of the nonmagnetic layer 58 in the lower mold 55 is set corresponding to the protrusion height of the protruded portion 11A to be formed and the thickness of the ferromagnetic layer 57.

By using the metal mold, the anisotropic conductive connector device 10 is manufactured in the following manner, for example.

Figure 7:
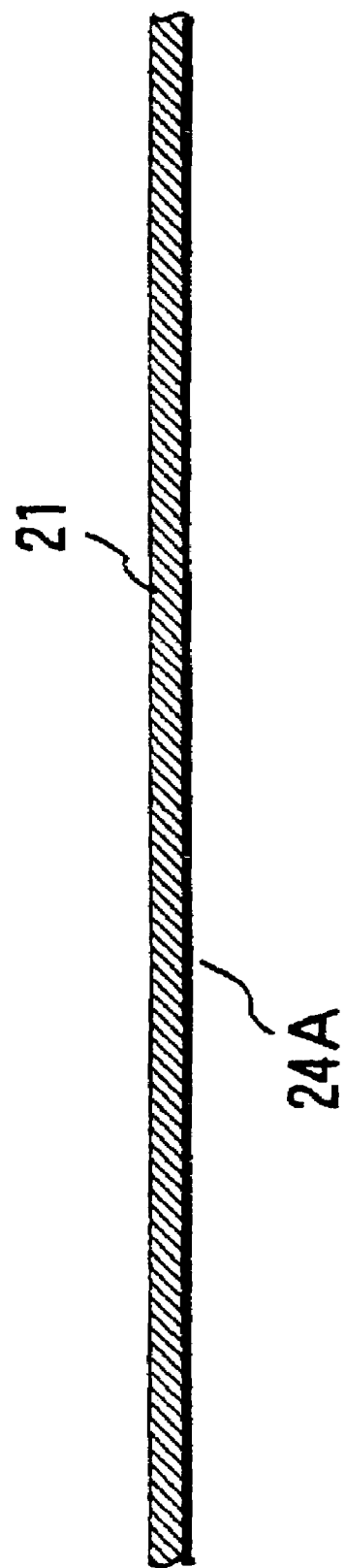
FIG. 7 is an explanatory sectional view showing the structure of a laminating material for obtaining a sheet-like connector.
Figure 8:
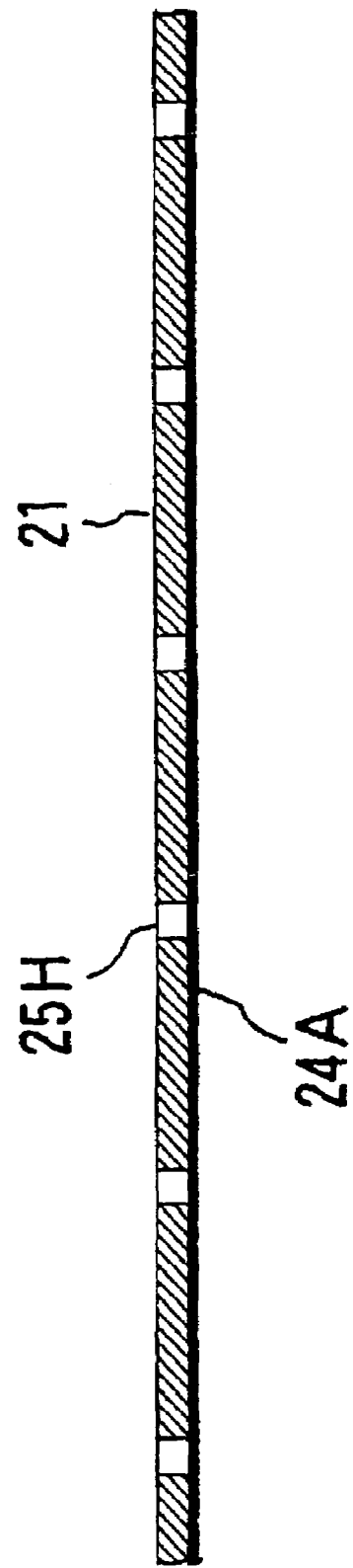
FIG. 8 is an explanatory sectional view showing a state in which a through hole is formed on an insulating sheet in the laminating material.

First of all, the sheet-like connector 20 having the structure shown in FIGS. 1 to 3 is manufactured. More specifically, as shown in FIG. 7, a laminating material formed by integrally laminating a metal layer 24A on the insulating sheet 21 is prepared. Furthermore, as shown in FIG. 8, in accordance with a pattern corresponding to the pattern of the electrode structure 22 to be formed, for the insulating sheet 21 in the laminating material, a plurality of through holes 25H penetrating in the direction of the thickness of the insulating sheet 21 is formed.

Figure 9:
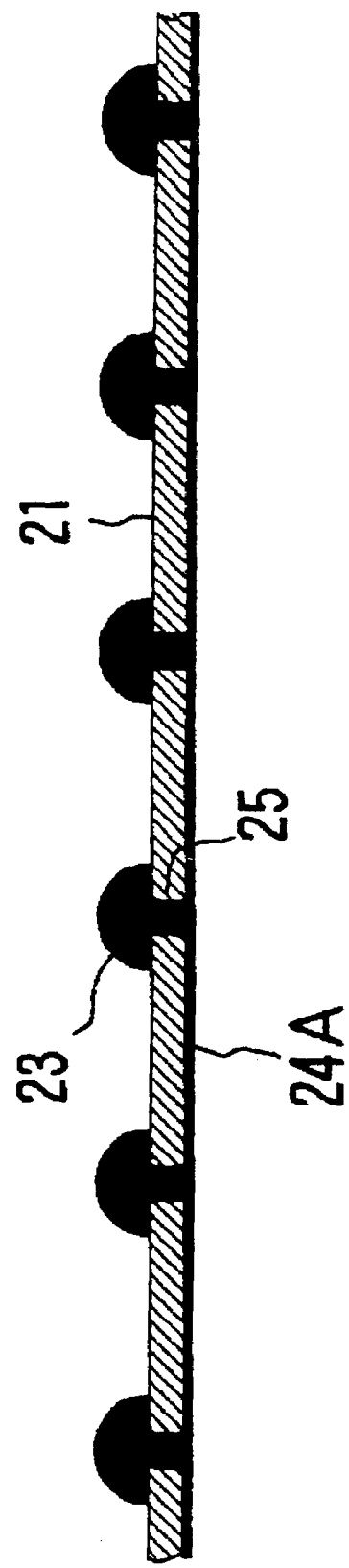
FIG. 9 is an explanatory sectional view showing a state in which a short circuit portion and a surface electrode portion are formed on an insulating sheet.

Next, as shown in FIG. 9, a plating treatment is carried out over the laminating material so that the short circuit portion 25, which is coupled integrally to the metal layer 24A, is formed in the through hole 25H of the insulating sheet 21 and so that the protruded surface electrode portion 23, which is coupled integrally with the short circuit portion 25, is formed on the surface of the insulating sheet 21.

Figure 10:
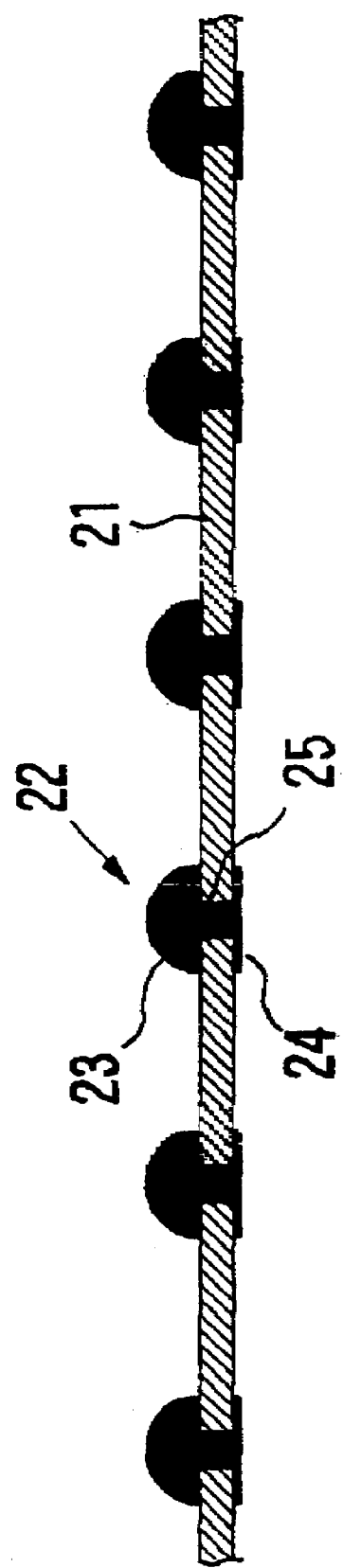
FIG. 10 is an explanatory sectional view showing a state in which a back electrode portion is formed on the back face of the insulating sheet.
Figure 11:
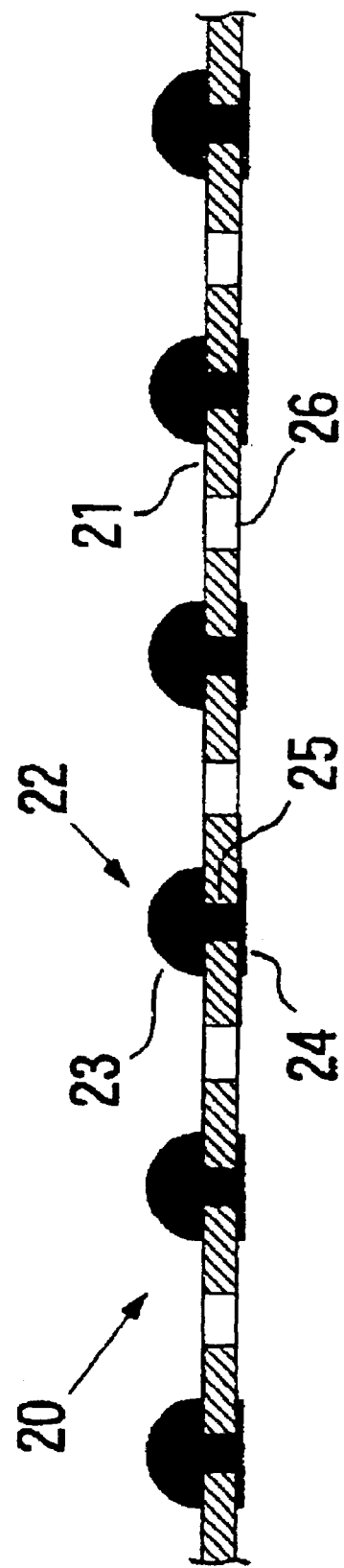
FIG. 11 is an explanatory sectional view showing a state in which a through hole for coupling is formed on the insulating sheet.

Thereafter, a photo etching treatment is carried out over the metal layer 24A in the laminating material and a part thereof is thus removed. Consequently, as shown in FIG. 10, the back electrode portion 24 coupled integrally with the short circuit portion 25 is provided to form the electrode structure 22. In addition, as shown in FIG. 11, the through hole 26 for coupling is formed on the insulating sheet 21 so that the sheet-like connector 20 is obtained.

In the foregoing, as for the method of forming the through hole 25H and the through hole 26 for coupling on the insulating sheet 21, it is possible to utilize a laser processing method, a dry etching method or the like.

As for a plating method for forming the short circuit portion 25 and the surface electrode portion 23, it is possible to utilize an electrolytic plating method or a nonelectrolytic plating method.

Figure 12:
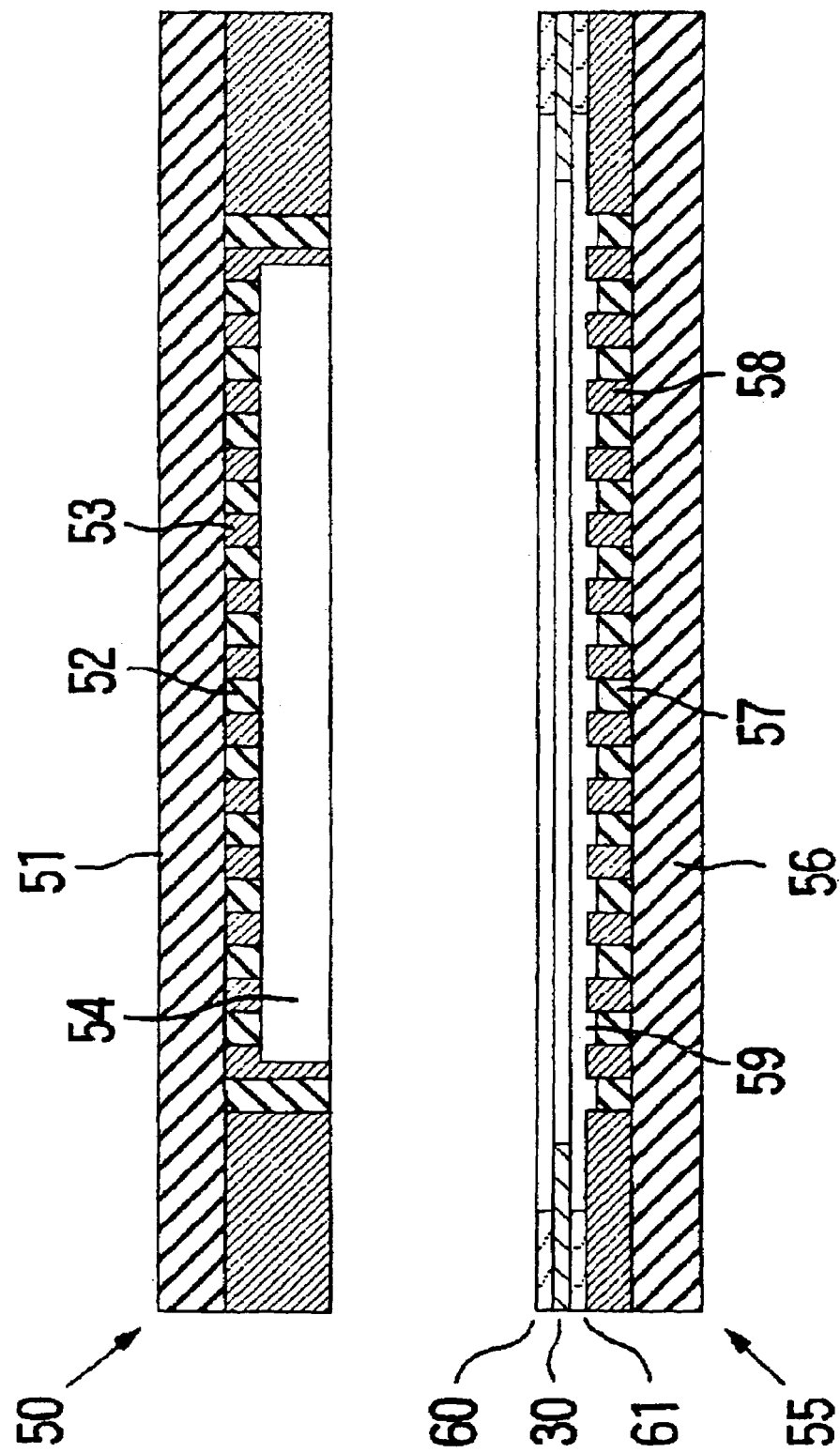
FIG. 12 is an explanatory sectional view showing a state in which a spacer and a supporting body are disposed on the molding surface of a lower mold.

Subsequently, as shown in FIG. 12, two frame-shaped spacers 60 and 61 and the supporting body 30 are prepared and as shown in FIG. 12, the supporting body 30 is fixed to a predetermined position of the lower mold 55 through the spacer 61, and furthermore, the spacer 60 is disposed on the supporting body 30.

On the other hand, a conductive particle exhibiting a magnetism is dispersed into a liquid polymeric substance forming material to be an elastically polymeric substance by curing. As a result, a molding material for forming an anisotropic conductive film is prepared.

Figure 13:
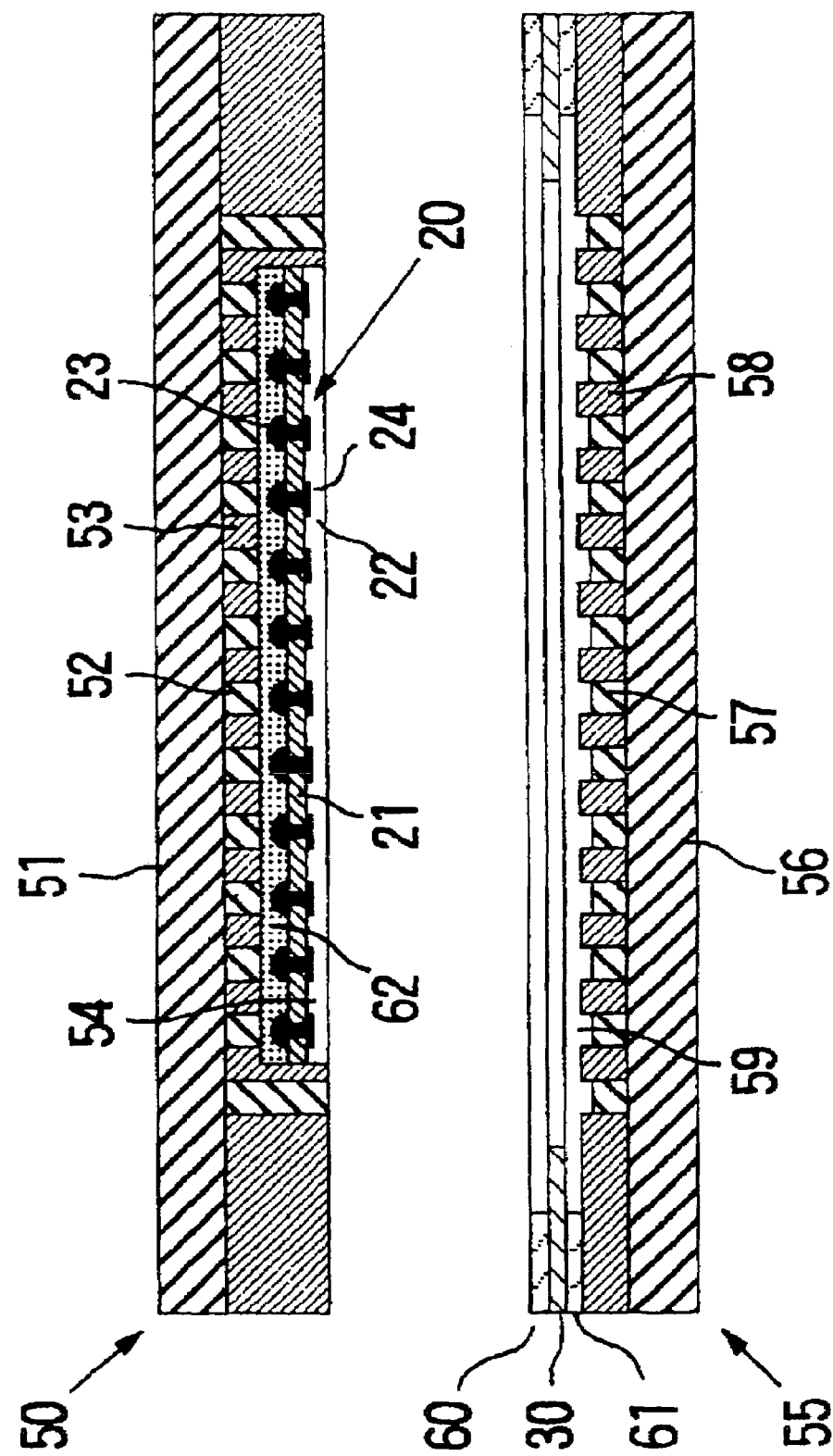
FIG. 13 is an explanatory sectional view showing a state in which a sheet-like connector is disposed on the molding surface of an upper mold through a protective film.

Thereafter, as shown in FIG. 13, the protective film 62 is disposed in the concave portion 54 on the molding surface of the upper mold 50, and furthermore, the sheet-like connector 20 is aligned on the protecting film 62 in such a manner that each of the electrode structures 22 is positioned on the ferromagnetic layer 52. In this state, the surface electrode portion 23 of the electrode structure 22 is disposed in contact with the protective film 62.

Figure 14:
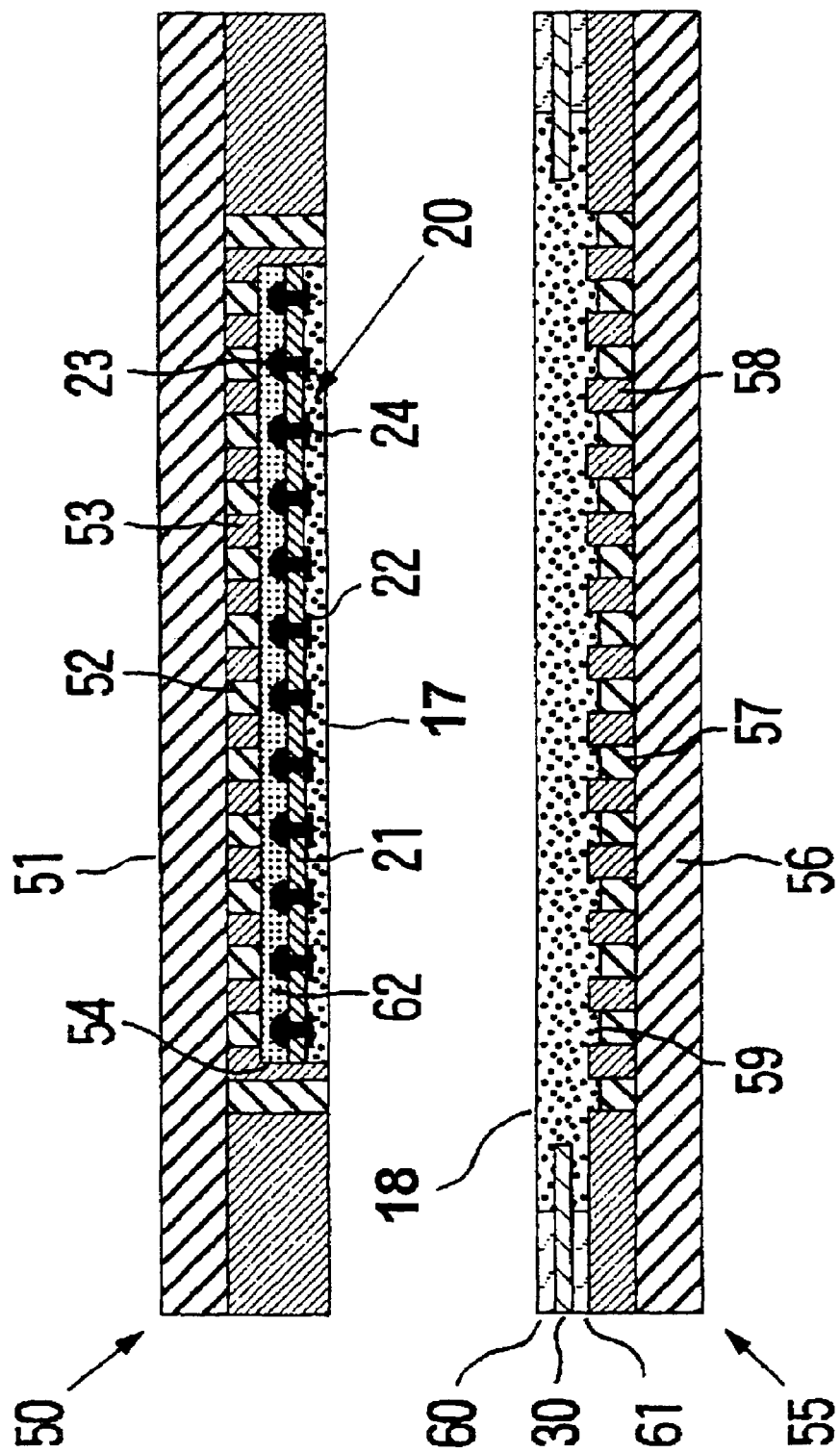
FIG. 14 is an explanatory sectional view showing a state in which a molding material layer is formed in an upper mold and each of metal molds.

Next, as shown in FIG. 14, the concave portion 54 of the upper mold 50 is filled with a molding material. Consequently, a molding material layer 17 containing a conductive particle exhibiting a magnetism in a polymeric substance forming material is formed in the concave portion 54, and furthermore, a molding material is filled in a space formed by the lower mold 55, the spacers 60 and 61, and the supporting body 30.

Figure 15:
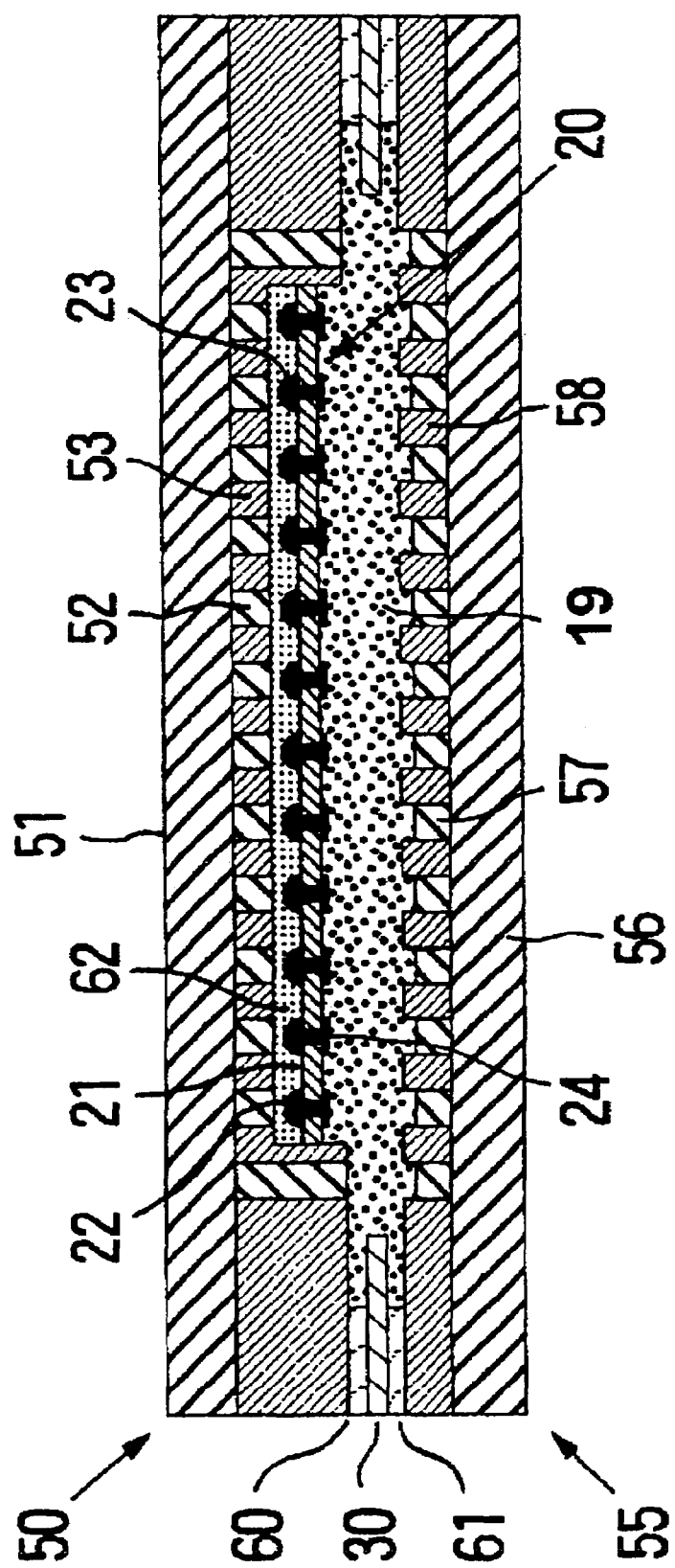
FIG. 15 is an explanatory sectional view showing a state in which a molding material layer having an intended configuration is formed in the metal mold.

As a result, a molding material layer 18 containing a conductive particle exhibiting a magnetism in the polymeric substance forming material is formed in the space, and furthermore, the upper mold 50 is aligned on the spacer 60. Consequently, a molding material layer 19 having a final configuration is formed in the metal mold as shown in FIG. 15.

In this state, the molding material layer 19 is formed on the molding surface of the lower mold 55 in the metal mold, and furthermore, the sheet-like connector 20 is disposed on the molding material layer 19. In addition, the protective film 62 is disposed between the sheet-like connector 20 and the molding surface of the upper mold 50.

Figure 16:
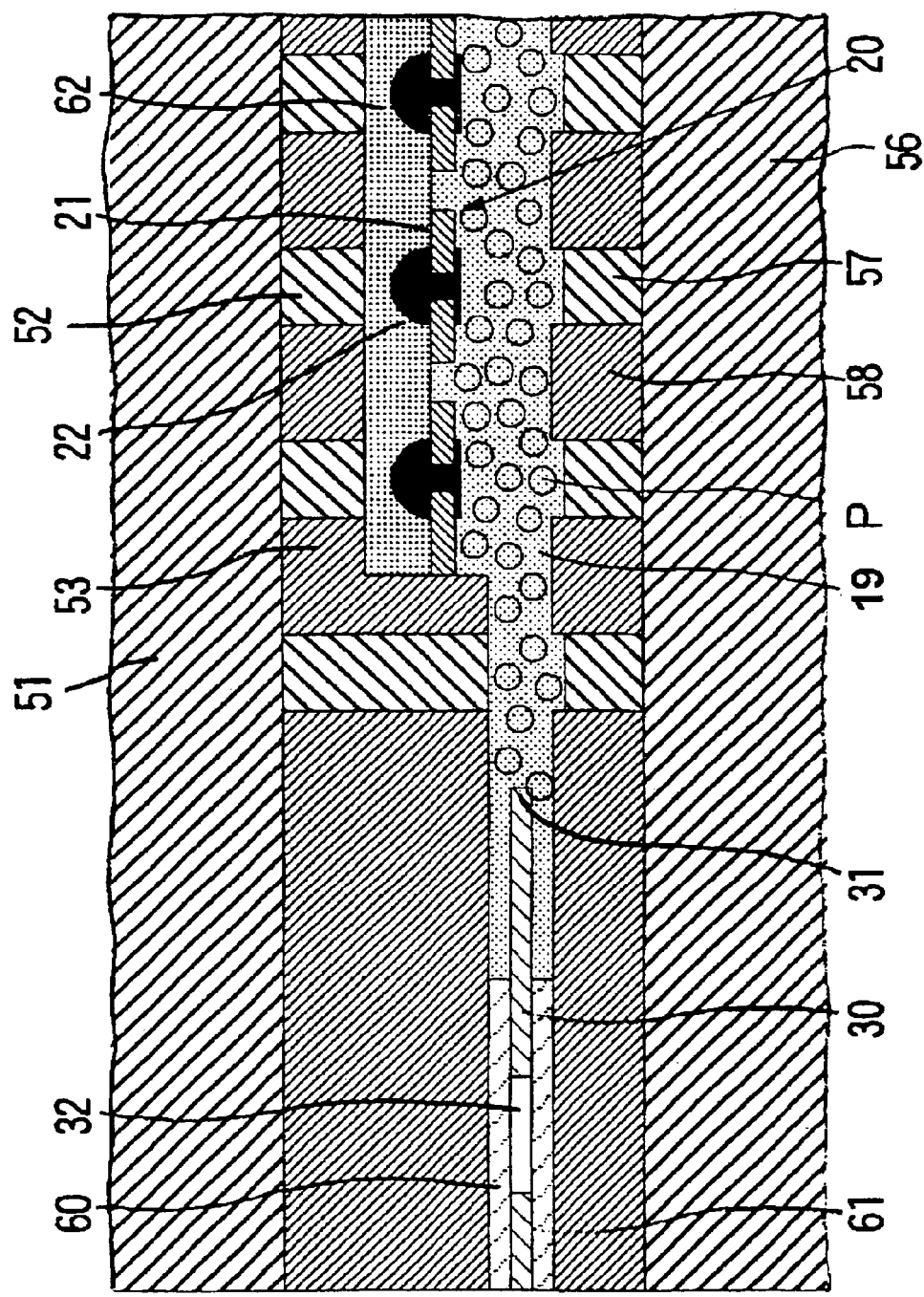
FIG. 16 is an explanatory sectional view partially showing the enlarged molding material layer.

Moreover, in the molding material layer 19, a conductive particle P is set in a dispersion state in the molding material layer 19 as shown in FIG. 16.

Subsequently, an electromagnet (not shown), which is provided on the upper surface of the ferromagnetic board 51 in the upper mold 50 and the lower surface of the ferromagnetic board 56 in the lower mold 55, is operated. As a result, a parallel magnetic field having an intensity distribution, that is, a parallel magnetic field having a high intensity between the ferromagnetic layer 52 of the upper mold 50 and the ferromagnetic layer 57 of the lower mold 55 corresponding thereto is caused to act in a direction of a thickness of the molding material layer 19.

Figure 17:
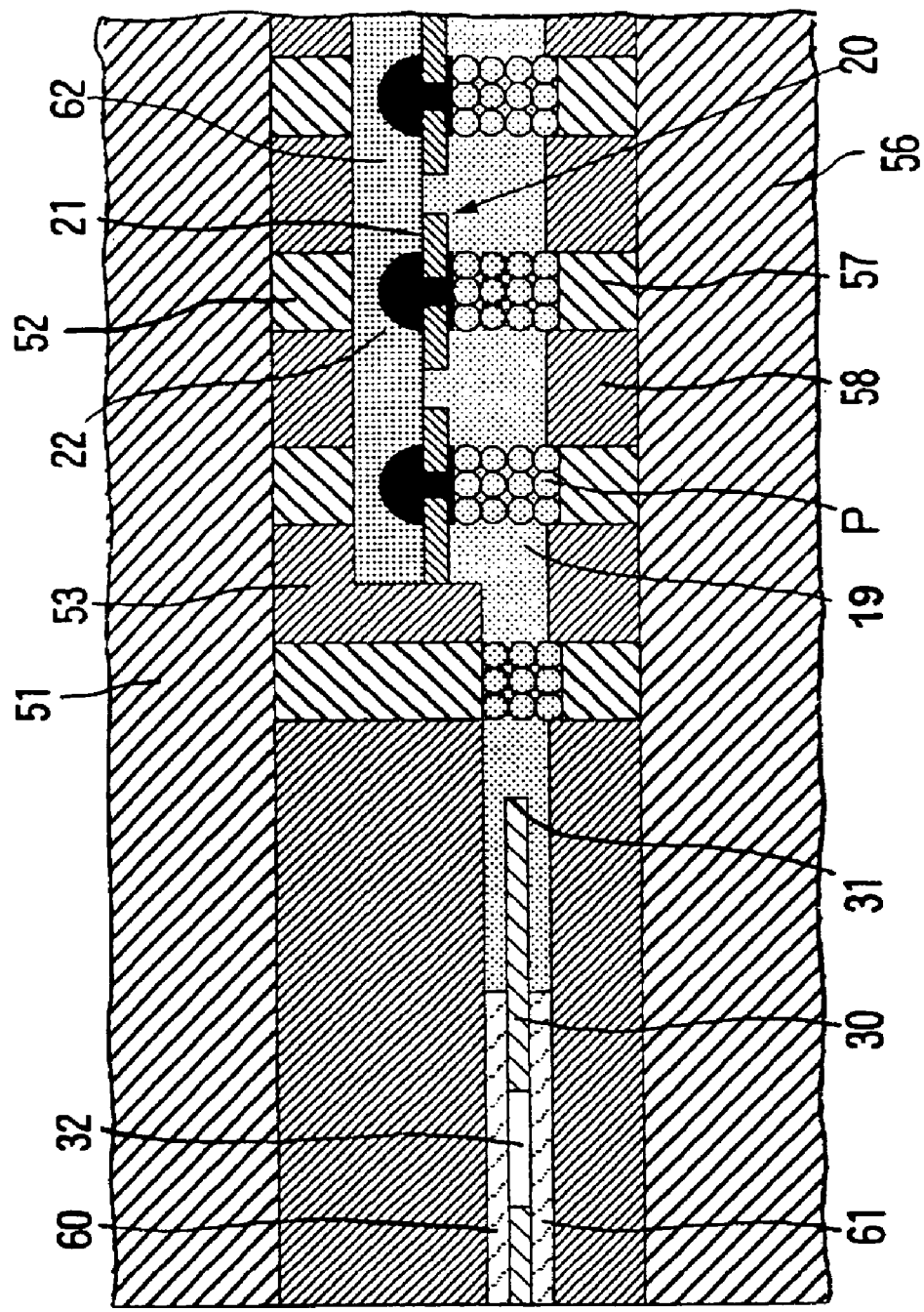
FIG. 17 is an explanatory sectional view showing a state in which a magnetic field acts on the molding material layer.

As a result, as shown in FIG. 17, in the molding material layer 19, the conductive particle dispersed in the molding material layer 19 is collected in the portion, which is to be the conducting path forming portion 11 positioned between each ferromagnetic layer 52 of the upper mold 50 and the ferromagnetic layer 57 of the lower mold 55 corresponding thereto. Furthermore, the conductive particle is oriented to be arranged in the direction of the thickness of the molding material layer 19.

In this state, the molding material layer 19 is subjected to a curing treatment. Consequently, the anisotropic conductive film 10A having the conducting path forming portion 11, which is filled densely with the conductive particle in the elastically polymeric substance in an arranging and orienting state in the direction of the thickness, and having the insulating portion 14 formed of an insulating elastically polymeric substance, which is formed to surround the conducting path forming portion 11 and in which the conductive particle is not present at all or is rarely present, is formed in a state in which the sheet-like connector 20 is integrally bonded to a surface thereof and a peripheral portion thereof is fixed to and supported on the supporting body 30.

Consequently, the anisotropic conductive connector 10 having the structure shown in FIGS. 1 to 3 is manufactured.

In the foregoing, as for a material for forming the protective film 62, it is possible to use a resin material such as a resist material, a fluororesin or a polyimide resin.

Although the curing treatment for the molding material layer 19 can also be carried out in a state in which a parallel magnetic field is maintained to act, it can also be carried out after the action of the parallel magnetic field is stopped.

It is preferable that the intensity of the parallel magnetic field to act on each molding material layer should be 20,000 to 1,000,000 µT on average.

Moreover, as means for causing the parallel magnetic field to act on each molding material layer, it is also possible to use a permanent magnet in place of the electromagnet. It is preferable that the permanent magnet should be formed of alnico (an Fe—Al—Ni—Co type alloy), ferrite or the like in view of the point that the intensity of the parallel magnetic field within the range described above can be obtained.

While the curing treatment for the molding material layer 19 is properly selected depending on a material to be used, it is usually carried out by a heating treatment. A specific heating temperature and a specific heating time are properly selected in consideration of a type of the polymeric substance forming material constituting the molding material layer, a time required for moving the conductive particle and the like.

According to such a manufacturing method, the molding material layer 19 is subjected to the curing treatment in a state in which the sheet-like connector 20 is disposed on the molding material layer 19 for forming the anisotropic conductive film 10A. Therefore, it is possible to advantageously and reliably manufacture the anisotropic conductive connector device 10 in which the sheet-like connector 20 is provided integrally on the anisotropic conductive film 10A.

Moreover, the protective film 62 is disposed between the molding surface of the upper mold 50 and the sheet-like connector 20. Consequently, it is possible to prevent the molding surface of the upper mold 50 and the electrode structure 22 of the sheet-like connector 20 from being damaged. Furthermore, it is also possible to prevent a molding material from entering a surface of the sheet-like connector 20 (a surface on the upper mold 50 side).

Figure 18:
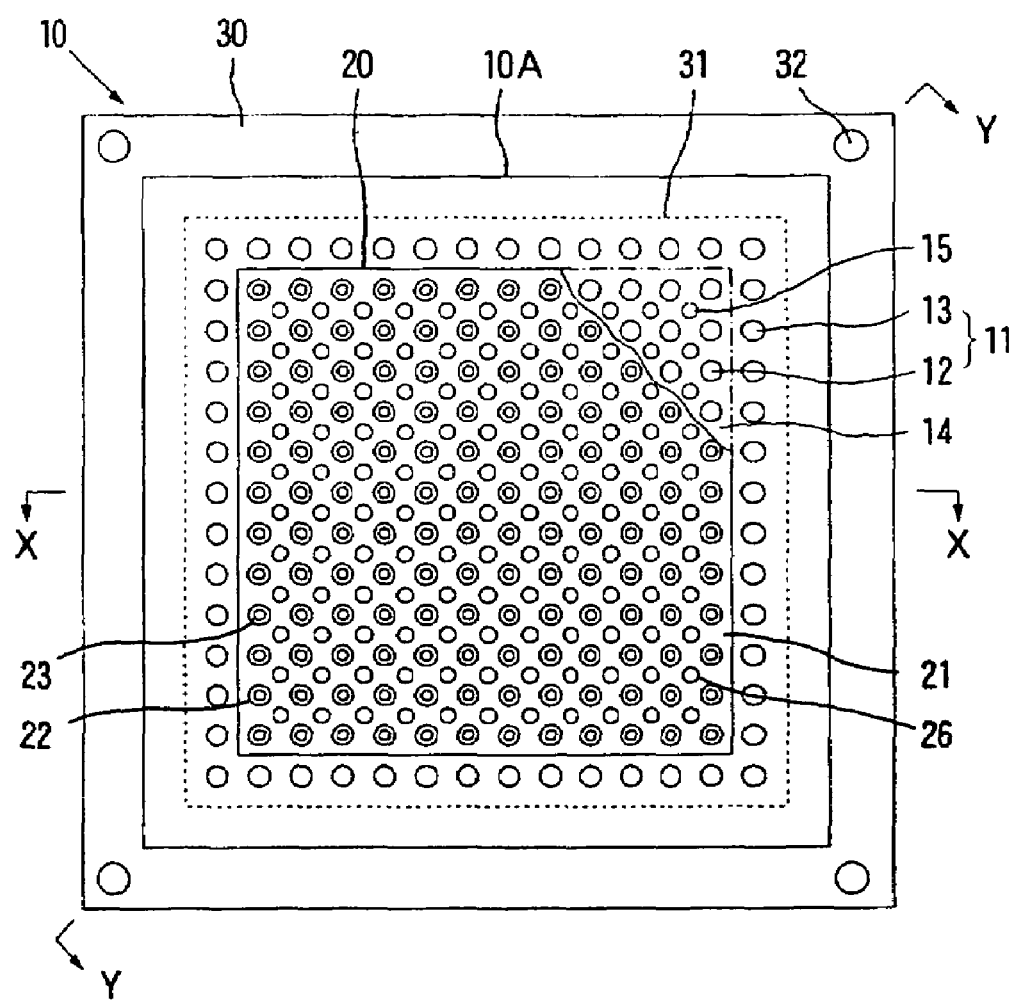
FIG. 18 is a plan view showing an anisotropic conductive connector device according to a second example of the present invention.
Figure 19:
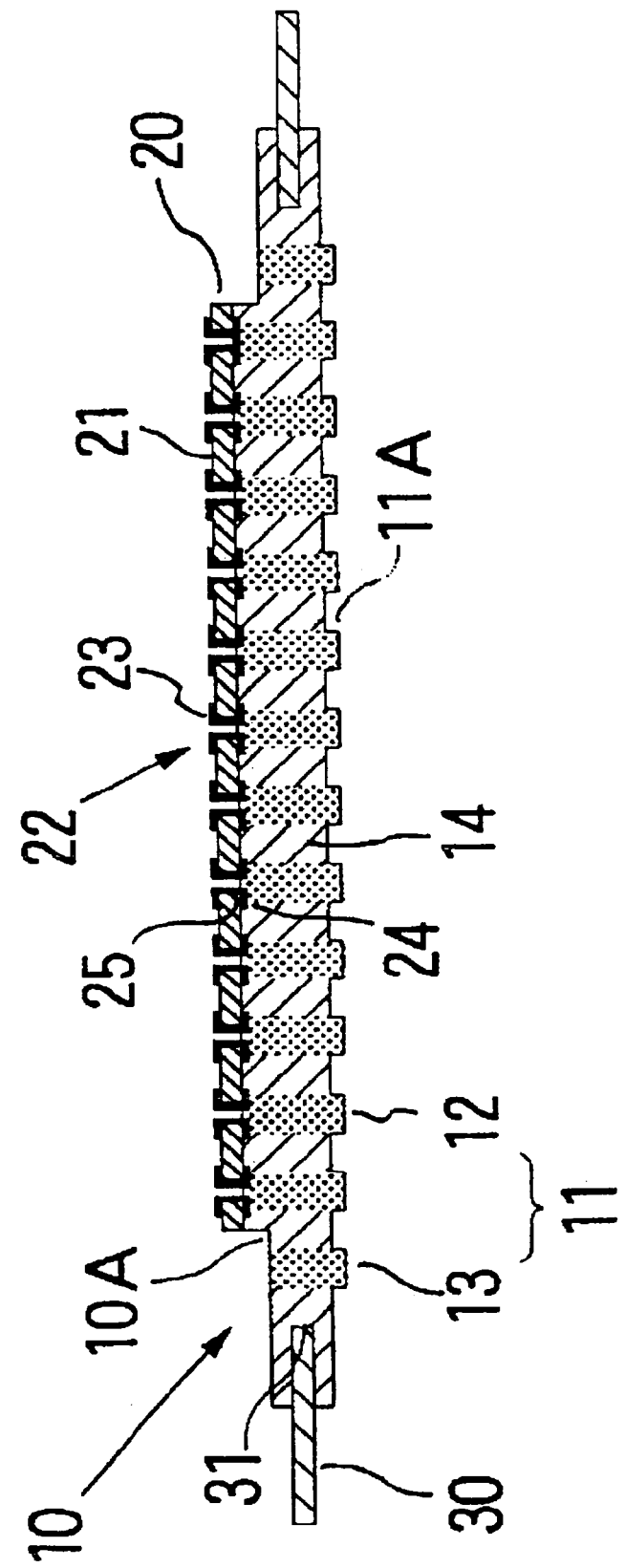
FIG. 19 is an explanatory view showing an X-X section of the anisotropic conductive connector device illustrated in FIG. 18.
Figure 20:
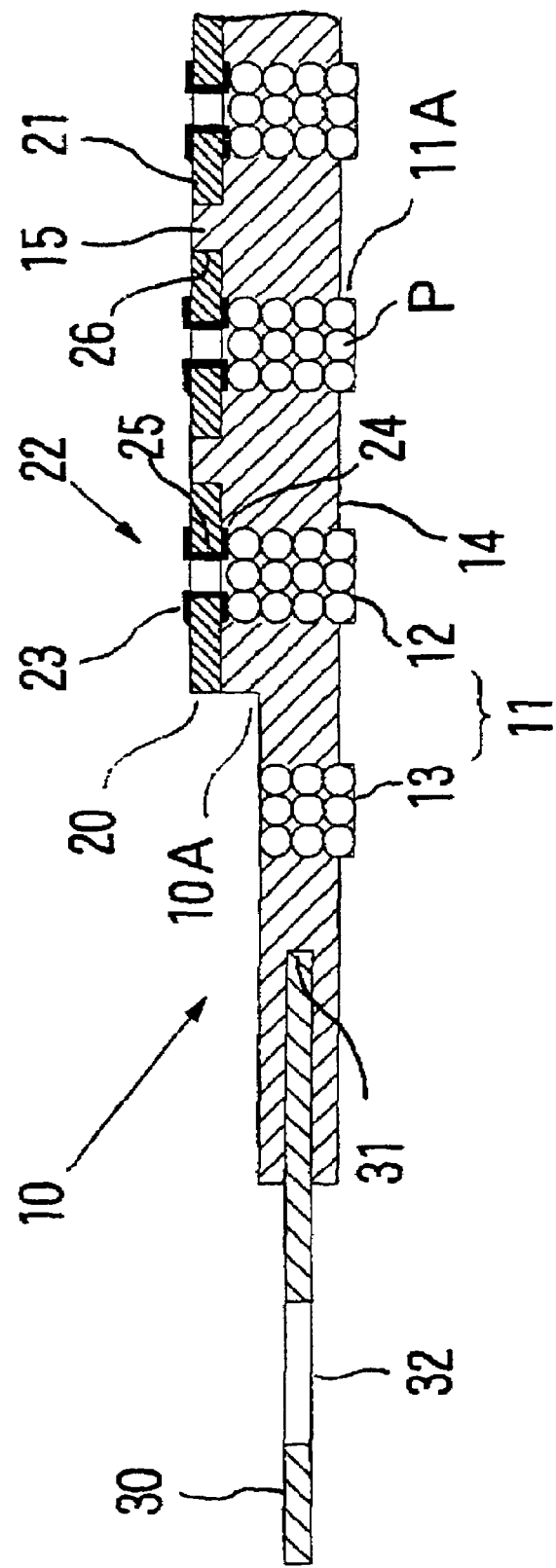
FIG. 20 is an explanatory view partially showing an enlarged Y-Y section of the anisotropic conductive connector device illustrated in FIG. 18.

FIGS. 18 to 20 are explanatory views showing an anisotropic conductive connector device according to a second example of the present invention, and FIG. 18 is a plan view showing the anisotropic conductive connector device, FIG. 19 is an explanatory view showing an X-X section of the anisotropic conductive connector device illustrated in FIG. 18 and FIG. 20 is an explanatory view partially showing an enlarged Y-Y section of the anisotropic conductive connector device illustrated in FIG. 18.

An anisotropic conductive connector device 10 according to the second example is constituted by a rectangular anisotropic conductive film 10A, a sheet-like connector 20 provided integrally on one surface of the anisotropic conductive film 10A and a rectangular plate-shaped supporting body 30 which supports the anisotropic conductive film 10A. In addition, the anisotropic conductive film 10A and the supporting body 30 have the same structures as those of the anisotropic conductive connector device according to the first example.

The sheet-like connector 20 in the anisotropic conductive connector device 10 according to the second example has the same structure as the sheet-like connector 20 in the anisotropic conductive connector device 10 according to the first example except for an electrode structure 22.

Each electrode structure 22 is constituted by integrally coupling a surface electrode portion 23 taking the shape of a circular ring plate, which is exposed from a surface (an upper surface in the drawing) of an insulating sheet 21, and a back electrode portion 24 taking the shape of a circular ring plate, which is exposed from a back face of the insulating sheet 21, to each other via a cylindrical short circuit portion 25 (a through hole) penetrating and extended in the direction of the thickness of the insulating sheet 21.

Such a sheet-like connector 20 can be manufactured in the following manner.

Figure 21:
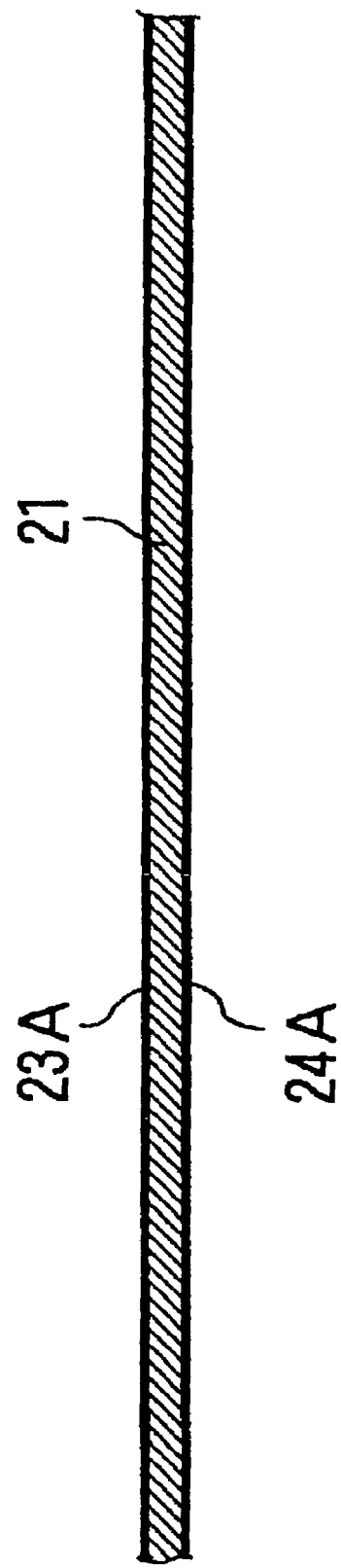
FIG. 21 is an explanatory sectional view showing the structure of a laminating material for obtaining a sheet-like connector.
Figure 22:
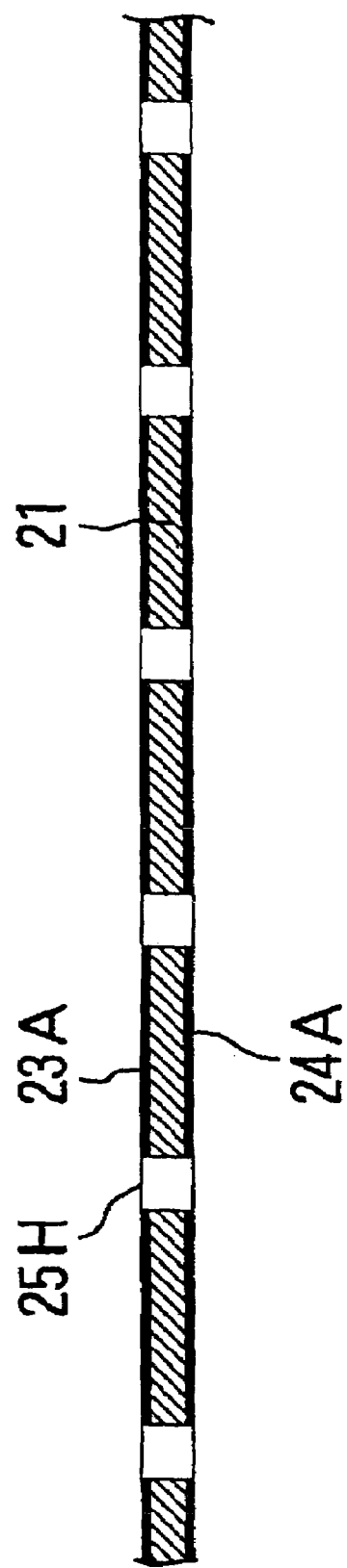
FIG. 22 is an explanatory sectional view showing a state in which a through hole is formed on the laminating material.

First of all, as shown in FIG. 21, a laminating material obtained by integrally laminating metal layers 23A and 24A on both sides of the insulating sheet 21 is prepared. Furthermore, as shown in FIG. 22, for the laminating material, in accordance with a pattern corresponding to the pattern of the electrode structure 22 to be formed, a plurality of through holes 25H penetrating in the direction of the thickness of the laminating material is formed.

Figure 23:
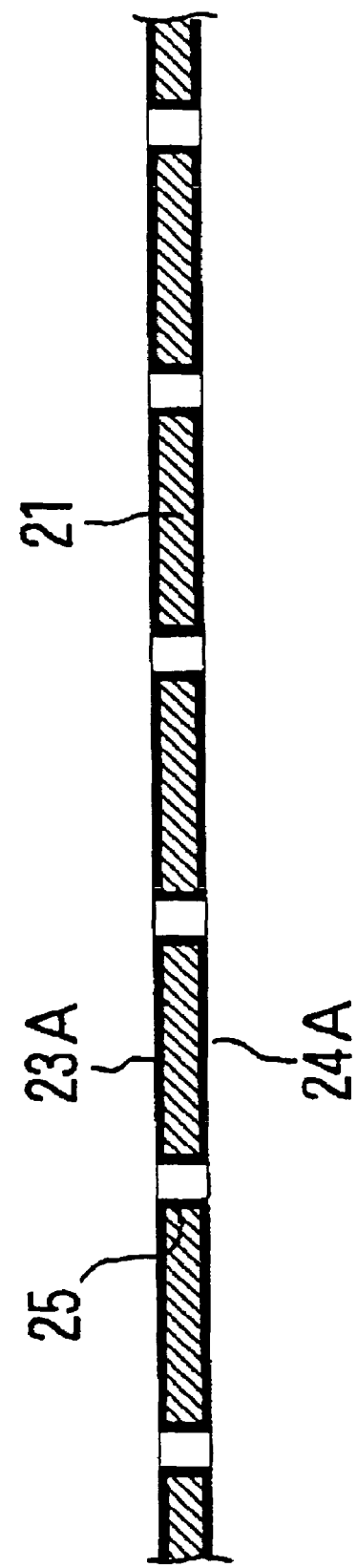
FIG. 23 is an explanatory sectional view showing a state in which a short circuit portion is formed on an insulating sheet.

Subsequently, the laminating material is subjected to a plating treatment so that, as shown in FIG. 23, the short circuit portion 25 which is coupled integrally with each of the metal layers 23A and 24A is formed in the through hole H in the laminating material.

Figure 24:
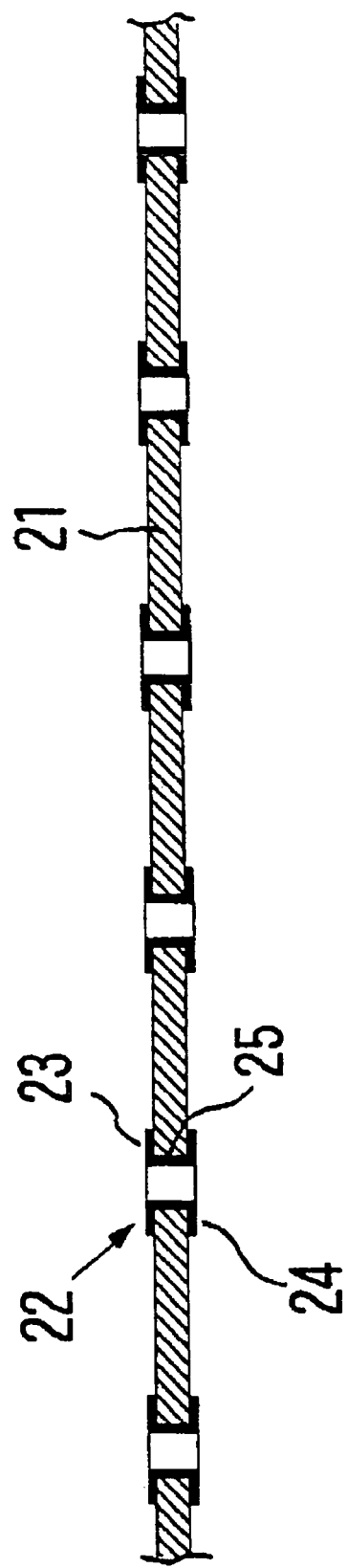
FIG. 24 is an explanatory sectional view showing a state in which a surface electrode portion and a back electrode portion are formed on the surface and back face of the insulating sheet.

Then, each of the metal layers 23A and 24A in the laminating material is subjected to a photo etching treatment and a part thereof is thus removed. As shown in FIG. 24, consequently, the surface electrode portion 23 and the back electrode portion 24 which are coupled integrally through the short circuit portion 25 are formed on both sides of the insulating sheet 21, so that the electrode structure 22 is formed.

Figure 25:
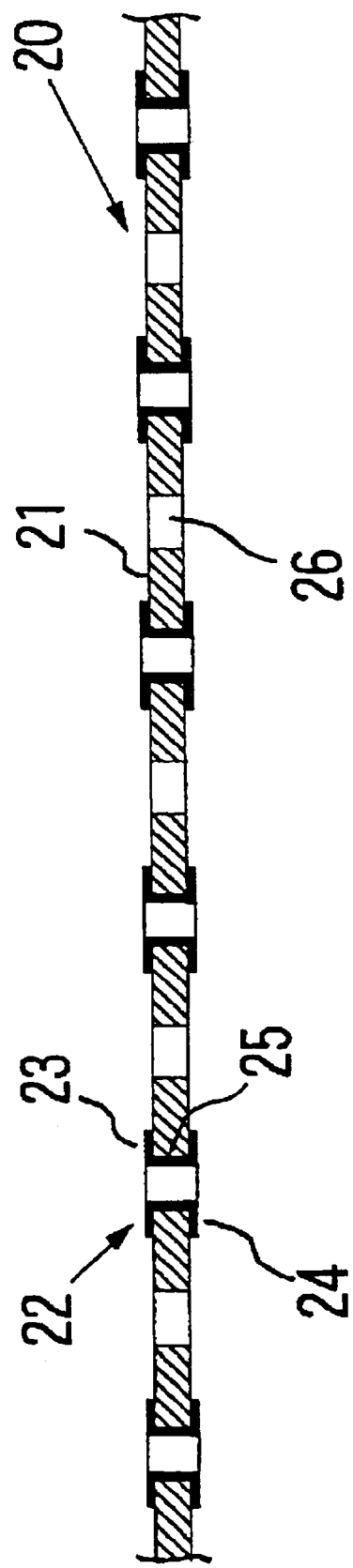
FIG. 25 is an explanatory sectional view showing a state in which a through hole for coupling is formed on the insulating sheet.

Thereafter, as shown in FIG. 25, a through hole 26 for coupling is formed on the insulating sheet 21 so that the sheet-like connector 20 is obtained.

The anisotropic conductive connector device 10 according to the second example can be manufactured in the same manner as the anisotropic conductive connector device according to the first example except that a sheet-like connector 20 shown in FIG. 25 is used in place of the sheet-like connector 20 shown in FIG. 11.

According to the anisotropic conductive connector device 10 in accordance with the second example, the sheet-like connector 20 is provided integrally on the anisotropic conductive film 10A. Therefore, it is not necessary to align the sheet-like connector 20 with the anisotropic conductive film 10A. Consequently, even if the pitch of an electrode to be a connecting object is small, an excellent electrical connection state can be obtained. In addition, the positional shift of the conducting path forming portion 11 from the electrode structure 22 is not generated also in the case of repetitive use for a long period of time or the case of use in a high temperature environment. Accordingly, it is possible to stably maintain an excellent electrical connection state.

Moreover, a protruded portion 15 for coupling, which is formed on the anisotropic conductive film 10A, is inserted in the through hole 26 for coupling, which is formed on the insulating sheet 21 in the sheet-like connector 20. Therefore, the positional shift of the conducting path forming portion 11 from the electrode structure 22 can be prevented still more reliably.

Furthermore, the surface electrode portion 23 of the electrode structure 22 in the sheet-like connector 20 takes the shape of a protruded plate. Therefore, even if the electrode to be the connecting object is protruded, the conducting path forming portion 11 can be prevented from being excessively pressurized. Accordingly, also in the case of repetitive use, it is possible to obtain a stable conductivity for a long period of time in the conducting path forming portion 11.

Figure 26:
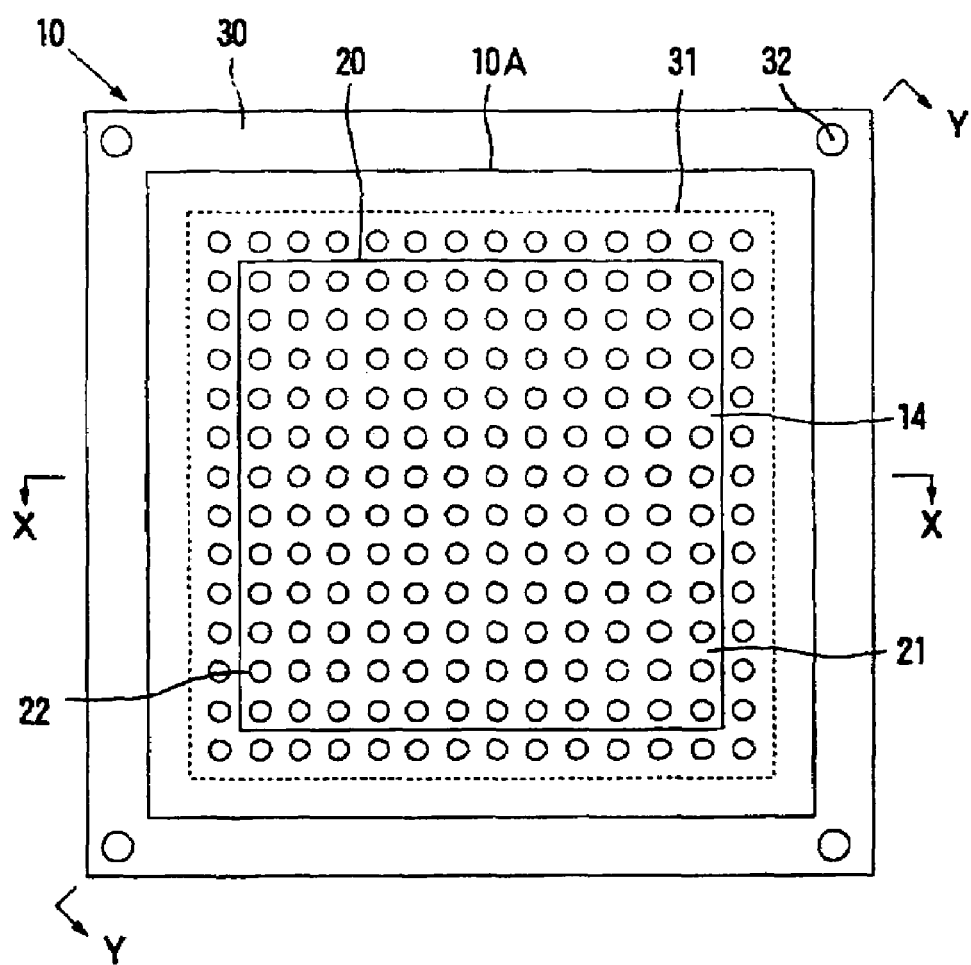
FIG. 26 is a plan view showing an anisotropic conductive connector device according to a third example of the present invention.
Figure 27:
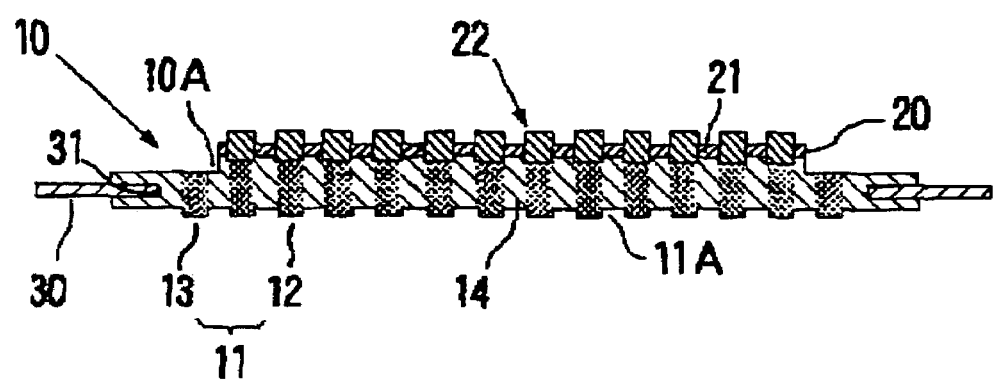
FIG. 27 is an explanatory view showing an X-X section of the anisotropic conductive connector device illustrated in FIG. 26.
Figure 28:
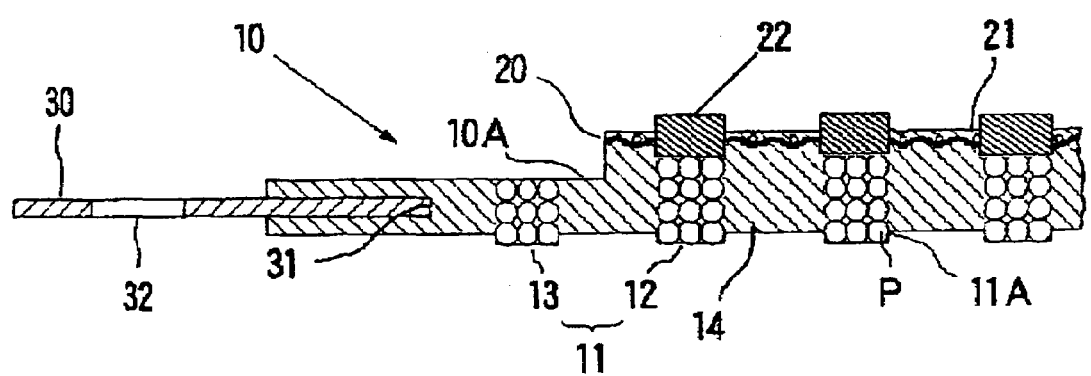
FIG. 28 is an explanatory view partially showing an enlarged Y-Y section of the anisotropic conductive connector device illustrated in FIG. 26.

FIGS. 26 to 28 are explanatory views showing an anisotropic conductive connector device according to a third example of the present invention, and FIG. 26 is a plan view showing the anisotropic conductive connector device, FIG. 27 is an explanatory view showing an X-X section of the anisotropic conductive connector device illustrated in FIG. 26 and FIG. 28 is an explanatory view partially showing an enlarged Y-Y section of the anisotropic conductive connector device illustrated in FIG. 26.

An anisotropic conductive connector device 10 according to the second example is constituted by a rectangular anisotropic conductive film 10A, a sheet-like connector 20 provided integrally on one surface of the anisotropic conductive film 10A and a rectangular plate-shaped supporting body 30 which supports the anisotropic conductive film 10A. In addition, the anisotropic conductive film 10A and the supporting body 30 have the same structures as those of the anisotropic conductive connector device according to the first example.

In the anisotropic conductive connector device 10 according to the third example, the sheet-like connector 20 has an insulating sheet 21 formed by a mesh, a nonwoven fabric or a porous sheet in which a void communicating with both sides of the insulating sheet is provided. A plurality of electrode structures 22 formed of a metal, which is extended in the direction of the thickness of the insulating sheet 21, is disposed apart from each other in the planar direction of the insulating sheet 21 in accordance with a pattern corresponding to the pattern of an electrode to be a connecting object in the insulating sheet 21.

Each of the electrode structures 22 penetrates and is extended in the direction of the thickness of the insulating sheet 21 and is coupled integrally with the insulating sheet.

In the sheet-like connector 20, each of the electrode structures 22 is positioned on an effective conducting path forming portion 12 of the anisotropic conductive film 10A and is integrated on the anisotropic conductive film 10A.

A thickness of the insulating sheet 21 formed by the mesh, the nonwoven fabric or the porous sheet is 0.005 to 1 mm, for example, and is preferably 0.01 to 0.5 mm and is further preferably 0.015 to 0.3 mm.

Moreover, a diameter of the electrode structure 22 is properly set corresponding to the pitch of the electrode to be the connecting object or the like, and is 50 to 1000 µm, for example, and is preferably 200 to 800 µm.

Furthermore, a protrusion height of the electrode structure 22 from the insulating sheet is 10 to 300 µm, for example, and is preferably 50 to 200 µm.

It is possible to suitably use the mesh or nonwoven fabric constituting the insulating sheet 21 which is formed by an organic fiber. Examples of such an organic fiber include a fluororesin fiber such as a polytetrafluoroethylene fiber, an aramid fiber, a polyethylene fiber, a polyallylate fiber, a nylon fiber, a polyester fiber, and the like.

By using an organic fiber in which a coefficient of linear thermal expansion is equal to or approximates to a coefficient of linear thermal expansion of a material forming a connecting object, more specifically, a coefficient of linear thermal expansion is $30 \times 10^{-6}$ to $-5 \times 10^{-6}$/K, particularly, $10 \times 10^{-6}$ to $-3 \times 10^{-6}$/K, moreover, it is possible to suppress the thermal expansion of the anisotropic conductive film. Therefore, also in the case in which a thermal history caused by a change in a temperature is received, it is possible to stably maintain an excellent electrical connection state for the connecting object.

Furthermore, it is preferable to use an organic fiber having a diameter of 10 to 200 µm.

In addition, it is possible to use, for the porous sheet, a porous thin film resin sheet or the like which is provided with a large number of openings by a treatment such as a laser perforating process or etching.

According to the anisotropic conductive connector device 10 in accordance with the third example, a material, which constitutes an anisotropic conductive film, or an adhesive, which bonds the anisotropic conductive film and the sheet-like connector, are cured in a permeation state into the void of the insulating sheet 21. Therefore, the sheet-like connector 20 is integrated on the anisotropic conductive film 10A. Thus, the sheet-like connector is integrated with the anisotropic conductive film thereon and cannot be moved mutually to positions.

Therefore, it is not necessary to align the sheet-like connector 20 with the anisotropic conductive film 10A. Even if the pitch of an electrode to be a connecting object is small, consequently, an excellent electrical connection state can be obtained. In addition, also in the case of repetitive use for a long period of time or the case of use in a high temperature environment, the positional shift of the conducting path forming portion 11 from the electrode structure 22 is not generated. Accordingly, it is possible to stably maintain an excellent electrical connection state.

Moreover, the insulating sheet 21 in the sheet-like connector 20 is constituted by the insulating sheet 21 formed by the mesh, the nonwoven fabric or the porous sheet in which the void communicating with both sides of the insulating sheet is formed. Therefore, the positional shift of the conducting path forming portion 11 from the electrode structure 22 can be prevented still more reliably.

Furthermore, the electrode structure 22 in the sheet-like connector 20 is protruded. Therefore, it is also possible to reliably achieve an electrical connection for a circuit device in which a resist film having a greater thickness than the thickness of the electrode to be the connecting object is formed.

The anisotropic conductive connector device 10 according to the third example can be manufactured in the following manner, for example.

More specifically, the anisotropic conductive connector device 10 is manufactured in the following manner by using the metal mold including the upper mold 50 and the lower mold 55 shown in FIG. 6, for example.

Figure 29:
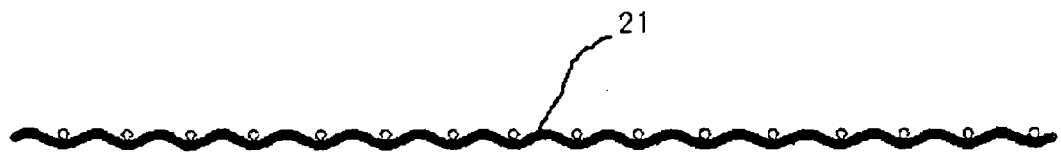
FIG. 29 is an explanatory sectional view showing the structure of a laminating material for obtaining a sheet-like connector.

First of all, the sheet-like connector 20 having the structure shown in FIGS. 26 to 28 is manufactured. More specifically, the insulating sheet 21 formed by a mesh or a nonwoven fabric is prepared as shown in FIG. 29.

Figure 30:
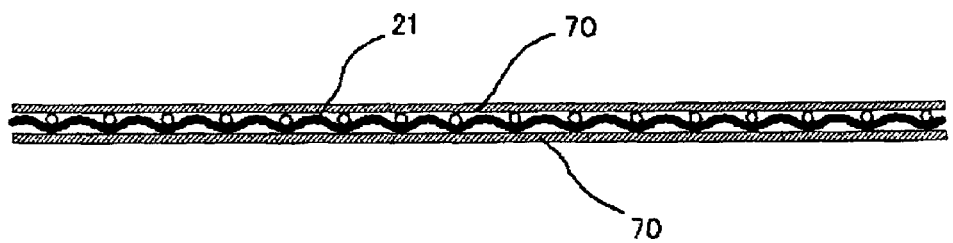
FIG. 30 is an explanatory sectional view showing a state in which a through hole is formed on an insulating sheet in the laminating material.

As shown in FIG. 30, a resist layer 70 formed of a dry film resist or the like is provided on the insulating sheet 21, for example.

Figure 31:
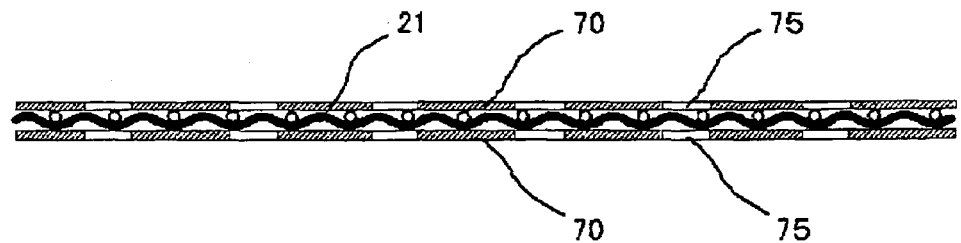
FIG. 31 is an explanatory sectional view showing a state in which a short circuit portion and a surface electrode portion are formed on the insulating sheet.

For the insulating sheet 21 having the resist layer formed thereon, as shown in FIG. 31, a plurality of pattern holes 75 is formed on the resist layer 70 in accordance with a pattern corresponding to the pattern of the electrode structure 22 to be formed.

Figure 32:
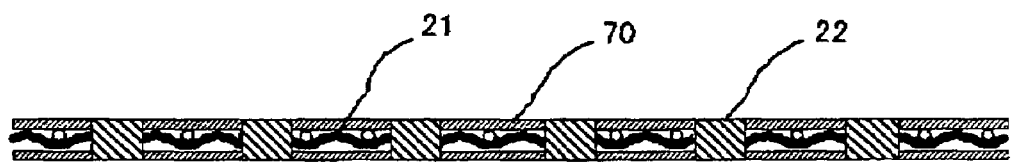
FIG. 32 is an explanatory sectional view showing a state in which a back electrode portion is formed on the back face of the insulating sheet.

Subsequently, the laminating material is subjected to a plating treatment. Consequently, the electrode structure 22 coupled to the insulating sheet 21 formed by the mesh or the nonwoven fabric is formed in the pattern hole 75 of the resist layer 70 as shown in FIG. 32.

Then, the resist layer is removed from the laminating material layer. Consequently, the sheet-like connector 20 is obtained as shown in FIG. 33.

In the foregoing, as for a plating method for forming the electrode structure 22, it is possible to utilize an electrolytic plating method or a nonelectrolytic plating method.

Figure 33:
FIG. 33 is an explanatory sectional view showing a state in which a through hole for coupling is formed on the insulating sheet.
Figure 34:
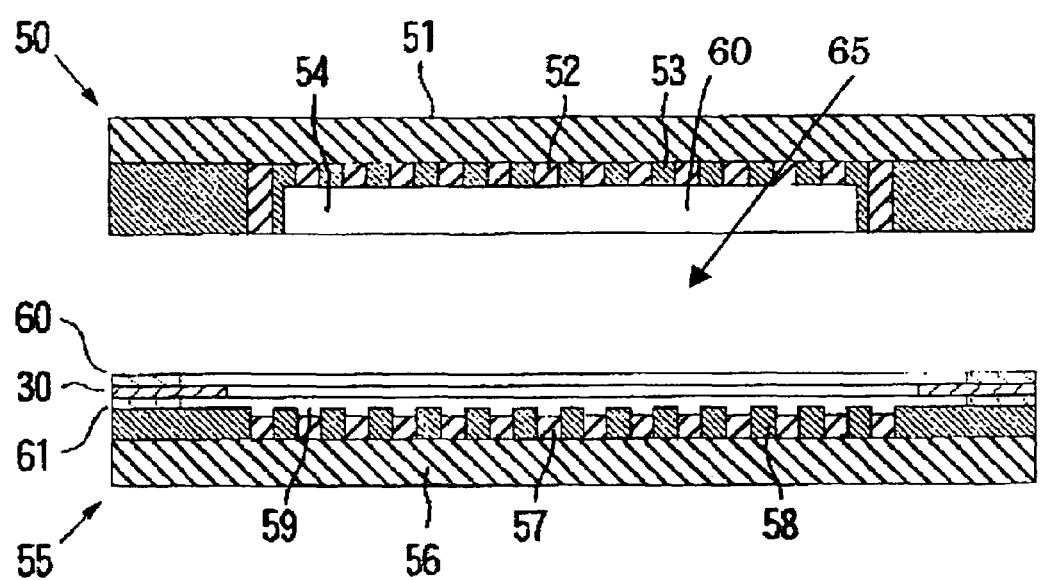
FIG. 34 is an explanatory sectional view showing a state in which a spacer and a supporting body are disposed on the molding surface of a lower mold.

The anisotropic conductive connector device 10 according to the third example can be manufactured as shown in FIGS. 34 to 39 in the same manner as the anisotropic conductive connector device according to the first example except that the sheet-like connector 20 shown in FIG. 33 is used in place of the sheet-like connector 20 shown in FIG. 11. Accordingly, detailed description will be omitted.

According to such a manufacturing method, in a state in which the sheet-like connector 20 is disposed on a molding material layer 19 for forming the anisotropic conductive film 10A, a material constituting the anisotropic conductive film is cured in a permeation condition into the void of the insulating sheet 21. Consequently, the molding material layer 19 is subjected to a curing treatment. Thus, it is possible to advantageously and reliably manufacture the anisotropic conductive connector device 10 in which the sheet-like connector 20 is integrated on the anisotropic conductive film 10A.

Figure 40:
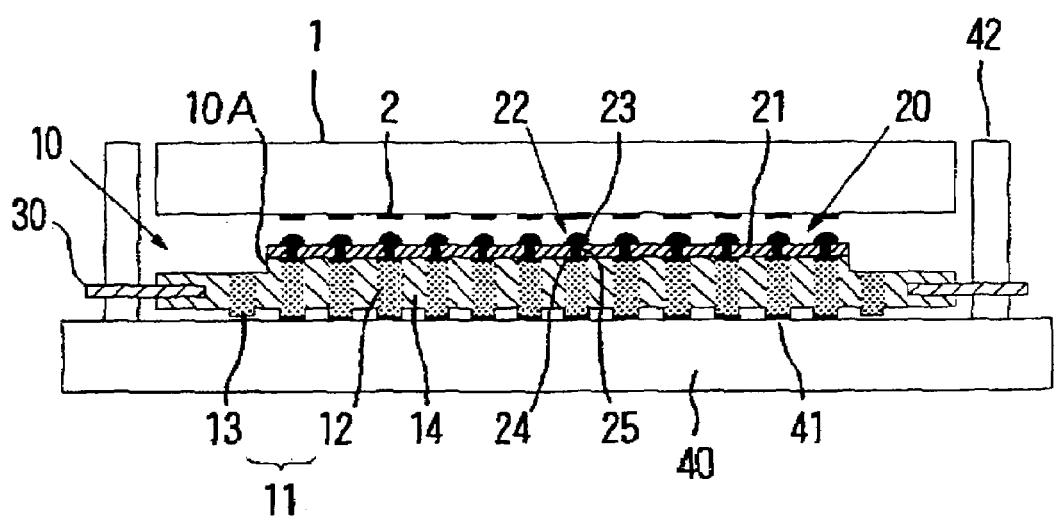
FIG. 40 is an explanatory view showing, together with a circuit device, a structure according to an example of an apparatus for inspecting the circuit device in accordance with the present invention.

FIG. 40 is an explanatory view showing a schematic structure according to an example of an apparatus for inspecting a circuit device in accordance with the present invention.

The apparatus for inspecting a circuit device is provided with a circuit board 40 for an inspection having a guide pin 42. An electrode 41 for an inspection is formed on a surface of the circuit board 40 for an inspection (an upper surface in FIG. 1) in accordance with a pattern corresponding to the pattern of an electrode 2 to be inspected in a circuit device 1 to be an inspecting object. The electrode 2 to be inspected in the circuit device 1 is a pad electrode.

The anisotropic conductive connector device 10 according to the first example is provided on the surface of the circuit board 40 for an inspection.

More specifically, the guide pin 42 is inserted in a positioning hole 32 (see FIGS. 1 and 3) formed on the supporting body 30 in the anisotropic conductive connector device 10. Consequently, the anisotropic conductive connector device 10 is fixed onto the surface of the circuit board 40 for an inspection in a state in which an effective conducting path forming portion 12 in the anisotropic conductive film 10A is positioned to be placed on the electrode 41 for an inspection.

In the apparatus for inspecting a circuit device, the circuit device 1 is disposed on the anisotropic conductive connector device 10 in such a manner that the electrode 2 to be inspected in the circuit device 1 is positioned on a surface electrode portion 23 of the electrode structure 22 in the sheet-like connector 20.

In this state, the circuit device 1 is pressed in such a direction as to approach a circuit board 40 for an inspection, for example. Consequently, each of the effective conducting path forming portions 12 in the anisotropic conductive connector device 10 is interposed by pressure between the electrode structure 22 in the sheet-like connector 20 and the electrode 41 for an inspection.

As a result, an electrical connection between the electrode 2 to be inspected in the circuit device 1 and each electrode 41 for an inspection in the circuit board 40 for an inspection is achieved through the electrode structure 22 of the sheet-like connector 20 and the effective conducting path forming portion 12 of the anisotropic conductive film 10A. In addition, in this inspecting state, the circuit device 1 is inspected.

According to the apparatus for inspecting a circuit device, the anisotropic conductive connector device 10 according to the first example is provided. Therefore, also in the case of repetitive use for a long period of time or the case of use in a high temperature environment, it is possible to stably maintain an excellent electrical connection state.

Moreover, the surface electrode portion 23 of the electrode structure 22 in the sheet-like connector 20 is protruded. Even if the circuit device 1 to be an inspecting object is provided with a resist film having a greater thickness than the thickness of the electrode 2 to be inspected, therefore, it is possible to reliably achieve an electrical connection to the circuit device 1.

Figure 41:
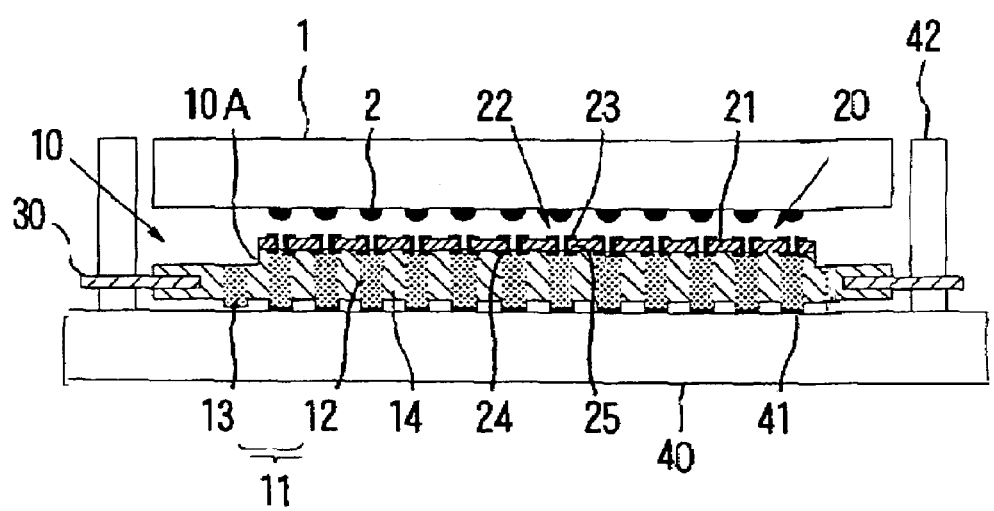
FIG. 41 is an explanatory view showing, together with a circuit device, a structure according to another example of the apparatus for inspecting the circuit device in accordance with the present invention.

FIG. 41 is an explanatory view showing a schematic structure according to another example of the apparatus for inspecting a circuit device in accordance with the present invention.

The apparatus for inspecting a circuit device is provided with a circuit board 40 for an inspection which has a guide pin 42. An electrode 41 for an inspection is formed on a surface (an upper surface in FIG. 1) of the circuit board 40 for an inspection in accordance with a pattern corresponding to the pattern of the electrode 2 to be inspected in the circuit device 1 to be an inspecting object.

The electrode 2 to be inspected in the circuit device 1 is a protruded (hemispherical) solder ball electrode.

The anisotropic conductive connector device 10 according to the second example is disposed on the surface of the circuit board 40 for an inspection.

More specifically, the guide pin 42 is inserted in a positioning hole 32 (see FIGS. 1 and 3) formed on the supporting body 30 in the anisotropic conductive connector device 10. Consequently, the anisotropic conductive connector device 10 is fixed onto the surface of the circuit board 40 for an inspection in a state in which an effective conducting path forming portion 12 in an anisotropic conductive film 10A is positioned to be placed on the electrode 41 for an inspection.

According to the apparatus for inspecting a circuit device, the anisotropic conductive connector device 10 according to the second example is provided. Therefore, also in the case of repetitive use for a long period of time or the case of use in a high temperature environment, it is possible to stably maintain an excellent electrical connection state.

Furthermore, a surface electrode portion 23 of an electrode structure 22 in a sheet-like connector 20 takes the shape of a protruded plate. Even if the electrode 2 to be inspected is protruded, therefore, the conducting path forming portion 11 can be prevented from being excessively pressurized. Also in the case of repetitive use, accordingly, it is possible to obtain a stable conductivity for a long period of time in the conducting path forming portion 11.

Figure 42:
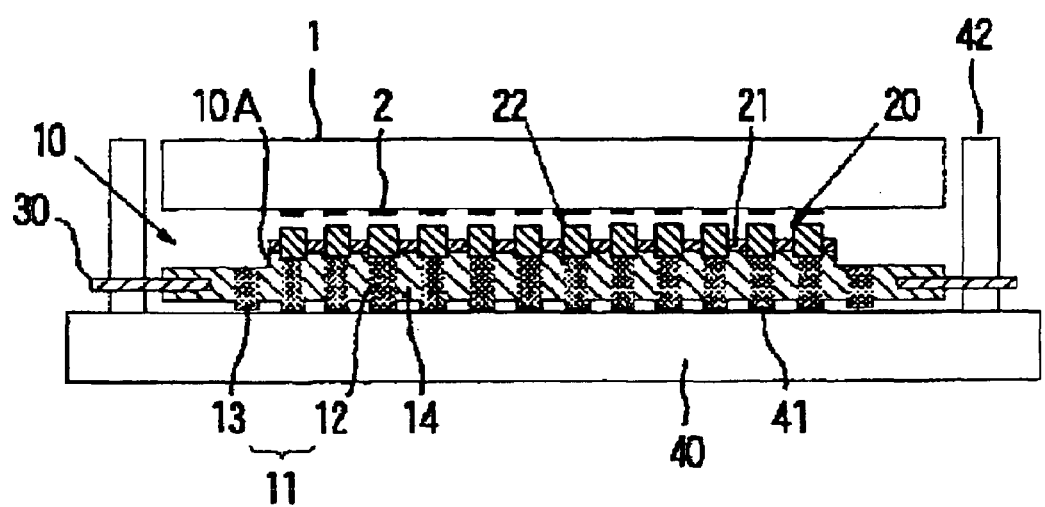
FIG. 42 is an explanatory view showing, together with a circuit device, a structure according to yet another example of the apparatus for inspecting the circuit device in accordance with the present invention.

FIG. 42 is an explanatory view showing a schematic structure according to yet another example of the apparatus for inspecting a circuit device in accordance with the present invention.

The apparatus for inspecting a circuit device is provided with a circuit board 40 for an inspection which has a guide pin 42. An electrode 41 for an inspection is formed on a surface (an upper surface in FIG. 1) of the circuit board 40 for an inspection in accordance with a pattern corresponding to the pattern of the electrode 2 to be inspected in the circuit device 1 to be an inspecting object. The electrode 2 to be inspected in the circuit device 1 is a pad electrode in the same manner as in FIG. 40.

The anisotropic conductive connector device 10 according to the third example is provided on the surface of the circuit board 40 for an inspection in the same manner as in FIG. 40.

According to the apparatus for inspecting a circuit device in accordance with the present example, the anisotropic conductive connector device 10 according to the first example is provided. Also in the case of repetitive use for a long period of time or the case of use in a high temperature environment, therefore, it is possible to stably maintain an excellent electrical connection state.

Moreover, the electrode structure 22 in the sheet-like connector 20 is protruded. Even if the circuit device 1 to be an inspecting object is provided with a resist film having a greater thickness than the thickness of the electrode 2 to be inspected, therefore, it is possible to reliably achieve an electrical connection to the circuit device 1.

Figure 43:
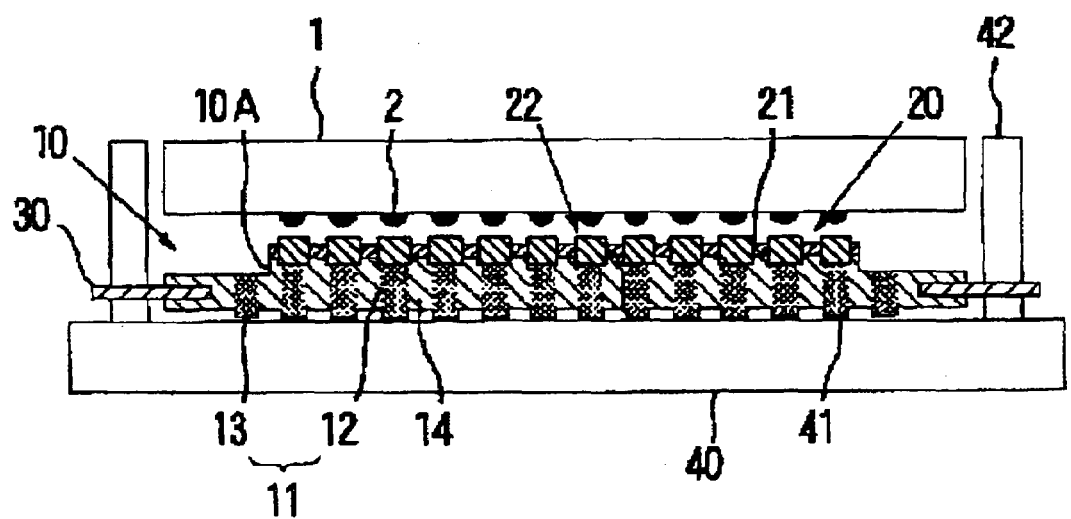
FIG. 43 is an explanatory view showing, together with a circuit device, a structure according to a further example of the apparatus for inspecting the circuit device in accordance with the present invention.

FIG. 43 is an explanatory view showing a schematic structure according to a further example of the apparatus for inspecting a circuit device in accordance with the present invention.

The apparatus for inspecting a circuit device is provided with a circuit board 40 for an inspection which has a guide pin 42. An electrode 41 for an inspection is formed on a surface (an upper surface in FIG. 1) of the circuit board 40 for an inspection in accordance with a pattern corresponding to the pattern of the electrode 2 to be inspected in the circuit device 1 to be an inspecting object. The electrode 2 to be inspected in the circuit device 1 is a protruded (hemispherical) solder ball electrode in the same manner as in FIG. 41.

The anisotropic conductive connector device 10 according to the third example is disposed on the surface of the circuit board 40 for an inspection in the same manner as in FIG. 41.

According to the apparatus for inspecting a circuit device in accordance with the present example, the anisotropic conductive connector device 10 according to the third example is provided. Also in the case of repetitive use for a long period of time or the case of use in a high temperature environment, therefore, it is possible to stably maintain an excellent electrical connection state.

Furthermore, an electrode structure 22 in a sheet-like connector 20 takes the shape of a protruded plate. Even if the electrode 2 to be inspected is protruded, therefore, the conducting path forming portion 11 can be prevented from being excessively pressurized. Accordingly, aqlso in the case of repetitive use, it is possible to obtain a stable conductivity for a long period of time in the conducting path forming portion 11.

Figure 44:
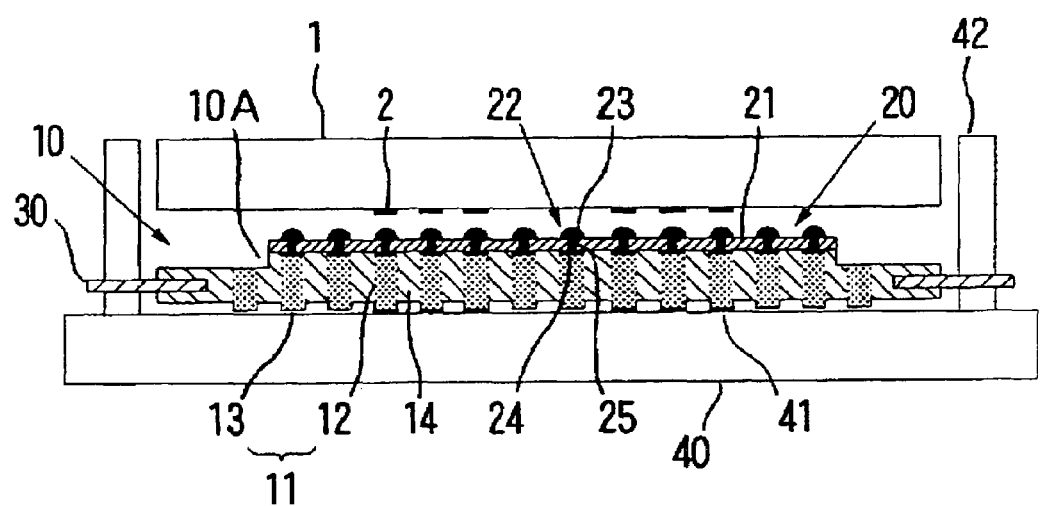
FIG. 44 is an explanatory view showing, together with a circuit device, a structure according to a further example of the apparatus for inspecting the circuit device in accordance with the present invention.

FIG. 44 is an explanatory view showing a schematic structure according to a further example of the apparatus for inspecting a circuit device in accordance with the present invention.

More specifically, in the anisotropic conductive connector device according to the present example, the conducting path forming portions are disposed at a constant pitch irrespective of the pattern of the electrode to be inspected. In addition, parts of these conducting path forming portions are set to be effective conducting path forming portions to be electrically connected to the electrode to be inspected. Furthermore, the other conducting path forming portions are set to be ineffective conducting path forming portions which are not electrically connected to the electrode to be inspected.

More specifically, as shown in FIG. 44, a circuit device 1 to be an inspecting object has such a structure that an electrode 2 to be inspected is disposed in only a part of grid point positions at a constant pitch in a CSP (Chip Scale Package), TSOP (Thin Small Outline Package) or the like, for example.

In the present example, the anisotropic conductive connector device 10 according to the first example is used in the apparatus for inspecting a circuit device.

In the anisotropic conductive connector device 10 for inspecting the circuit device 1, a conducting path forming portion 11 is provided in accordance with grid point positions at a substantially equal pitch to that in the electrode 2 to be inspected. In addition, the conducting path forming portion 11 placed in a position corresponding to the electrode 2 to be inspected is set to be an effective conducting path forming portion 12. Moreover, the other conducting path forming portions 11 are set to be ineffective conducting path forming portions 13.

According to the anisotropic conductive connector device 10 having such a structure, in the manufacture of the anisotropic conductive connector device 10, the ferromagnetic layers of the metal mold are disposed at a constant pitch. Consequently, a conductive particle can be efficiently collected and oriented in a predetermined position when a magnetic field is caused to act on a molding material layer.

Thus, the density of the conductive particle is uniform in each of the conducting path forming portions which are obtained. Consequently, it is possible to obtain an anisotropic conductive connector device having a small difference in a resistance value of each conducting path forming portion.

Figure 45:
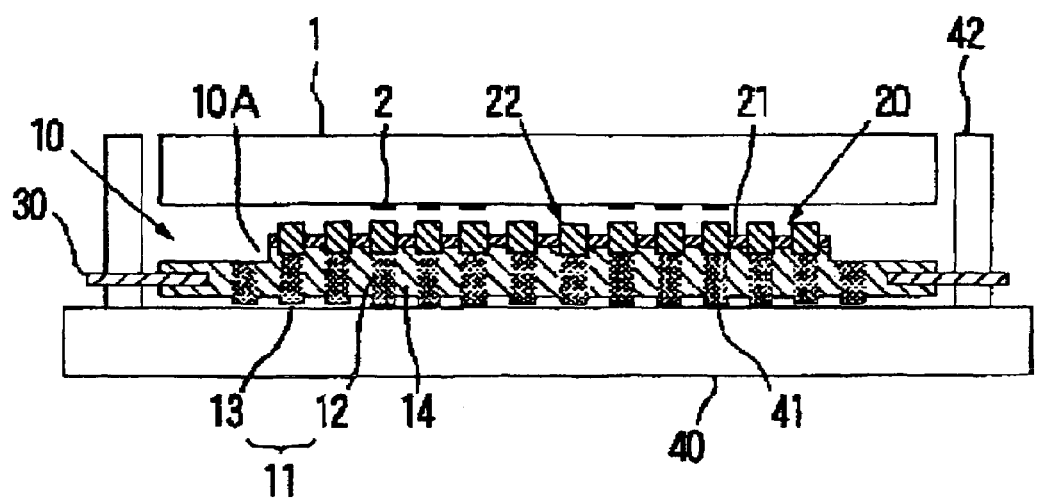
FIG. 45 is an explanatory view showing, together with a circuit device, a structure according to a further example of the apparatus for inspecting the circuit device in accordance with the present invention.
Figure 46:
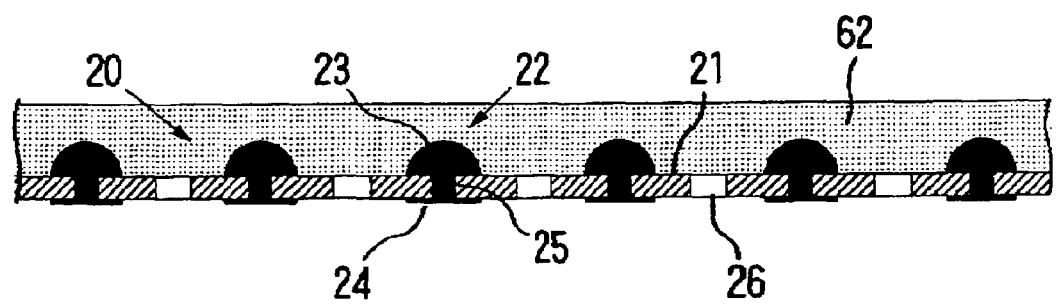
FIG. 46 is an explanatory sectional view showing a state in which a protective film is formed on the surface of a sheet-like connector.
Figure 47:
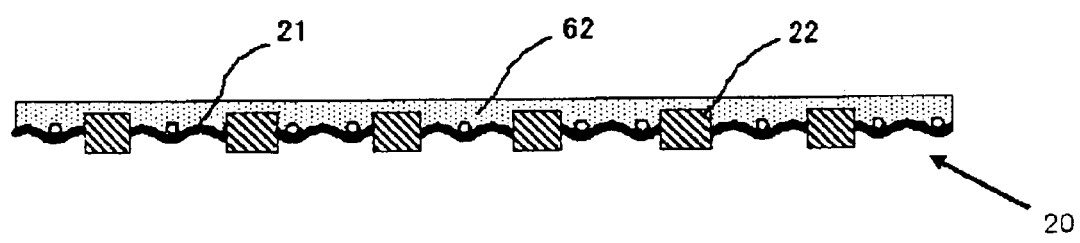
FIG. 47 is an explanatory sectional view showing the state in which a protective film is formed on the surface of a sheet-like connector.

FIG. 45 is an explanatory view showing a schematic structure according to a further example of the apparatus for inspecting a circuit device in accordance with the present invention.

In the apparatus for inspecting a circuit device according to the present example, in the same manner as in FIG. 44, a circuit device 1 to be an inspecting object has such a structure that an electrode 2 to be inspected is disposed in only a part of grid point positions at a constant pitch in a CSP (Chip Scale Package), TSOP (Thin Small Outline Package) or the like, for example.

In the anisotropic conductive connector device 10 for inspecting the circuit device 1, a conducting path forming portion 11 is provided in accordance with grid point positions at a substantially equal pitch to that in the electrode 2 to be inspected. In addition, the conducting path forming portion 11 placed in a position corresponding to the electrode 2 to be inspected is set to be an effective conducting path forming portion 12. Moreover, the other conducting path forming portions 11 are set to be ineffective conducting path forming portions 13.

In the present example, the anisotropic conductive connector device 10 according to the third example is used in the apparatus for inspecting a circuit device.

Also in the anisotropic conductive connector device 10 having such a structure, in the manufacture of the anisotropic conductive connector device 10, the ferromagnetic layers of the metal mold are disposed at a constant pitch. Consequently, a conductive particle can be efficiently collected and oriented in a predetermined position when a magnetic field is caused to act on a molding material layer.

Thus, the density of the conductive particle is uniform in each of the conducting path forming portions which are obtained. Consequently, it is possible to obtain an anisotropic conductive connector device having a small difference in a resistance value of each conducting path forming portion.

EXAMPLE 1

1) Manufacture of Sheet-like Connector

A dry film resist (Photek: H-9050) was laminated on both sides of a mesh (thickness: 0.042 mm, opening diameter: 54 μm, opening ratio: 49%) formed by a polyallylate type composite fiber (fiber diameter: 23 μm) and a laminating material having the structure shown in FIG. 30 was obtained.

The thickness of the laminating material obtained after the lamination was 0.12 mm.

A photomask film having an opening in a diameter of 0.3 mm and a pitch of 0.8 mm was aligned and laminated on both sides of the laminating material in such a manner that an opening portion was coincident therewith. Furthermore, the dry film resist layer was exposed by using a parallel ray exposing machine (manufactured by ORC SEISAKUSHO) and was then developed so that the laminating material having an opening portion penetrating through upper and lower surfaces shown in FIG. 31 was obtained.

The laminating material having the opening portion thus obtained was subjected to a nonelectrolytic plating treatment by using a copper plating solution (OKUNO CHEMICAL INDUSTRIES CO., LTD.:BVF) so that a laminating material having the electrode structure (22) formed in the opening portion shown in FIG. 32 was obtained.

Next, the resist was peeled to obtain the sheet-like connector (20) including the electrode structure (22) shown in FIG. 33.

In the sheet-like connector thus obtained, the electrode structure had a diameter of 0.3 mm, thickness of 0.12 mm and an arrangement pitch of 0.8 mm.

The sheet-like connector was cut into 14 mm×7.5 mm and a dry film resist was laminated as the protective film (62) on either side and was used for manufacturing the anisotropic conductive connector.

2) Fabrication of Supporting Body and Metal Mold:

A supporting body having the following specification was fabricated in accordance with the structure shown in FIG. 4, and furthermore, a metal mold for molding an anisotropic conductive film having the following specification was fabricated in accordance with the structure shown in FIG. 6.

[Supporting Body]

The supporting body (30) is formed by SUS304 and has a thickness of 0.1 mm, and the opening portion (31) has a dimension of 17 mm×10 mm and is provided with a positioning hole (32) on four corners.

[Metal Mold]

The ferromagnetic boards (51, 56) in the upper mold (50) and the lower mold (55) are formed of iron and have a thickness of 6 mm.

The ferromagnetic layers (52, 57) in the upper mold (50) and the lower mold (55) are formed of nickel and have a diameter of 0.45 mm (circle), a thickness of 0.1 mm and an arrangement pitch (a distance between centers) of 0.8 mm, and the number of the ferromagnetic layers is 288 (12×24).

The nonmagnetic layers (53, 58) in the upper mold (50) and the lower mold (55) are formed by a material obtained by carrying out a curing treatment over a dry film resist. In the nonmagnetic layer (53) in the upper mold (50), a portion (53a) has a thickness of 0.3 mm and a portion (53b) has a thickness of 0.1 mm. The nonmagnetic layer (58) in the lower mold (55) has a thickness of 0.15 mm.

The concave portion (54) formed in the upper mold has a dimension of 15 mm by 8 mm and a depth of 0.2 mm.

3) Preparation of Molding Material 60 parts by weight of a conductive particle having an average particle diameter of 30 μm was added to 100 parts by weight of addition type liquid silicone rubber. Furthermore, they were mixed, and a defoaming treatment was then carried out at a reduced pressure so that a molding material for forming an anisotropic conductive film was prepared. In the foregoing, there was used a conductive particle formed by plating a core particle formed of nickel with gold (average coating amount 20% by weight with respect to the weight of the core particle)

4) Formation of Anisotropic conductive Film

Figure 35:
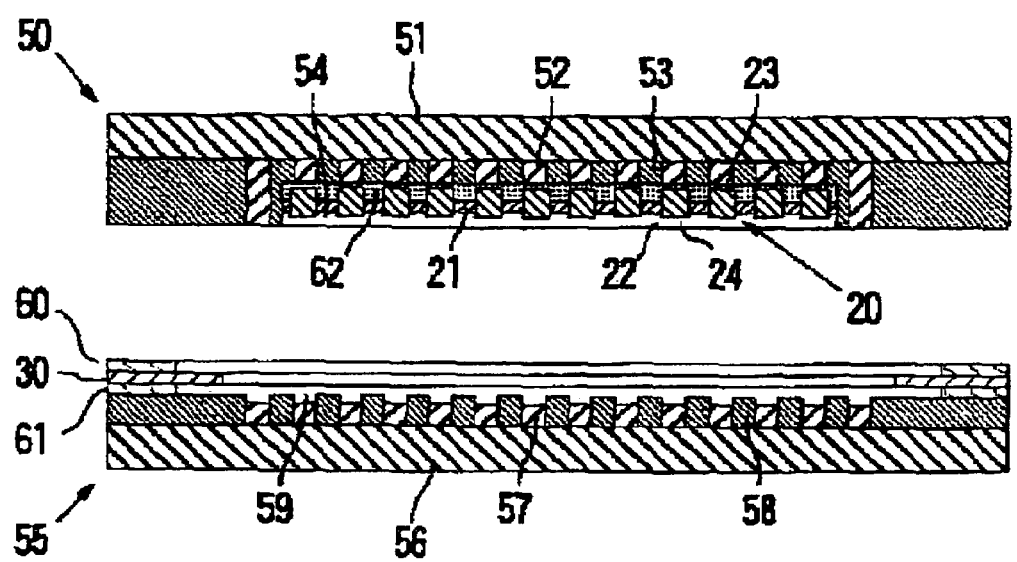
FIG. 35 is an explanatory sectional view showing a state in which a sheet-like connector is disposed on the molding surface of an upper mold through a protective film.

A side of the sheet-like connector (20) on which the protective layer (62) is provided was set to be a metal mold side, and the electrode structure and the ferromagnetic layer (52) of the metal mold were arranged in alignment with each other in the concave portion (54) of the upper mold (50) of the metal mold (see FIG. 35).

Figure 36:
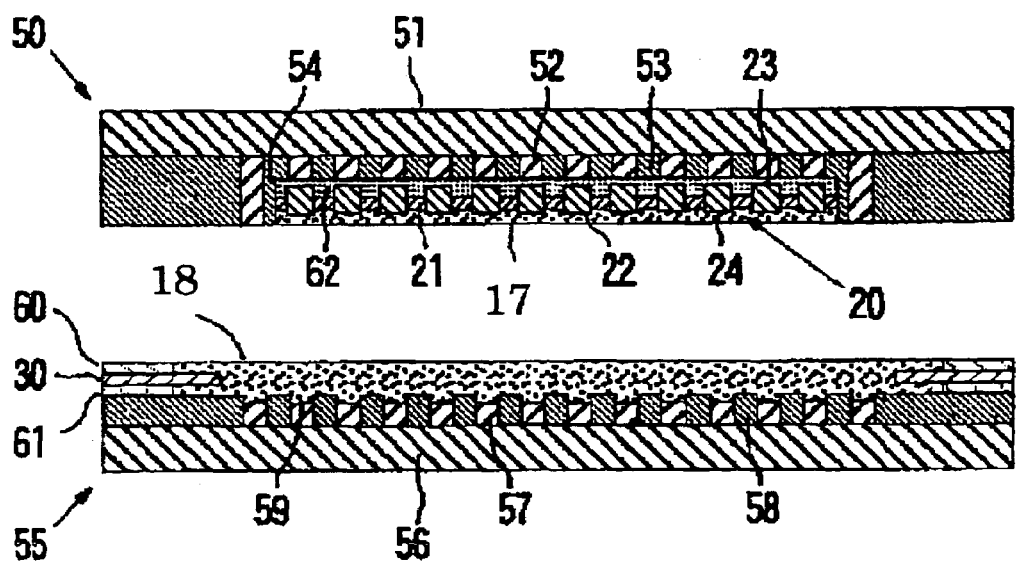
FIG. 36 is an explanatory sectional view showing a state in which a molding material layer is formed in an upper mold and each of metal molds.

Next, the molding material thus prepared was applied by screen printing to form the first molding material layer (17) having a thickness of 0.2 mm which is obtained by containing a conductive particle and a reinforcing material in liquid addition type silicon rubber (see FIG. 36).

Moreover, the spacer (61) having a thickness of 0.1 mm, in which a rectangular opening portion having a dimension of 20 mm by 13 mm is formed, was aligned and disposed on the molding surface in the lower mold (55) of the metal mold. In addition, the supporting body (30) was aligned and arranged on the spacer (61). Furthermore, the spacer (60) having a thickness of 0.2 mm, in which a rectangular opening portion having a dimension of 20 mm by 13 mm is formed, was aligned and disposed on the supporting body (30) (see FIG. 34).

Then, the molding material prepared as described above was applied by the screen printing. As a result, the second molding material layer (18), which was obtained by containing the conductive particle in the liquid addition type silicone rubber and having a thickness of 0.3 mm in a portion positioned on the nonmagnetic layer (58), was formed in a space constituted by the lower mold (55), the spacer (60, 61) and the supporting body (30) (see FIG. 36).

Figure 37:
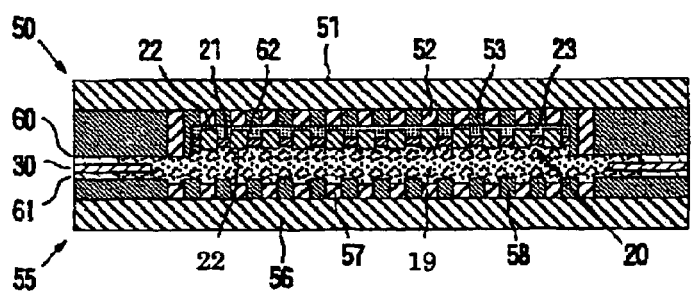
FIG. 37 is an explanatory sectional view showing a state in which a molding material layer having an intended configuration is formed in the metal mold.
Figure 38:
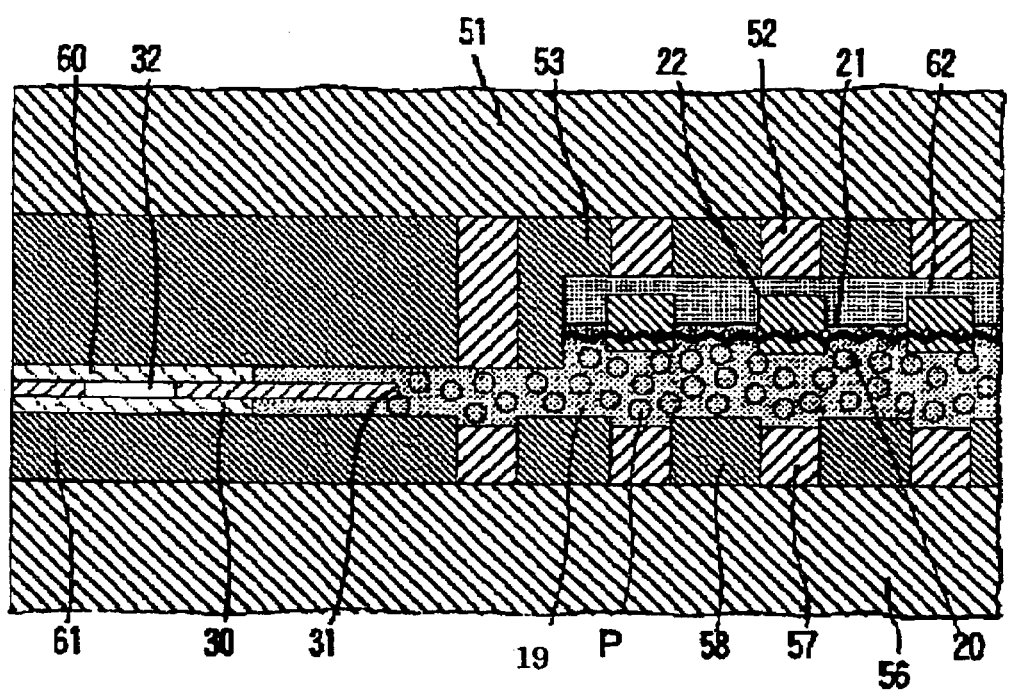
FIG. 38 is an explanatory sectional view partially showing the enlarged molding material layer.
Figure 39:
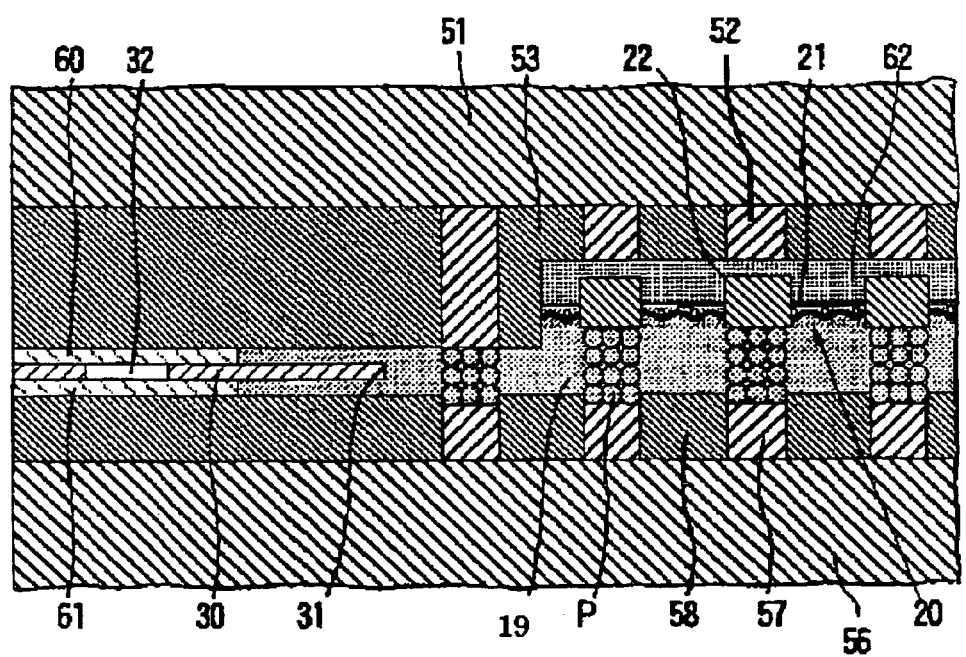
FIG. 39 is an explanatory sectional view showing a state in which a magnetic field acts on the molding material layer.

Then, the first molding material layer (17) formed in the upper mold (50) and the second molding material layer (18) formed in the lower mold (55) were aligned and superposed to form the lamination molding material layer (19) (see FIGS. 37 and 38).

Thereafter, while a magnetic field of 2T was applied in a direction of a thickness by means of an electromagnet to a portion positioned between the ferromagnetic layers (52, 57) for the lamination molding material layer (19) formed between the upper mold (50) and the lower mold (51), the curing treatment was carried out at 100° C. for one hour. Thus, the anisotropic conductive film (10A) was formed (see FIG. 39).

The metal mold was opened and the protective film (62) on the surface of the sheet-like connector which is provided on one surface side of the anisotropic conductive connector thus obtained was removed.

As described above, the anisotropic conductive connector (10) according to the present invention was manufactured. The anisotropic conductive film (10A) in the anisotropic conductive connector (10) thus obtained has a dimension of 20 mm by 13 mm and takes a rectangular shape. In addition, the thickness of the conducting path forming portion (11) is 0.65 mm including the thickness of the electrode structure. Furthermore, the insulating portion (14) has a thickness of 0.6 mm. Moreover, 288 (12×24) conducting path forming portions (11) are provided, and each conducting path forming portion (11) has a diameter of 0.45 mm, the conducting path forming portion (11) has an arrangement pitch (a distance between centers) of 0.8 mm. In addition, and the electrode structure (22) of the sheet-like connector provided on the conducting path forming portion (12) has a diameter of 0.3 mm and a thickness of 0.12 mm.

The anisotropic conductive connector will be hereinafter referred to as an "anisotropic conductive connector A".

COMPARATIVE EXAMPLE 1

An anisotropic conductive connector was manufactured in the same manner as in the example 1 except that the sheet-like connector was not disposed in the concave portion of the upper mold (50). The anisotropic conductive film in the anisotropic conductive connector thus obtained has a dimension of 20 mm by 13 mm and takes a rectangular shape, a conducting path forming portion has a thickness of 0.65 mm, an insulating portion has a thickness of 0.6 mm. In addition, 288 (12×24) conducting path forming portions are provided, and each conducting path forming portion has a diameter of 0.45 mm and the conducting path forming portion has an arrangement pitch (a distance between centers) of 0.8 mm.

The anisotropic conductive connector will be hereinafter referred to as an "anisotropic conductive connector B".

[Evaluation of Anisotropic Conductive Connector]

Referring to the anisotropic conductive connector A according to the example 1 and the anisotropic conductive connector B according to the comparative example 1, a performance evaluation was carried out in the following manner.

Figure 49:
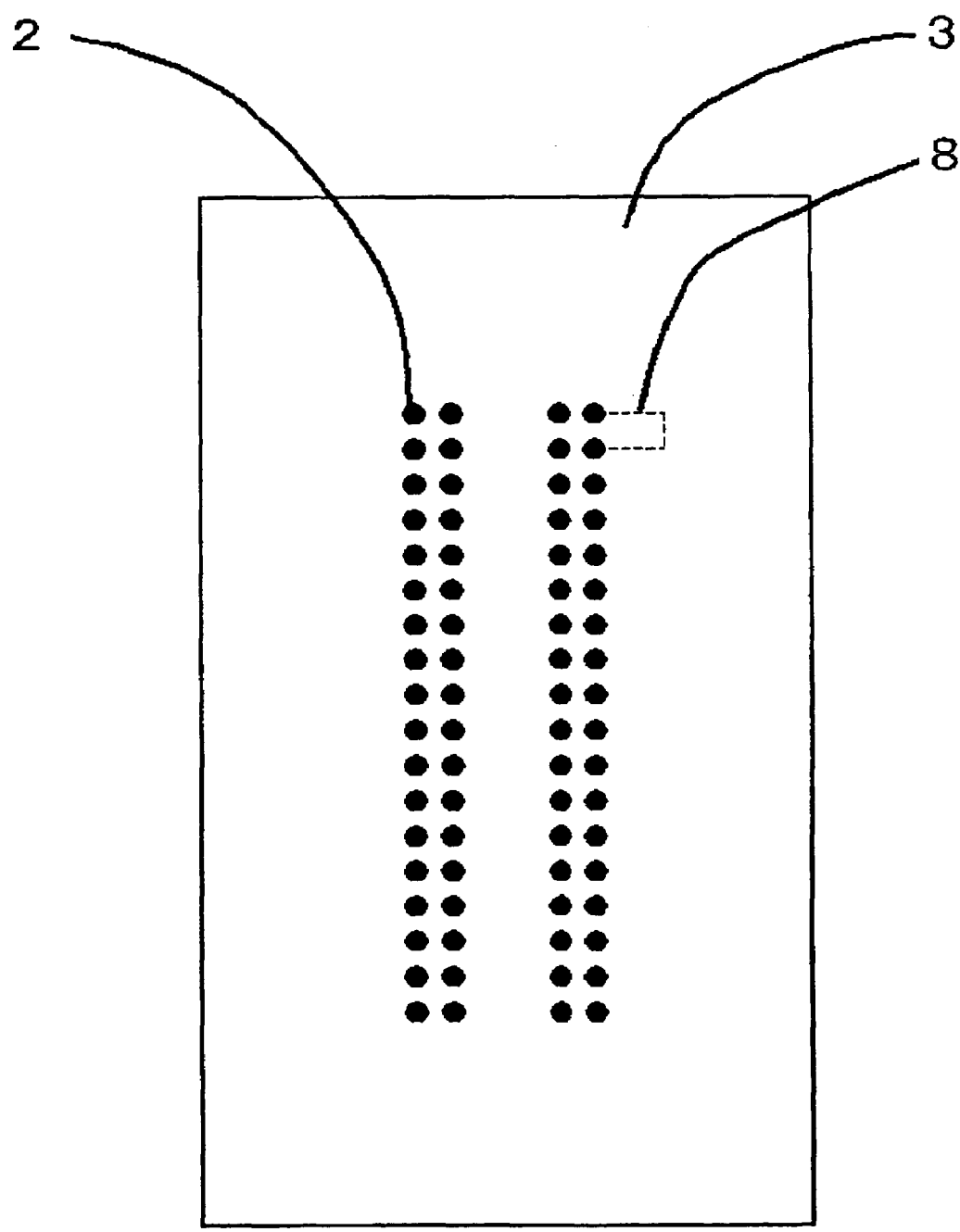
FIG. 49 is a plan view showing a circuit device for a test which is used in the examples.
Figure 50:
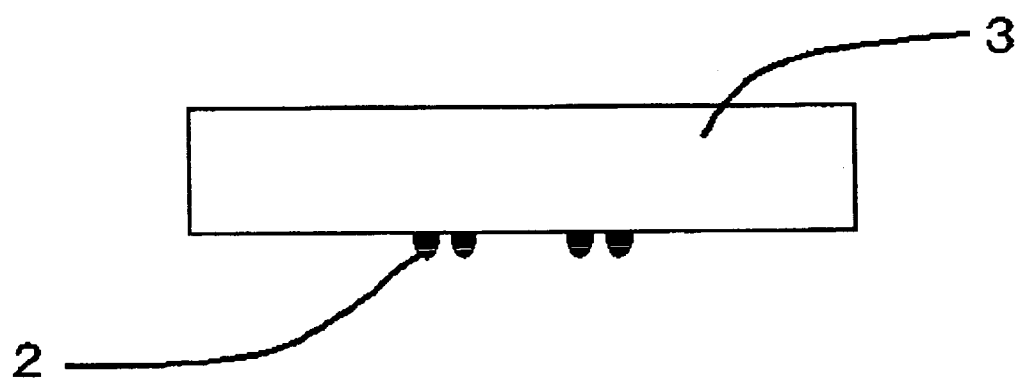
FIG. 50 is a side view showing the circuit device for a test which is used in the examples.

In order to evaluate the anisotropic conductive connector A according to the example 1 and the anisotropic conductive connector B according to the comparative example 1, a circuit device 3 for a test shown in FIGS. 49 and 50 was prepared.

The circuit device 3 for a test has 72 solder ball electrodes 2 (material: 64 solder) in total, each of which has a diameter of 0.4 mm and a height of 0.3 mm. Two electrode groups are formed, each of which has 36 solder ball electrodes 2 provided therein. In each of the electrode groups, there are formed two lines in total, each of which has 18 solder ball electrodes 2 arranged straight at a pitch of 0.8 mm. Two of the solder ball electrodes are electrically connected to each other through a wiring 8 in the circuit device 3. The total number of the wirings in the circuit device 3 is 36.

By using such a circuit device for a test, the anisotropic conductive connector A according to the example 1 and the anisotropic conductive connector B according to the comparative example 1 were evaluated in the following manner.

<<Initial Characteristic>>

Figure 51:
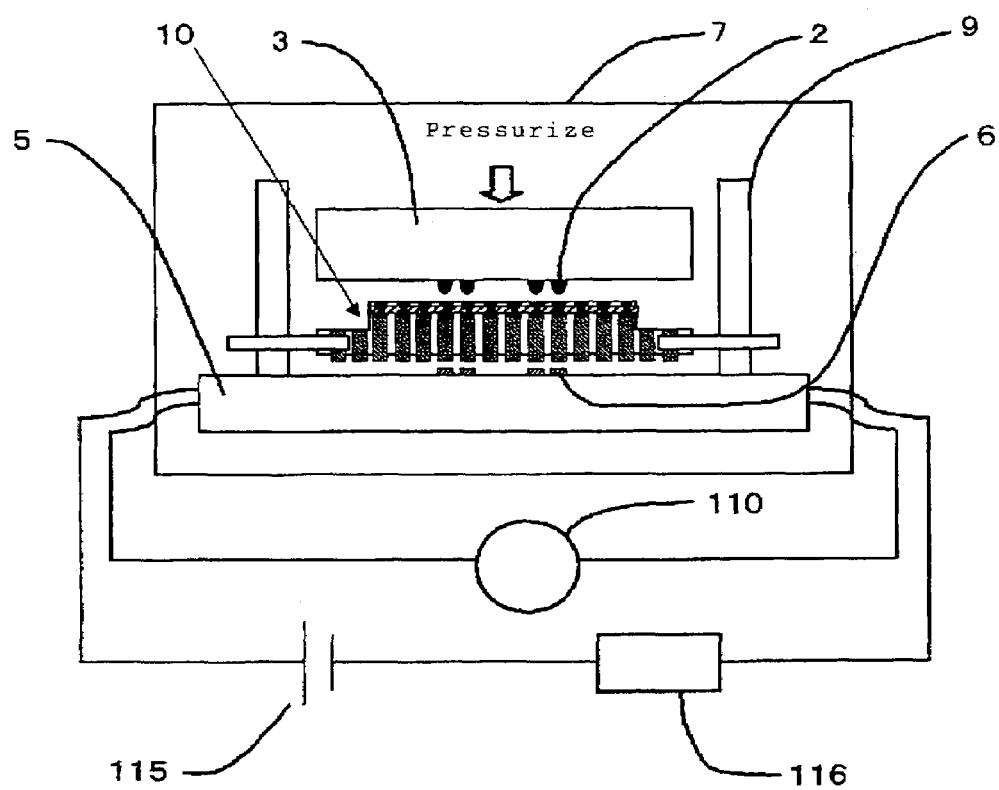
FIG. 51 is an explanatory view showing the schematic structure of an apparatus for testing a repetitive durability which is used in the examples.

As shown in FIG. 51, the anisotropic conductive connector 10 was positioned and disposed on a circuit board 5 for an inspection by inserting guide pins 9 of the circuit board 5 for an inspection into the positioning holes of the supporting body 30 in the anisotropic conductive connector 10.

The circuit device 3 for a test was arranged on the anisotropic conductive connector 10, and these were pressurized at a room temperature in a load of 3 kg (a load of approximately 40 g per conducting path forming portion) by means of a pressurizing jig (not shown) and were thus fixed.

Then, a DC current of 10 mA was always applied by a DC power supply 115 and a constant current control device 116 between external terminals (not shown) of the circuit board 5 for an inspection, which are electrically connected to each other through the anisotropic conductive connector 10, the circuit device 3 for a test, and the electrode 6 for an inspection and a wiring thereof (not shown) of the circuit board 5 for an inspection. In this state, a voltage between the external terminals of the circuit board 5 for an inspection during the pressurization was measured by means of a voltmeter 110.

An electric resistance value R1 ($\Omega$) was calculated by an equation of R1=V1/I1, wherein a value (V) of the voltage thus measured is represented by V1 and the applied DC current is represented by I1 (=0.01 A). A result is shown in Table 1.

[Table 1]

TABLE 1

| | Electric resistance value $R_1$ (m$\Omega$) |
|---|---|
| Example 1 | 122 |
| Comparative example 1 | 117 |

As is apparent from the result of the Table 1, it was confirmed that the anisotropic conductive connector A according to the example 1 had an excellent conductivity which is equivalent to the conductivity of the anisotropic conductive connector B according to the comparative example 1 in which the anisotropic conductive film is not provided with the sheet-like connector.

<<Repetitive Durability>>

As shown in FIG. 51, the anisotropic conductive connector 10 was positioned and disposed on the circuit board 5 for an inspection by inserting guide pins 9 of the circuit board 5 for an inspection into the positioning holes of the supporting body 30 in the anisotropic conductive connector 10. In addition, the circuit device 3 for a test was arranged on the anisotropic conductive connector 10. These were fixed by a pressurizing jig (not shown) and were arranged within a thermostatic chamber 7 in this state.

Subsequently, a temperature in the thermostatic chamber 7 was set to be 90° C. and the pressurization was repeated in a pressurizing cycle of 5 seconds/stroke and a load of 2.5 kg (a load of approximately 35 g per conducting path forming portion) by means of a pressurizing jig. At the same time, a DC current of 10 mA was always applied by a DC power supply 115 and a constant current control device 116 between external terminals (not shown) of the circuit board 5 for an inspection, which are electrically connected to each other through the anisotropic conductive connector 10, the circuit device 3 for a test, and the electrode 6 for an inspection and a wiring thereof (not shown) of the circuit board 5 for an inspection. In this state, a voltage between the external terminals of the circuit board 5 for an inspection during the pressurization was measured by means of a voltmeter 110.

An electric resistance value R1 ($\Omega$) was calculated by an equation of R1=V1/I1, wherein a value (V) of the voltage thus measured is represented by V1 and the applied DC current is represented by. I1 (=0.01 A).

The electric resistance value R1 includes an electric resistance value between the electrodes of the circuit device 3 for a test and an electric resistance value between the external terminals of the circuit board 5 for an inspection, in addition to the electric resistance values of the two conducting path forming portions.

In the case in which the electric resistance value R1 was greater than 1 $\Omega$, the measurement was stopped. A result is shown in Table 2.

[Table 2]

TABLE 2

| | Electric resistance value R1, (m$\Omega$) | | | | |
|---|---|---|---|---|---|
| Number of pressurizations | Once | 5000 times | 10000 times | 20000 times | 50000 times |
| Example 1 | 112 | 136 | 191 | 270 | 400 |
| Comparative example 1 | 117 | 134 | 170 | 787 | 1 $\Omega$ or more |

After the durability test (a repetitive pressurization at 50000 times) was ended, the surface of the conducting path forming portion of each anisotropic conductive connector was visually observed.

As a result, referring to the anisotropic conductive connector A according to the example 1, the conducting path forming portion (12) was rarely deformed and the deformation of the electrode structure (22) of the sheet-like connector (20) on the surface was not observed. Although a small amount of solder was stuck to the surface of the electrode structure (22), a change in an appearance was rarely observed and it was confirmed that the conductive particle was held in the conducting path forming portion (12).

Referring to the anisotropic conductive connector B according to the comparative example 1, a dent was formed in the surface layer part of the conducting path forming portion and the conductive particle was present in the surface layer part of the insulating portion around the dent which is formed.

The reason can be guessed as follows. More specifically, the pressurization is repeated by the protruded electrode so that the surface layer part of the conducting path forming portion is worn out. As a result, the conductive particle contained in the surface layer part is scattered toward surroundings, and the pressurization is further carried out by a circuit device for a test so that the conductive particle is pushed into the surface layer part of the insulating portion. The conductive particle remaining in the conducting path forming portion was discolored to be gray and the sticking of a solder component was observed.

As is apparent from the above-mentioned result, according to the anisotropic conductive connector A in accordance with the example 1, it was confirmed that it is possible to suppress a permanent deformation due to a pressure contact of the protruded electrode and a deformation due to an abrasion even if the conducting path forming portion is repetitively pressed by the protruded electrode, and to obtain a stable conductivity for a long period of time.

In the present invention, it is possible to make various changes without a restriction to the embodiments described above.

(1) It is not essential that the supporting body is provided in the anisotropic conductive connector device 10.

(2) In the case in which the anisotropic conductive connector 10 according to the present invention is used in an electrical inspection for the circuit device, the anisotropic conductive film may be bonded integrally with the circuit board for an inspection. According to such a structure, it is possible to reliably prevent a positional shift between the anisotropic conductive film and the circuit board for an inspection.

The anisotropic conductive connector device can be manufactured by using a metal mold for manufacturing the anisotropic conductive connector device which has a circuit board disposing space region capable of disposing a board for an inspection in a molding space, disposing the circuit board for an inspection in the board disposing space region in the molding space of the metal mold, and injecting a molding material in the molding space to carry out a curing treatment in this state, for example.

(3) The anisotropic conductive film may be formed by a laminated product including different types of layers from each other. More specifically, it is possible to form a conductive path forming portion having the degrees of an elasticity and a conductivity controlled by employing, a structure in which the anisotropic conductive film is constituted by a laminated product having a plurality of layers formed by elastically polymeric substances having different hardnesses from each other, a structure in which the anisotropic conductive film is constituted by a laminated product including a plurality of layers containing different types of conductive particles in a portion to be the conducting path forming portion respectively, a structure in which the anisotropic conductive film is constituted by a laminated product including a plurality of layers containing conductive particles having different particle diameters in the portion to be the conducting path forming portion respectively, or a structure in which the anisotropic conductive film is constituted by a laminated product including a plurality of layers having different contentrates of the conductive particles in the portion to be the conducting path forming portion respectively.

Such an anisotropic conductive film can be manufactured by a method described in International Laid-Open Patent Publication WO 03/075408, for example.

(4) In the anisotropic conductive connector device according to the present invention, the conducting path forming portions are arranged at a constant pitch irrespective of the pattern of the electrode to be inspected as shown in FIGS. 44 and 45. In addition, parts of these conducting path forming portions can be set to be effective conducting path forming portions which are electrically connected to the electrode to be inspected. Moreover, the other conducting path forming portions can be set to be ineffective conducting path forming portions which are not electrically connected to the electrode to be inspected.

According to the anisotropic conductive connector device having such a structure, in the manufacture of the anisotropic conductive connector device, the magnetic layers in the metal mold are disposed at a constant pitch. When a magnetic field is applied to the molding material layer, consequently, it is possible to efficiently collect and orient the conductive particles in a predetermined position. Consequently, the density of the conductive particles can be uniform in each of the conducting path forming portions which are obtained. Thus, it is possible to obtain an anisotropic conductive connector device having a small difference in the resistance value of each conducting path forming portion.

(5) The specific shape and structure of the anisotropic conductive film can be changed variously.

For example, the anisotropic conductive film 10A may have, in a central part thereof, a concave portion on a surface contacting with the electrode to be inspected in the circuit device to be an inspecting object.

Moreover, the anisotropic conductive film 10A may have a through hole in the central part thereof.

Furthermore, the anisotropic conductive film 10A may have the ineffective conducting path forming portion provided in a portion supported by the supporting body 30.

In addition, the anisotropic conductive film 10A may have the other surface to be flat.

(6) In the method of manufacturing an anisotropic conductive connector device, in the case in which the protective film 62 to be provided between the molding surface of the upper mold 50 and the sheet-like connector 20 is formed by a resist material, for example, it is also possible to manufacture a laminated product obtained by previously providing the protective film 62 formed by the resist material on the surface of the sheet-like connector 20 and to dispose the laminated product on the molding surface of the upper mold 50.

According to such a method, the protective film 62 can be formed in a close contact state with the surface of the sheet-like connector 20. Therefore, the molding material can be prevented from entering the surface of the sheet-like connector 20 still more reliably.

(7) In the method of manufacturing an anisotropic conductive connector device, the anisotropic conductive connector and the sheet-like connector may be manufactured individually and the anisotropic conductive connector and the sheet-like connector may be then integrated by using an adhesive or the like, thereby manufacturing the anisotropic conductive connector device.

Figure 48:
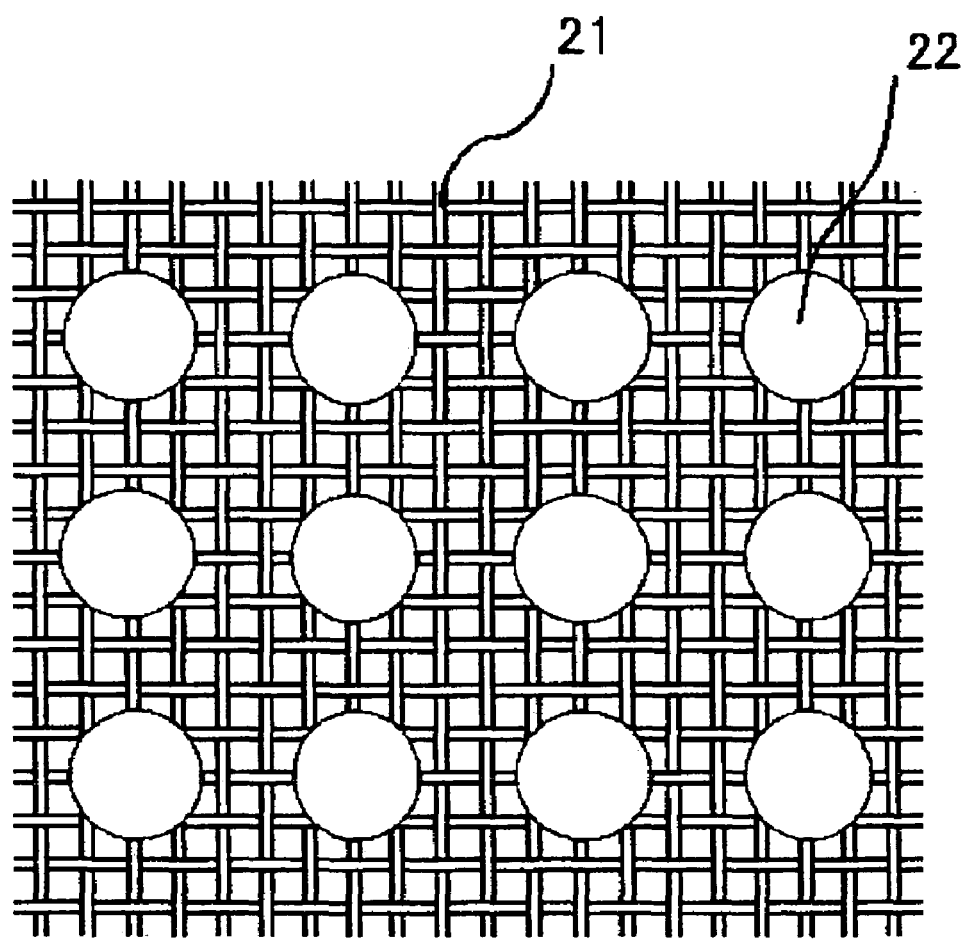
FIG. 48 is a top view for explaining the sheet-like connector according to the present invention.

In the sheet-like connector according to the present invention, the insulating sheet is formed by a mesh or a nonwoven fabric as shown in FIG. 48 or a porous sheet which is not shown. When the sheet-like connector is to be fixed to the anisotropic conductive film of the anisotropic conductive connector by using an adhesive or the like, therefore, the adhesive enters the void of the mesh, the nonwoven fabric or the porous sheet so that the sheet-like connector can be bonded and fixed firmly even if a through hole for the adhesive is not formed. Thus, it is possible to make various changes without departing from the objects of the present invention.

The invention claimed is:

1. An anisotropic conductive connector device comprising:
   an anisotropic conductive film provided with a plurality of conducting path forming portions extended in a direction of a thickness in a state in which they are insulated from each other through an insulating portion; and
   a sheet-like connector in which an insulating sheet is provided with a plurality of electrode structures extended in a direction of a thickness thereof,
   wherein the sheet-like connector is provided integrally on the anisotropic conductive film in a state in which each of the electrode structures is positioned on each of the conducting path forming portions of the anisotropic conductive film,
   the sheet-like connector is provided with a through hole penetrating through both sides of the insulating sheet and the electrode structure is provided in the through hole,
   the electrode structure of the sheet-like connector includes
     a surface electrode portion exposed from a surface of the insulating sheet,
     a back electrode portion exposed from a back face of the insulating sheet, and
     a short circuit portion extended in a direction of a thickness of the insulating sheet,
   the surface electrode portion and the back electrode portion are coupled integrally through the short circuit portion,
   the insulating portion of the anisotropic conductive film is provided with a protruded portion for coupling which is protruded from a surface thereof, and
   the protruded portion for coupling in the anisotropic conductive film is inserted in the through hole for coupling in the sheet-like connector.

2. The anisotropic conductive connector device according to claim 1, wherein the anisotropic conductive film is formed by an insulating elastically polymeric substance, and the conducting path forming portion contains a conductive particle exhibiting a magnetism.

3. The anisotropic conductive connector device according to claim 1, wherein a supporting body for supporting a peripheral edge portion of the anisotropic conductive film is provided.

4. The anisotropic conductive connector device according to claim 1, which is provided between a circuit device to be an inspecting object and a circuit board for an inspection and serves to carry out an electrical connection of an electrode to be inspected in the circuit device and an inspecting electrode of the circuit board,
   wherein the sheet-like connector is disposed on one surface side placed in contact with the circuit device to be the inspecting object.

5. The anisotropic conductive connector device according to claim 4, wherein the anisotropic conductive film is provided with the conducting path forming portions which are not electrically connected to the electrode to be inspected, in addition to the conducting path forming portions which is electrically connected to the electrode to be inspected in the circuit device to be the inspecting object.

6. The anisotropic conductive connector device according to claim 4, wherein the conducting path forming portions are disposed at a constant pitch.

7. An apparatus for inspecting a circuit device comprising:
   a circuit board for an inspection which has an electrode for an inspection disposed corresponding to an electrode to be inspected in a circuit device to be an inspecting object; and
   the anisotropic conductive connector device according to claim 1 which is disposed on the circuit board for an inspection.

8. An anisotropic conductive connector device comprising:
   an anisotropic conductive film provided with a plurality of conducting path forming portions extended in a direction of a thickness in a state in which they are insulated from each other through an insulating portion; and
   a sheet-like connector in which an insulating sheet is provided with a plurality of electrode structures extended in a direction of a thickness thereof,
   wherein the sheet-like connector is integrated on the anisotropic conductive film in a state in which each of the electrode structures is positioned on each of the conducting path forming portions of the anisotropic conductive film, and
   the sheet-like connector is provided with a void communicating with both sides of the insulating sheet and the electrode structure is provided in the void.

9. The anisotropic conductive connector device according to claim 8, wherein the insulating sheet of the sheet-like connector is formed by a mesh, a nonwoven fabric or a porous sheet.

* * * * *